(12) United States Patent
Moura et al.

(10) Patent No.: US 11,862,498 B2
(45) Date of Patent: *Jan. 2, 2024

(54) SUBSTRATE PROCESSING APPARATUS

(71) Applicant: Brooks Automation US, LLC, Chelmsford, MA (US)

(72) Inventors: Jairo T. Moura, Marlborough, MA (US); Roumen Botev, Groton, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/047,532

(22) Filed: Oct. 18, 2022

(65) Prior Publication Data
US 2023/0130967 A1 Apr. 27, 2023

Related U.S. Application Data

(63) Continuation of application No. 17/180,298, filed on Feb. 19, 2021, now Pat. No. 11,476,139.
(Continued)

(51) Int. Cl.
*H01L 21/677* (2006.01)
*H02N 15/00* (2006.01)
(Continued)

(52) U.S. Cl.
CPC ........ *H01L 21/67709* (2013.01); *B65G 35/06* (2013.01); *B65G 54/02* (2013.01);
(Continued)

(58) Field of Classification Search
CPC .. H02N 15/00; H02K 41/025; H02K 2201/18; H02K 41/031; G05D 3/125; H01L 21/67709; B65G 35/06; B65G 54/02
(Continued)

(56) References Cited

U.S. PATENT DOCUMENTS 3,967,561 A * 7/1976 Schwarzler ............ H02K 41/04
198/805
4,624,617 A * 11/1986 Belna ...................... B60L 13/10
198/619
(Continued)

FOREIGN PATENT DOCUMENTS

CN 111279595 6/2020
CN 112840542 5/2021
(Continued)

OTHER PUBLICATIONS

US 11,476,298 B2, 10/2022, Moura et al. (withdrawn)*
(Continued)

*Primary Examiner* — James R Bidwell
(74) *Attorney, Agent, or Firm* — Perman & Green, LLP

(57) ABSTRACT

A linear electrical machine comprising a frame with a level reference plane and an array of electromagnets, connected to the frame to form a drive plane at a predetermined height relative to the reference plane. The array of electromagnets being arranged so that a series of electromagnets of the array of electromagnets define at least one drive line within the drive plane, and each of the electromagnets being coupled to an alternating current power source energizing each electromagnet. At least one reaction platen of paramagnetic, diamagnetic, or non-magnetic conductive material disposed to cooperate with the electromagnets of the array of electromagnets so that excitation of the electromagnets with alternating current generates levitation and propulsion forces against the reaction platen that controllably levitate and propel the reaction platen along at least one drive line, in a controlled attitude relative to the drive plane.

22 Claims, 42 Drawing Sheets

Related U.S. Application Data

(60) Provisional application No. 62/979,195, filed on Feb. 20, 2020.

(51) Int. Cl.
*H02K 41/025* (2006.01)
*B65G 35/06* (2006.01)
*G05D 3/12* (2006.01)
*B65G 54/02* (2006.01)

(52) U.S. Cl.
CPC .......... *G05D 3/125* (2013.01); *H02K 41/025* (2013.01); *H02N 15/00* (2013.01); *H02K 2201/18* (2013.01)

(58) Field of Classification Search
USPC ................................................ 198/619, 805
See application file for complete search history.

(56) References Cited

U.S. PATENT DOCUMENTS

| | | |
|---|---|---|
| 4,654,571 A | 3/1987 | Hinds |
| 5,163,546 A | 11/1992 | Kawada et al. |
| 5,180,048 A | 1/1993 | Kawada et al. |
| 5,196,745 A * | 3/1993 | Trumper ............... H02K 41/00 310/12 |
| 5,309,049 A | 5/1994 | Kawada et al. |
| 5,641,054 A | 6/1997 | Mori et al. |
| 6,208,045 B1 | 5/2001 | Hazelton et al. |
| 6,231,732 B1 | 5/2001 | Hollars et al. |
| 6,279,728 B1 | 8/2001 | Jung et al. |
| 6,437,463 B1 | 8/2002 | Hazelton et al. |
| 6,452,292 B1 | 9/2002 | Binnard |
| 6,847,134 B2 | 1/2005 | Frissen et al. |
| 7,161,267 B2 | 1/2007 | Hol et al. |
| 7,199,493 B2 | 4/2007 | Ohishi |
| 7,224,252 B2 | 5/2007 | Meadow, Jr. et al. |
| 7,436,135 B2 | 10/2008 | Miyakawa |
| 7,808,133 B1 | 10/2010 | Widdowson et al. |
| 7,841,820 B2 | 11/2010 | Bonora et al. |
| 7,988,398 B2 | 8/2011 | Hofmeister et al. |
| 8,602,706 B2 | 12/2013 | Hofmeister et al. |
| 8,897,906 B2 | 11/2014 | Ohashi et al. |
| 9,027,739 B2 | 5/2015 | Hosek |
| 9,202,719 B2 | 12/2015 | Lu et al. |
| 9,685,849 B2 | 6/2017 | Lu et al. |
| 10,008,915 B2 | 6/2018 | Lu et al. |
| 10,056,816 B2 | 8/2018 | Lu |
| 10,116,195 B2 | 10/2018 | Lu |
| 10,222,237 B2 | 3/2019 | Lu |
| 10,348,177 B2 | 7/2019 | Lu |
| 10,348,178 B2 | 7/2019 | Lu |
| 10,554,110 B2 | 2/2020 | Lu et al. |
| 10,636,687 B2 | 4/2020 | Lau et al. |
| 10,704,927 B2 | 7/2020 | Lu |
| 10,707,738 B2 | 7/2020 | Lu |
| 10,763,733 B2 | 9/2020 | Lu |
| 10,819,205 B2 | 10/2020 | Lu |
| 10,926,418 B2 | 2/2021 | Lu et al. |
| 10,958,148 B2 | 3/2021 | Lu |
| 10,978,330 B2 | 4/2021 | Yin et al. |
| 11,370,621 B2 | 6/2022 | Yamamoto |
| 2005/0105991 A1 | 5/2005 | Hofmeister et al. |
| 2020/0030995 A1 | 1/2020 | Lu et al. |
| 2021/0043484 A1 | 2/2021 | Moura |
| 2021/0221008 A1 | 7/2021 | Lu et al. |

FOREIGN PATENT DOCUMENTS

| | | | |
|---|---|---|---|
| EP | 3014219 | 10/2017 | |
| EP | 3152822 | 8/2019 | |
| JP | 05252610 | 9/1993 | |
| KR | 20210082088 | 7/2021 | |
| WO | 02/099949 | * 12/2002 | ........... H02K 41/025 |
| WO | 2010092473 | 8/2010 | |
| WO | 2017142481 | 8/2017 | |
| WO | 2018176137 | 4/2018 | |
| WO | 2020073118 | 4/2020 | |
| WO | 2020243814 | 12/2020 | |
| WO | 2021119819 | 6/2021 | |

OTHER PUBLICATIONS

"Flying Motion: XPlanar" Beckhoff Automation Gmbh & Co. KG, Nov. 2018.

"Multi-dimensional Manufacturing with Unprecedented Flexibility: Planar Motor," Planar Motor Incorporated, www.planarmotor.com, accessed on Mar. 17, 2022.

\* cited by examiner

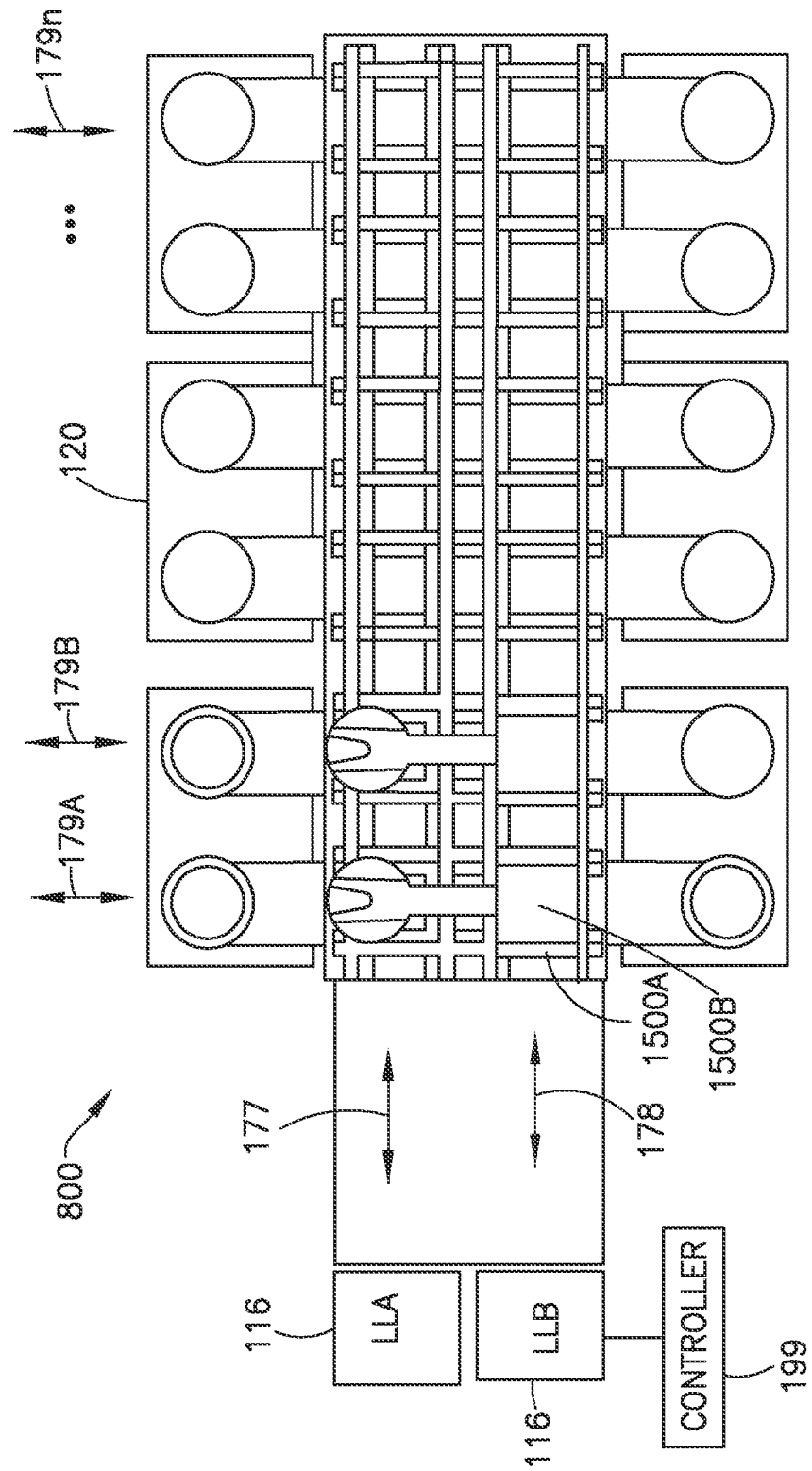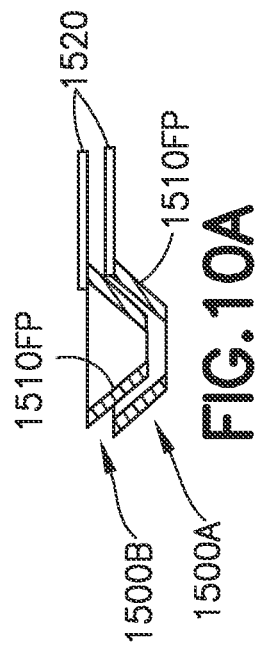

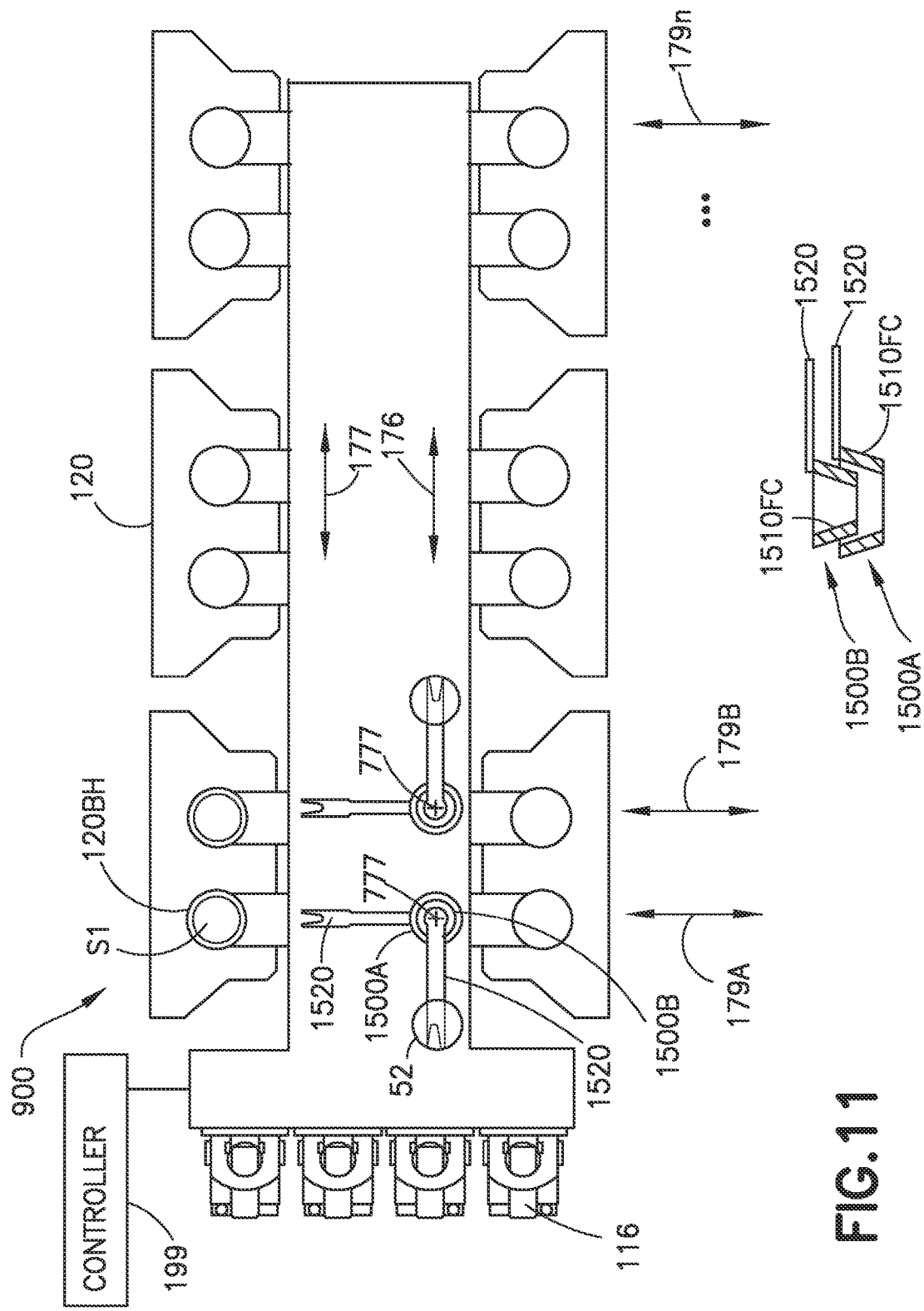

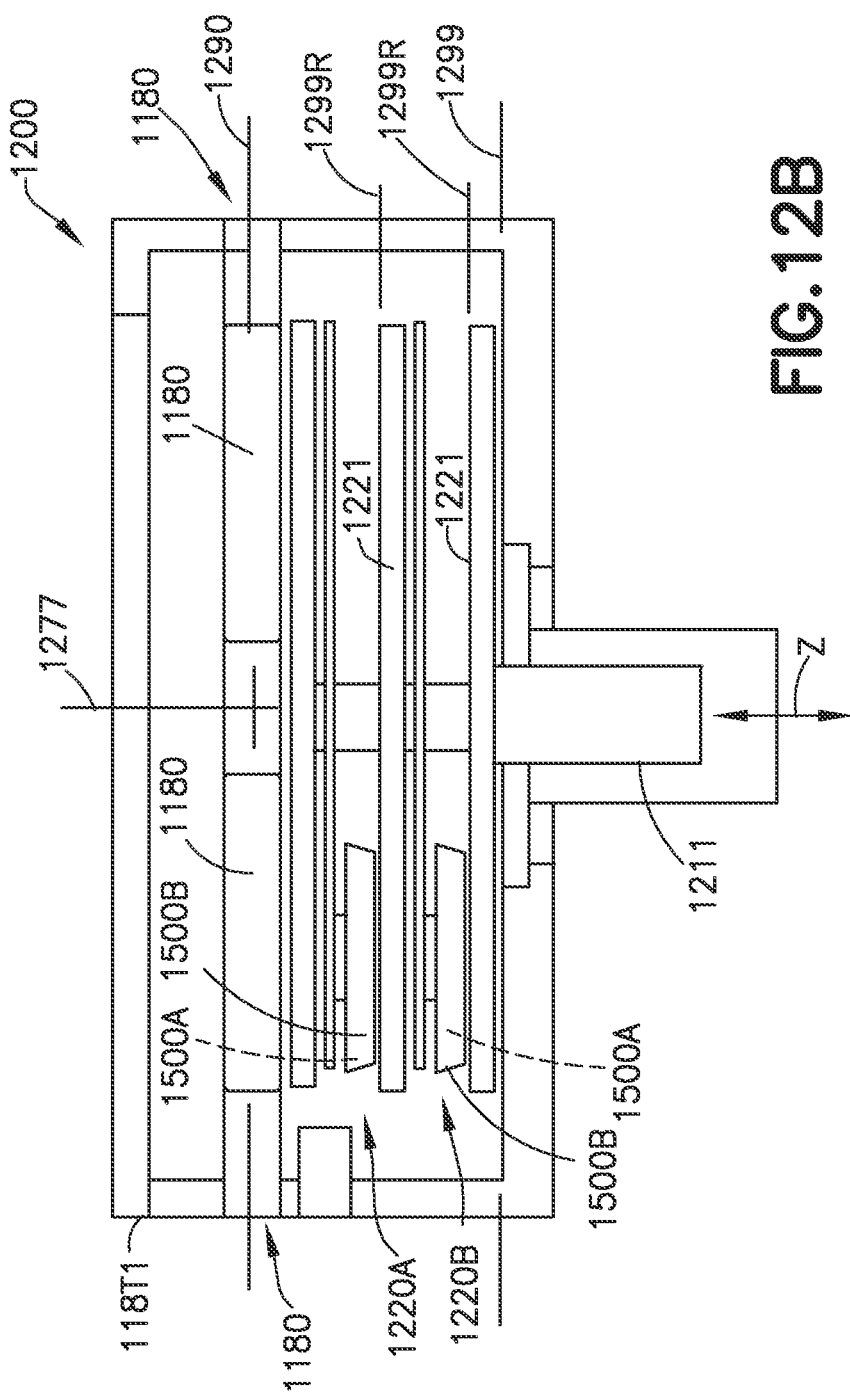

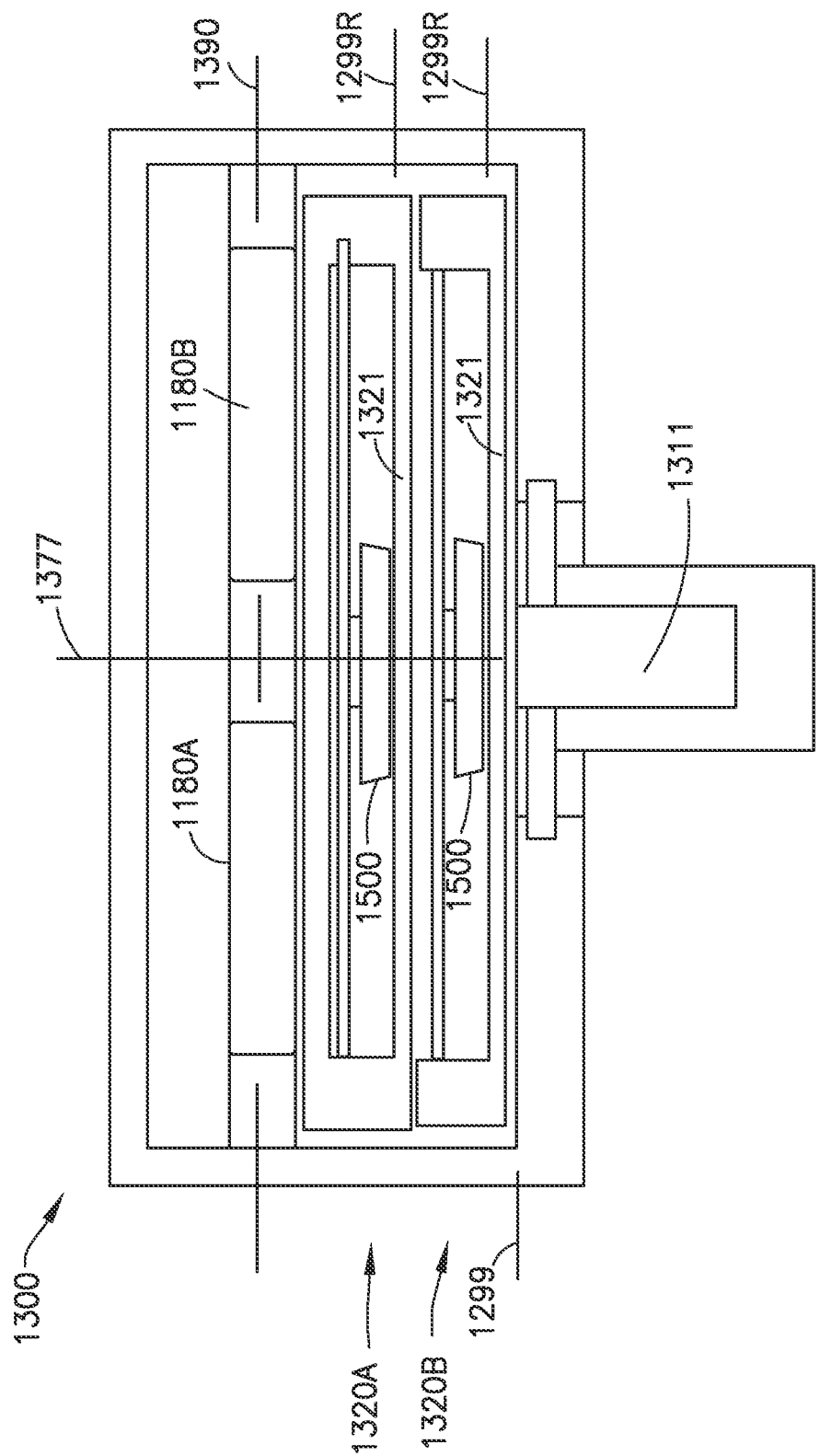

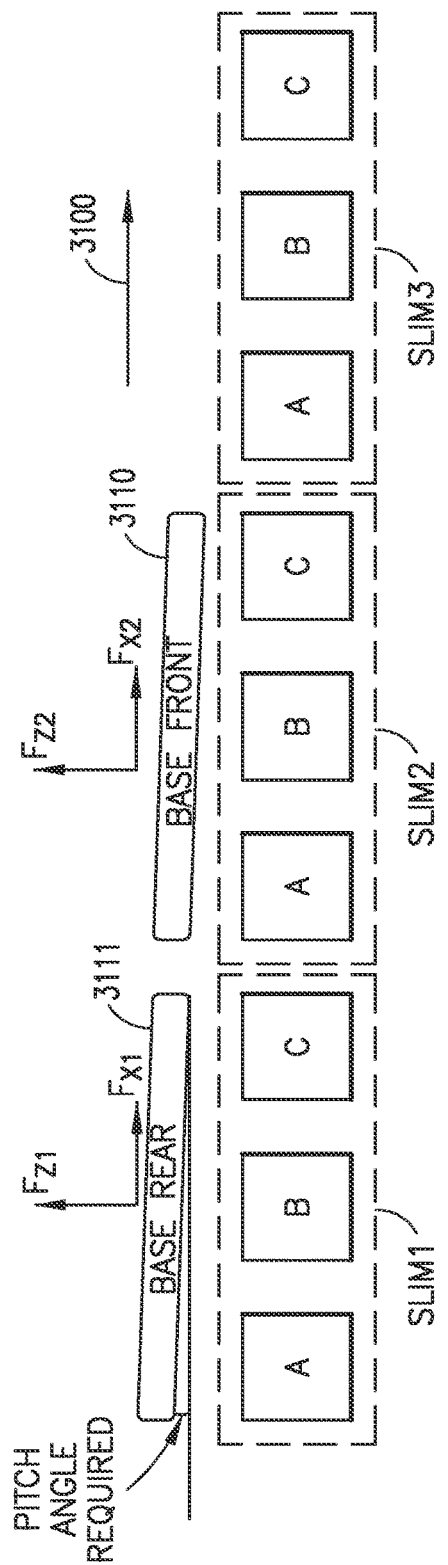
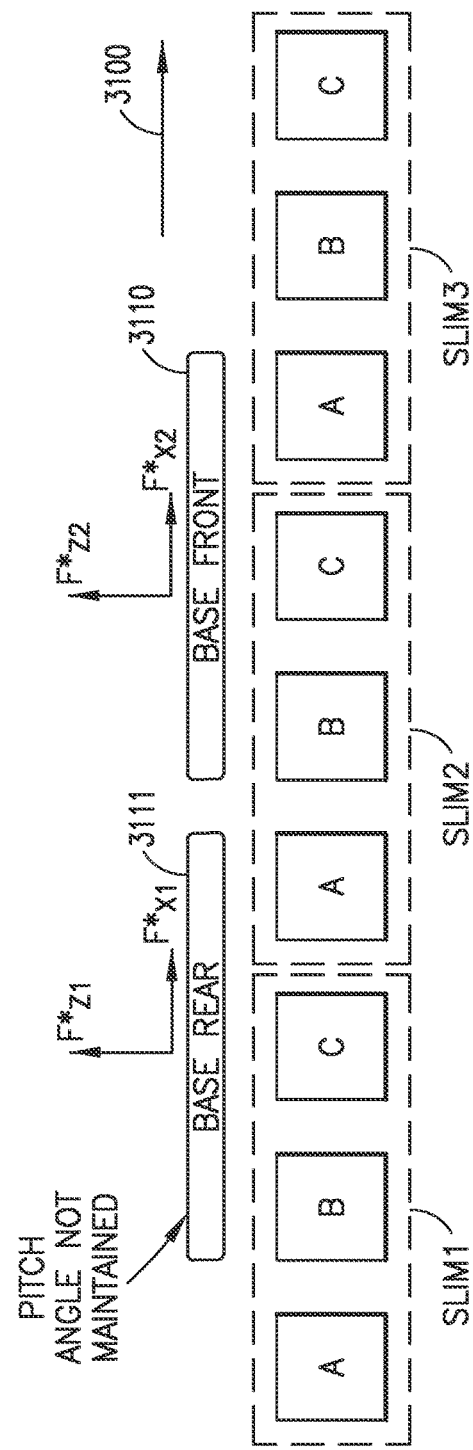
FIG.31A
PRIOR ART
FIG.31B
PRIOR ART

SUBSTRATE PROCESSING APPARATUS

CROSS REFERENCE TO RELATED APPLICATIONS

This application is continuation of Ser. No. 17/180,298, filed Feb. 19, 2021 (Now U.S. Pat. No. 11,476,139), which is a non-provisional application and claims the benefit of U.S. Provisional Patent Application No. 62/979,195, filed Feb. 20, 2020, the disclosures of which are incorporated herein by reference in their entireties.

BACKGROUND

1. Field

The exemplary embodiments generally relate to substrate processing equipment, and more particularly, to substrate transports of the substrate processing equipment.

2. Brief Description of Related Developments

Semiconductor automation generally comprises a series of building blocks that are required to support the implementation of processes to ultimately achieve predetermined levels of quality and reproducibility in semiconductor chip manufacturing. One component of semiconductor automation is the wafer (also referred to as a substrate) handler that transports the wafer or substrate between load locks and process modules and/or between process modules (e.g., in the case of sequential process tool architectures).

Generally, wafer handlers include robotic manipulators with rotary or prismatic joints and respective linkage-based mechanisms that are driven by actuators away from an end-effector of the robotic manipulator, where the end effector contacts or otherwise interfaces with the wafer. The design of such conventional manipulators generally includes the utilization of bearings in a vacuum environment at different portions of the manipulator structure, typically at the mechanical interfaces between each arm link of the manipulator. The utilization of bearings in vacuum environments generally has a potential for lubricant outgassing, particle generation, and friction variability during the operation of the bearing in the vacuum environment while handling wafers at high temperatures (such as in excess of 400° C.). The wafer handlers are also generally mounted to a vacuum cluster tool and their mechanical stroke is limited by the design of their associated arm link lengths. As a result, conventional wafer handlers, operating in a vacuum, are not suitable for "long" vacuum cluster tools such as what are known in the industry as "linear tool configurations".

In the case of linear tool configurations, "long reach" manipulators with long arm link lengths and articulated end effectors are generally employed to transfer wafers between the load locks and process modules of the linear tool. These long reach manipulators generally have mechanical designs with low natural frequencies, an increased numbers of actuators, undesirable arm link deflection, mechanical positioning hysteresis, high sensitivity to thermal expansion, expensive bearings, limited ability to level the end effector to wafer holding stations, and limited motion throughput. In addition, linear tool configuration may be scalable in the sense of allowing an end-user to extend a length of the linear tool with minimum impact to the existing automation. Another desirable feature of linear tools is the ability to service the linear tool (such as to perform scheduled maintenance on a wafer handler) with minimum disruption to tool operation.

As an alternative to the wafer handlers noted above, magnetic floating wafer conveyors may be employed where an alternating current magnetic floating apparatus for floating and conveying a conductive floating body or paramagnetic or nonmagnetic metallic material above a line of alternating current electromagnets is provided. The alternating current magnetic floating apparatus generally includes a single-phase alternating current source having a first frequency for floating the floating body, a three-phase alternating current source having a second frequency for conveying the floating body, an adder for adding alternating current from the two current sources, and a supply circuit for supplying the added alternating currents to the line of alternating current electromagnets. The floating body can be stopped at a desired position with efficient conveyance.

Also, FIGS. 33-36 show an example of an induction repulsive type magnetic floating mechanism. In FIGS. 33-36, numeral 01 denotes an alternating current electromagnet and numeral 02 denotes a floating body to be conveyed. Light and high-conductive material such as aluminum is suitable for the floating body 02. An object to be conveyed is usually placed on the floating body 02. In FIGS. 33-36, when a single phase alternating current indicated by numeral 04 of FIG. 35 is supplied to the alternating current electromagnets 01, an alternating magnetic field is generated above the electromagnets. Since the floating body is present in the magnetic field, an alternating current called an Eddy current is generated in the aluminum material forming the floating body.

A magnetic field generated by the Eddy current repels the magnetic field generated by the electromagnets. Accordingly, a floating force denoted by F1 in FIGS. 33 and 34 acts on the floating body by this repulsion. When three phase alternating currents indicated by numerals 05, 06, and 07 shown in FIG. 36 are supplied to the three-phase electromagnets 03 of FIGS. 33 and 34, a moving force denoted by F2 in FIGS. 33 and 34 acts on the floating body 02 and the floating body 02 is conveyed.

BRIEF DESCRIPTION OF THE DRAWINGS

The foregoing aspects and other features of the disclosed embodiment are explained in the following description, taken in connection with the accompanying drawings, wherein:

FIG. 8A is a schematic perspective view of a portion of a substrate handler in accordance with aspects of the disclosed embodiment;

FIG. 10 is a schematic plan view of a substrate processing apparatus incorporating aspects of the disclosed embodiment;

FIG. 10A is a schematic perspective view of a portion of a substrate handler of FIG. 10 in accordance with aspects of the disclosed embodiment;

FIG. 11 is a schematic plan view of a substrate processing apparatus incorporating aspects of the disclosed embodiment;

FIG. 11A is a schematic perspective view of a portion of a substrate handler of FIG. 11 in accordance with aspects of the disclosed embodiment;

FIG. 12B is a schematic elevation view of the substrate processing apparatus of FIG. 12A in accordance with aspects of the disclosed embodiment;

FIG. 13B is a schematic elevation view of the substrate processing apparatus of FIG. 13A in accordance with aspects of the disclosed embodiment;

FIGS. 31A and 31B illustrate tilt control of a platen utilizing a conventional linear drive system and static phase control.

DETAILED DESCRIPTION

FIGS. 1-14 illustrate exemplary substrate processing apparatus 100, 100A, 200, 300, 400, 500, 800, 900, 1200, 1300 in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

Based on the problems and limitations of conventional substrate processing apparatus noted above, it is desirable to have a new and innovative substrate handler and associated controls framework that are configured to operate in vacuum environment substantially without bearing and lubricants, perform substrate transfers across scalable distances without impacting the substrate handler design, transport substrates at higher accelerations than the conventional solutions noted above (i.e., substantially without requiring new end-effector materials), and operate multiple substrate handlers in a coordinated manner to avoid collisions and reduce a footprint of the substrate processing apparatus.

Figure 14:
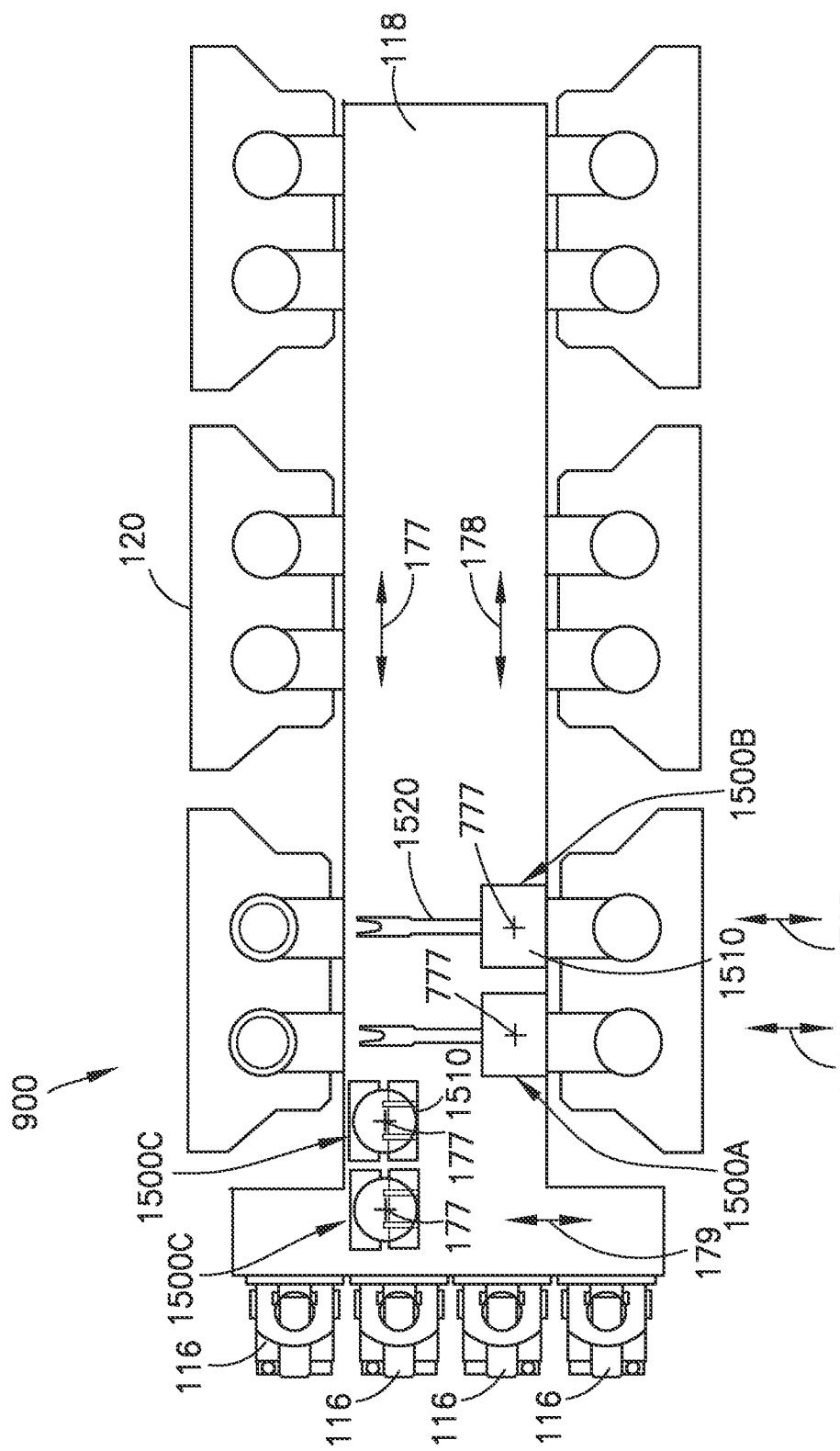
FIG. 14 is a schematic plan view of a substrate processing apparatus incorporating aspects of the disclosed embodiment.
Figure 15A:
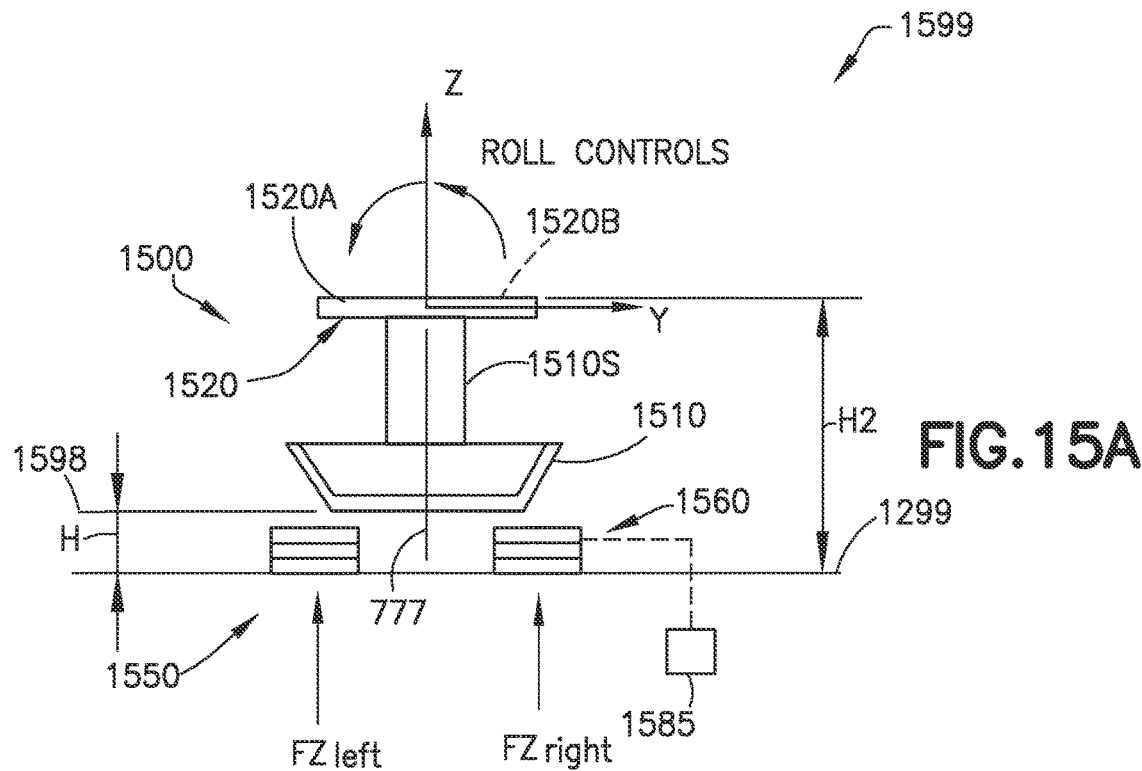
FIG. 15A is a front elevation view of a substrate handler in accordance with aspects of the disclosed embodiment.
Figure 15B:
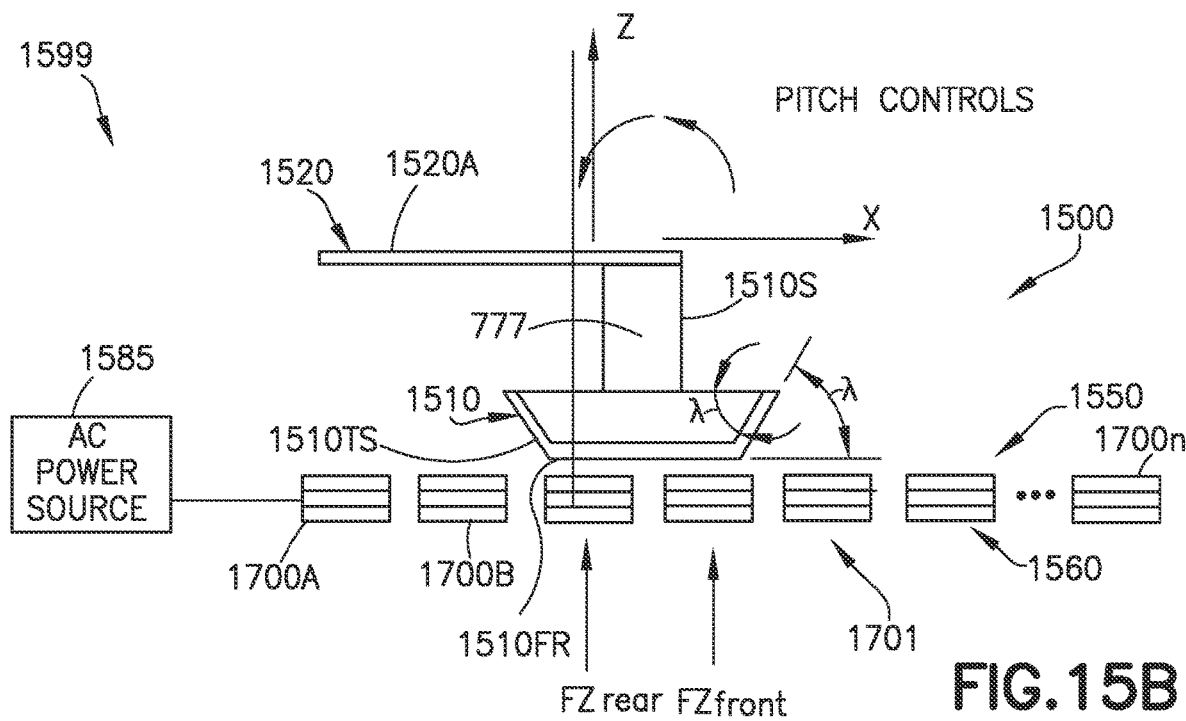
FIG. 15B is a schematic side elevation view of the substrate handler of FIG. 15A in accordance with aspects of the disclosed embodiment.
Figure 15C:
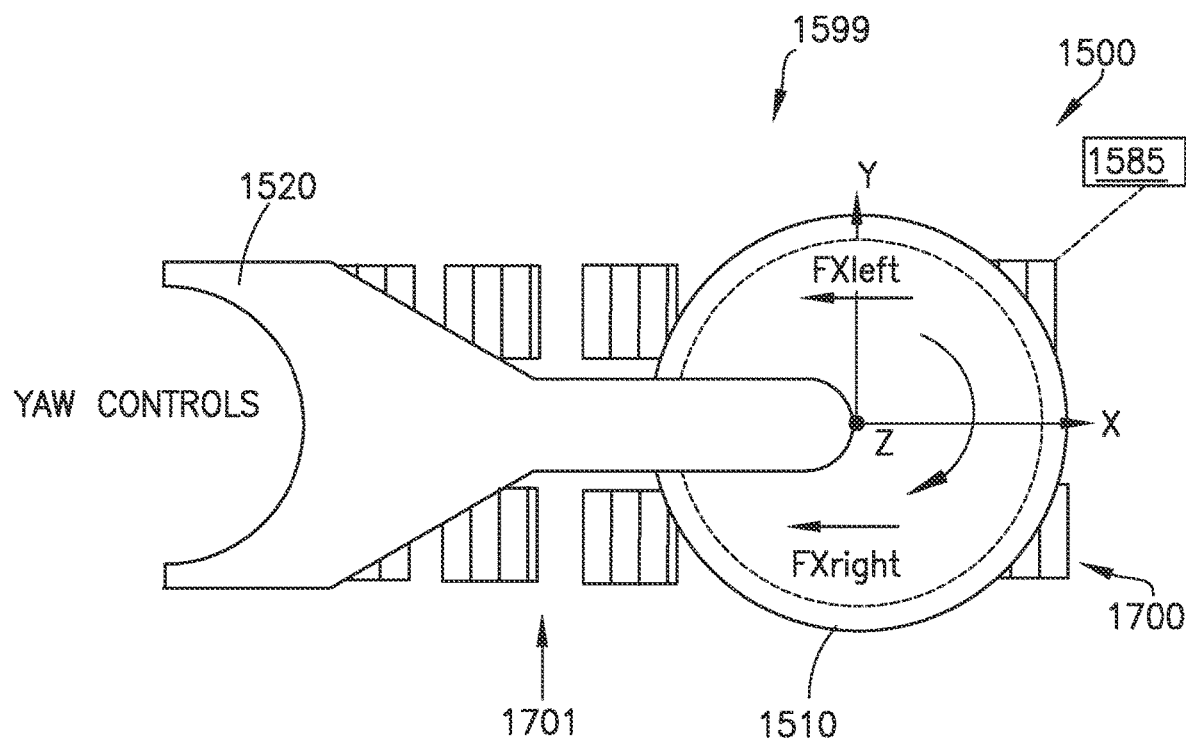
FIG. 15C is a schematic plan view of the substrate handler of FIG. 15A in accordance with aspects of the disclosed embodiment.
Figure 16A:
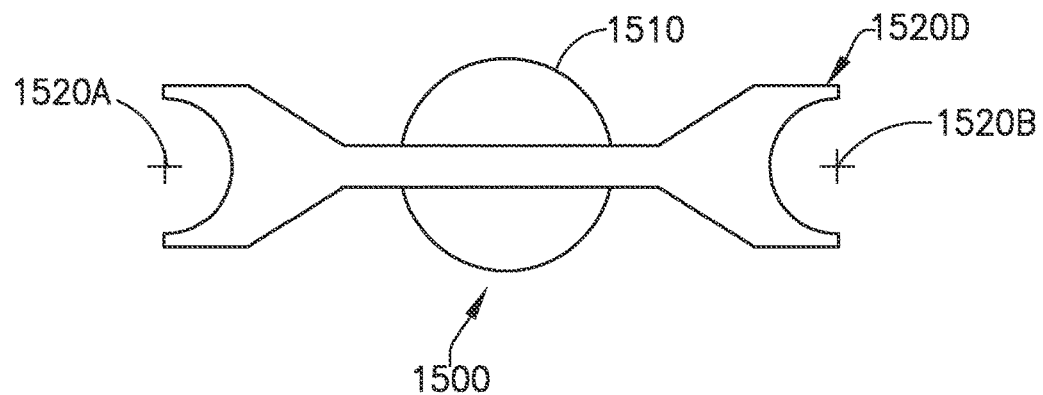
FIG. 16A is a schematic plan view of the substrate handler in accordance with aspects of the disclosed embodiment.
Figure 16B:
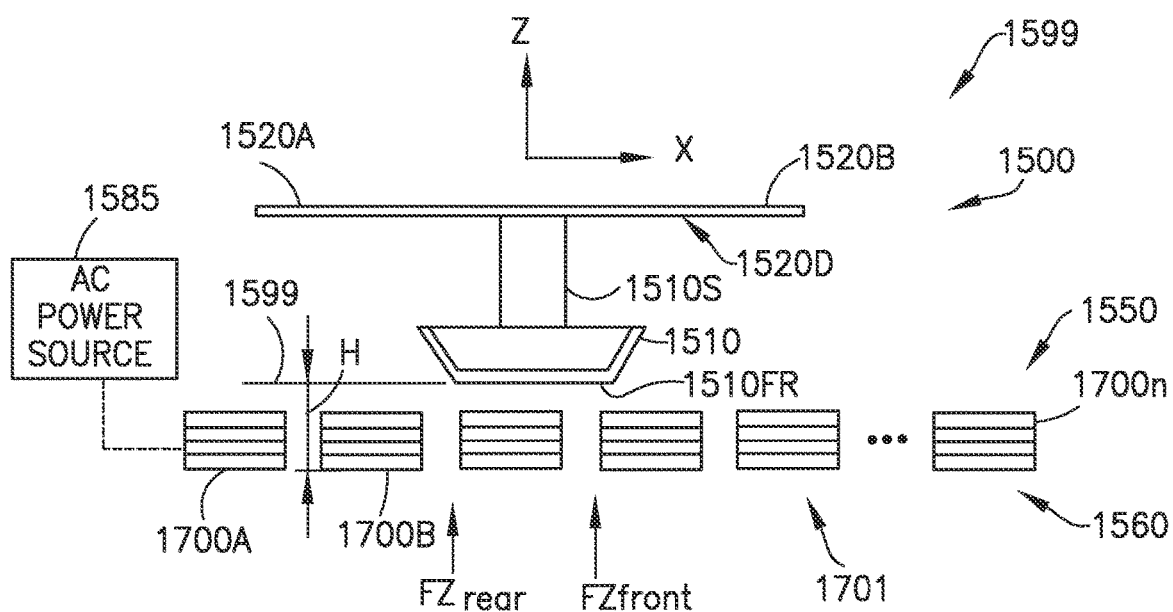
FIG. 16B is a schematic side elevation view of the substrate handler of FIG. 16A in accordance with aspects of the disclosed embodiment.
Figure 16C:
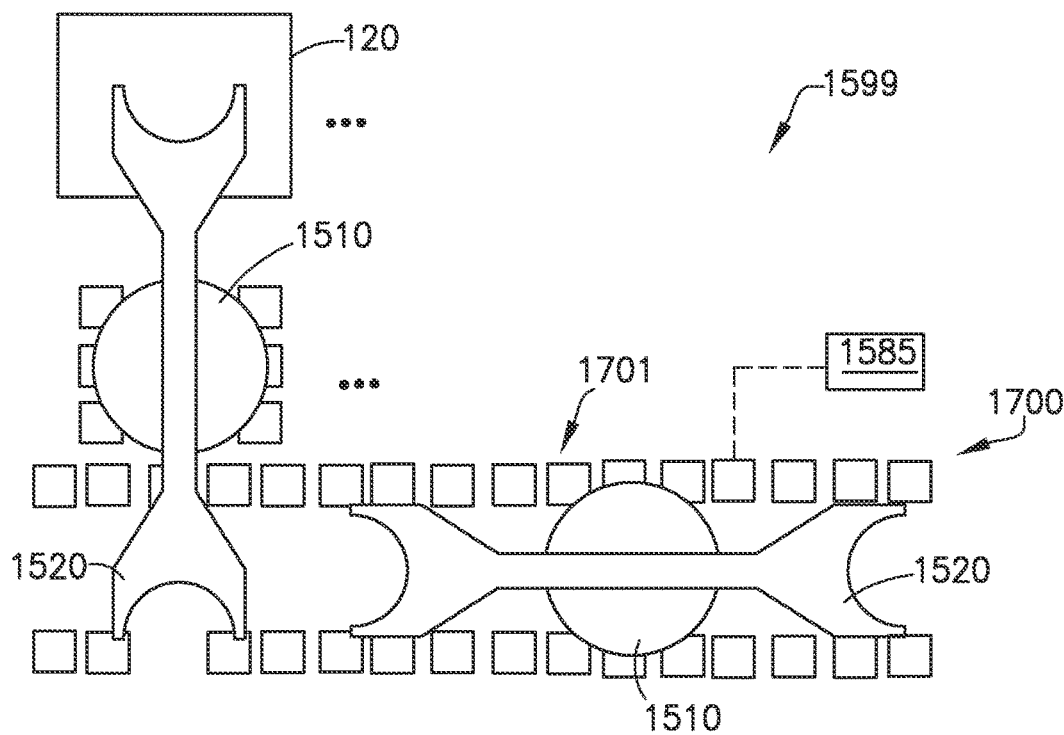
FIG. 16C is a schematic plan view of a portion of a substrate processing apparatus including the substrate handler of FIG. 16A in accordance with aspects of the disclosed embodiment.

Referring to FIGS. 15A-15C, a wafer handler 1500 is part of linear electrical (or electric) machine 1599 (as will be described in greater detail herein and also referred to as an electromagnetic conveyor substrate transport apparatus) included in the substrate processing apparatus of FIGS. 1-14. The wafer handler 1500 includes a paramagnetic base 1510 (also referred to as a reaction platen) (e.g., made of copper, aluminum or other suitable diamagnetic or nonmagnetic material that can induce Eddy currents) that is shaped to effect at least bi-directional linear induction propulsion along a direction of linear tracks 1550 formed by at least one linear induction motor stator 1560, and independent rotation of the base 1510. The wafer handler 1500 also includes an end-effector 1520 that is rigidly attached to the base 1510 and configured to stably hold substrates for transport throughout a respective chamber of a substrate processing apparatus. The wafer handler 1500 is controlled by actuator and sensor control units, as will be described herein so that the configuration of the wafer handler 1500 is not dependent on the stroke distances the wafer handler 1500 can cover (or extend). The independence of the wafer handler configuration 1500 is effected by utilizing a network of actuators 1700 and sensors 2000 (shown in and described in greater detail with respect to FIGS. 17-20 and 39) that are physically distributed along at least a length of the substrate processing apparatus (such as along a length of a transport chamber 118) as will be described herein. In the aspects of the disclosed embodiment, the actuators 1700 and sensors 2000 are not tied to any specific substrate handler 1500; rather, the same actuators 1700 and sensors 2000 (are common to and) can control multiple substrate handlers 1500 concurrently, which reduces cost of ownership of the substrate handlers 1500 as the substrate handlers 1500 may be added to or removed from a substrate processing apparatus without adding additional actuators and sensors. Concurrent control of multiple substrate handlers 1500 with common actuators 1700 and sensors 2000 is effected by a control system in accordance with the aspects of the disclosed embodiment (described in greater detail below) that is configured to dynamically allocate the excitation phase of each actuator coil unit (also referred to as an electromagnet) of the common actuators 1700 between different excitation phases in a manner that provides continuity of force vectors for performing wafer handler motion in a three-dimensional space with control of up to six degrees of freedom from the common (set) of actuators 1700. As will be described herein, the concurrently controlled substrate handlers 1500 may be controlled in roll, pitch, and/or yaw to allow two or more independently operated substrate handlers 1500 to decrease a distance between the substrate handlers 1500 by tilting each (or at least one) of the substrate handlers 1500 along a rotation axis substantially parallel to the motion thrust direction (see, e.g., FIG. 29).

As noted above, conventional robotic manipulators with articulated links require substantially different mechanical designs as the required stroke of the manipulators is increased in order to reach a larger number of process modules, which increases the cost of the robotic manipulators and may shorten robotic manipulator service intervals. Contrary to conventional substrate handling systems, the aspects of the disclosed embodiment are highly scalable when compared to existing commonly accepted substrate handling solutions (such as those described above) without adding complexity and reliability concerns resultant from an increased number of mechanical components.

The aspects of the disclosed embodiment also effect substantially higher substrate processing throughput compared to the conventional substrate handling solution. As described herein, the aspects of the disclosed embodiment include an innovative motion sensing controls framework that pitches a substrate holding surface of the substrate handler end effector towards a direction of movement to provide for higher accelerations compared to the conventional substrate handling solutions while maintaining contact between the wafer and the end effector without slippage.

As will be described in greater detail herein, the aspects of the disclosed embodiment provide for a magnetic levitated substrate transport apparatus based on linear induction technology that is configured to provide lift, lateral stabilization, and propulsion to the substrate handler. Aspects of the disclosed embodiment also provide for a linear induction motor stator operating in and forming independently controlled linear tracks that are orthogonal or otherwise angled at an orientation between being substantially parallel and substantially orthogonal and/or forming arcuate or rotary paths over a two-dimensional area. The aspects of the disclosed embodiment provide a coil controller that is configured to generate alternating current at a prescribed frequency and amplitude for each phase of each linear induction motor stator associated with a respective linear track 1550. The propulsion forces provided by the linear tracks are controlled so as to rotate the base 1510, independent of linear movement of the base along the tracks, where the propulsion forces generate a moment load around an axis of rotation of the base 1510.

The aspects of the disclosed embodiment include a control system configured to track a position of the base 1510 and control the phase currents of the independent linear tracks 1550 for controlling motion of the base 1510 along a desired propulsion direction along the independent linear tracks 1550. The control system, in accordance with aspects of the disclosed embodiment, also provides for motion of the base 1510 in a lift direction while maintaining lateral stabilization of the base 1510. The control system is configured to generate propulsion forces with the linear tracks 1550 so as to control roll, pitch, and yaw of the substrate handler 1500, where the roll, pitch, and yaw motions of the substrate handler 1500 may be employed to maximize substrate production throughput by adjusting an inclination of the substrate handler 1500 (see, e.g., FIG. 21) depending on a desired acceleration of the substrate handler 1500 in linear and/or rotation directions of motion, so as to increase the acceleration threshold along a thrust direction of the substrate handler 1500.

Figure 18:
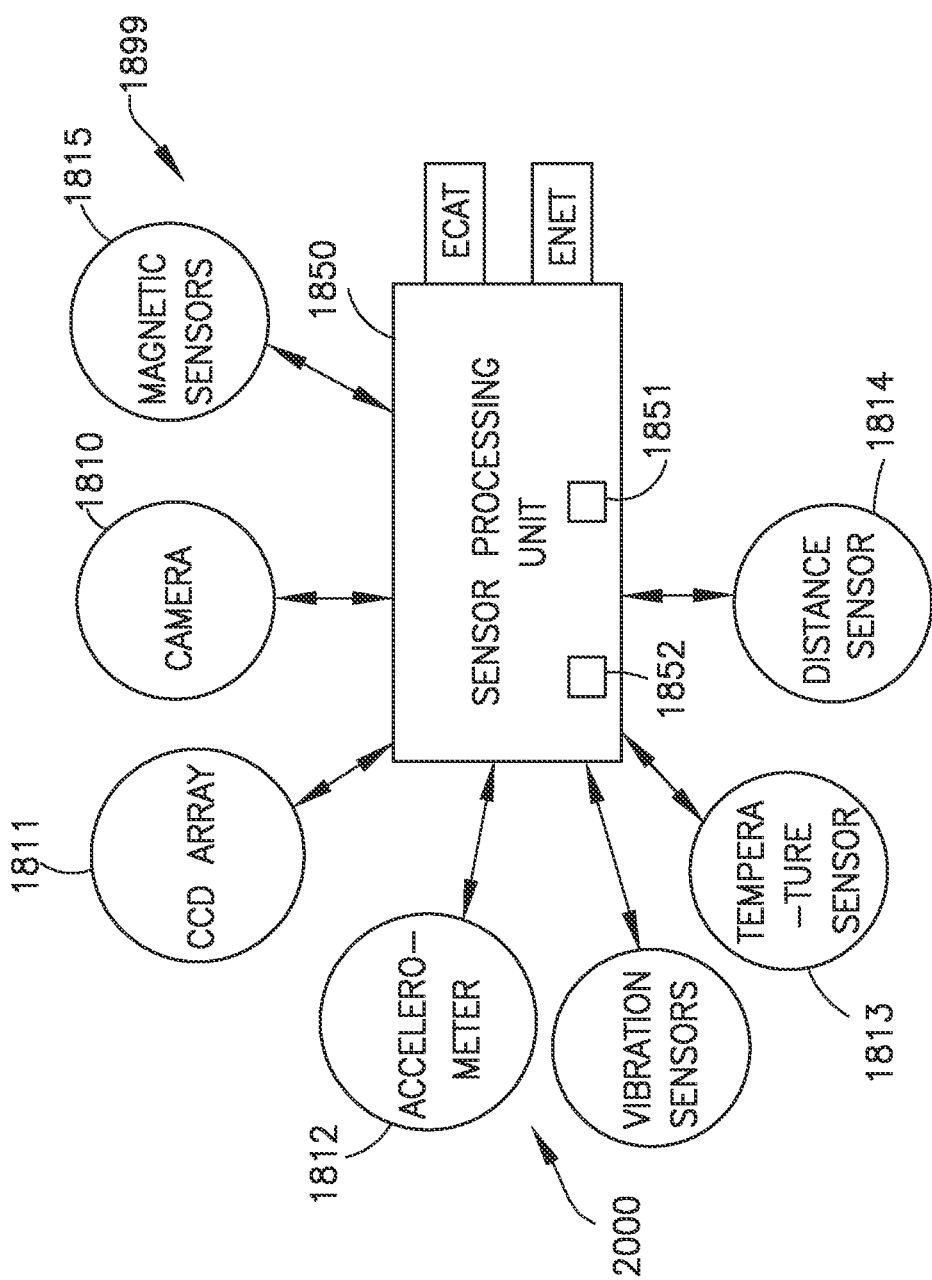
FIG. 18 is a schematic illustration of a portion of a sensor control system network in accordance with aspects of the disclosed embodiment.

The aspects of the disclosed embodiment include a sensor processing unit 1850 (see FIG. 18) that may be part of a sensor and controls network such as EtherCat® (Ethernet for Control Automation Technology, referred to as ECat in FIG. 18), EtherNet® (referred to as ENet in FIG. 18) or other suitable sensor and controls network. The sensor processing unit includes a general-purpose sensor and processing hardware (including non-transient computer program code or software) configured to interface with multiple sensor technologies such as cameras 1810, CCD arrays 1811, accelerometers 1812, temperature sensors 1813, proximity or distance sensors 1814, magnetic sensors 1815, vibration sensors 1816, or any other suitable sensors.

Figure 1A:
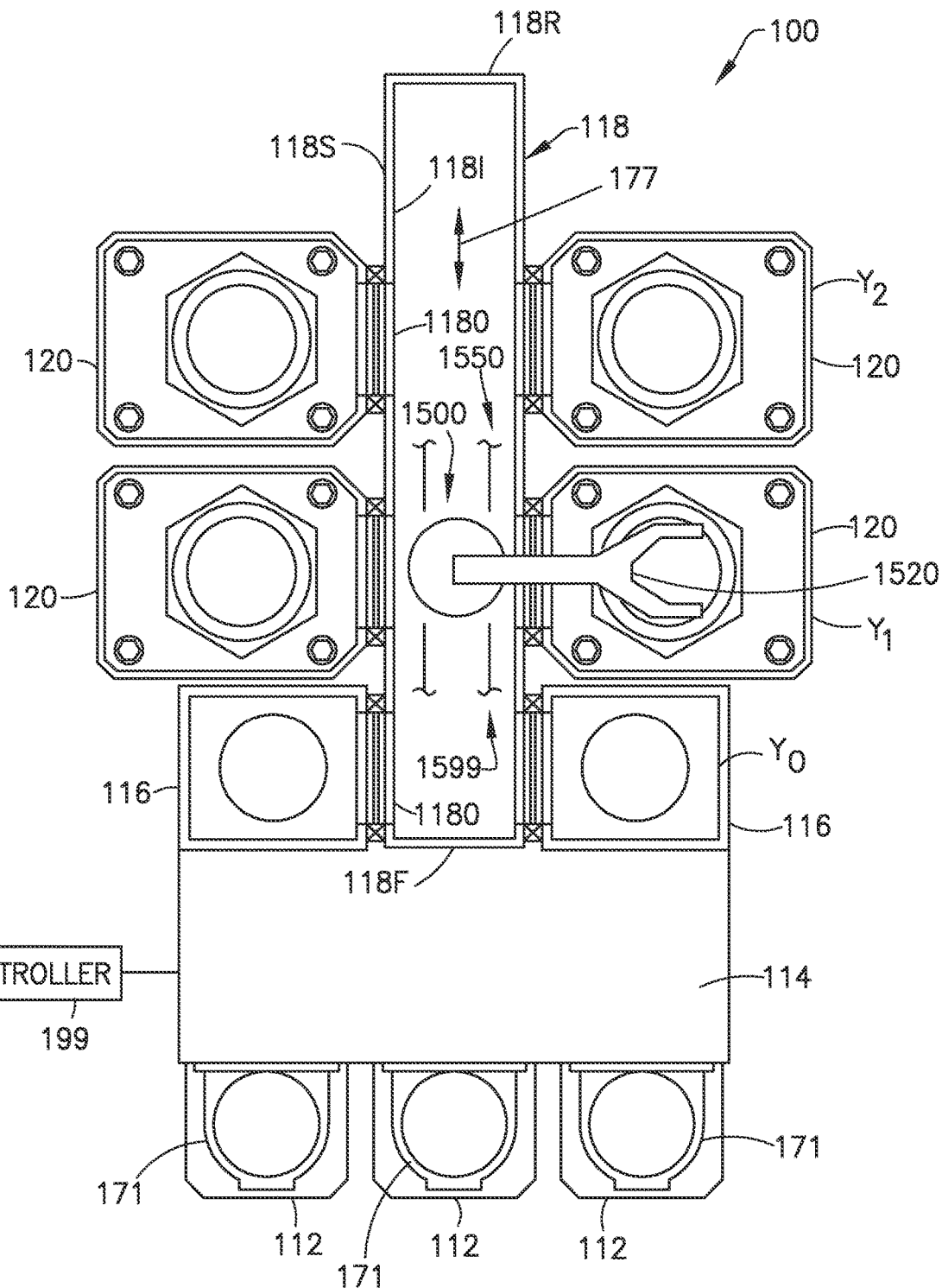
FIG. 1A is a schematic plan view of a substrate processing apparatus incorporating aspects of the disclosed embodiment.

Referring to FIG. 1A, there is shown a schematic plan view of a substrate processing apparatus 100 incorporating aspects of the disclosed embodiment. The substrate processing apparatus 100 is connected to an environmental front end module (EFEM) 114 which has a number of load ports 112 as shown in FIG. 1A. The load ports 112 are capable of supporting a number of substrate storage canisters 171 such as for example conventional FOUP canisters; though any other suitable type may be provided. The EFEM 114 communicates with the processing apparatus through load locks 116 which are connected to the processing apparatus as will be described further below. The EFEM 114 (which may be open to atmosphere) has a substrate transport apparatus (not shown—but in some aspects is similar to the linear electrical machine 1599 described herein) capable of transporting substrates from load ports 112 to load locks 116. The EFEM 114 may further include substrate alignment capability, batch handling capability, substrate and carrier identification capability or otherwise. In other aspects, the load locks 116 may interface directly with the load ports 112 as in the case where the load locks have batch handling capability or in the case where the load locks have the ability to transfer wafers directly from the FOUP to the lock. Some examples of such apparatus are disclosed in U.S. Pat. Nos. 6,071,059, 6,375, 403, 6,461,094, 5,588,789, 5,613,821, 5,607,276, 5,954,472, 6,120,229, and 6,869,263 all of which are incorporated by reference herein in their entirety. In other aspects, other load lock options may be provided.

Still referring to FIG. 1A, the processing apparatus 100, may be used for processing semiconductor substrates (e.g. 200 mm, 300 mm, 450 mm, or other suitably sized wafers), panels for flat panel displays, or any other desired kind of substrate, generally comprises transport chamber 118 (which in one aspects holds a sealed atmosphere therein), processing modules 120, and at least one substrate transport apparatus or linear electrical machine 1599. The substrate transport apparatus 1599 in the aspect shown may be integrated with the chamber 118 or coupled to the chamber in any suitable manner as will be described herein. In this aspect, processing modules 120 are mounted on both sides of the chamber 118. In other aspects, processing modules 120 may be mounted on one side of the chamber 118 as shown for example in FIG. 2. In the aspect shown in FIG. 1A, processing modules 120 are mounted opposite each other in rows Y1, Y2 or vertical planes. In other aspects, the processing modules 120 may be staggered from each other on the opposite sides of the transport chamber 118 or stacked in a vertical direction relative to each other. Referring also to FIGS. 15A-15C, the transport apparatus 1599 has substrate handler 1500 that is moved in the chamber 118 to transport substrates between load locks 116 and the processing chambers 120. In the aspect shown, only one substrate handler 1500 is provided; however, in other aspects more than one substrate handler may be provided. As seen in FIG. 1A, the transport chamber 118 (which is subjected to vacuum or an inert atmosphere or simply a clean environment or a combination thereof in its interior) has a configuration, and employs the novel substrate transport apparatus 1599 that allows the processing modules 120 to be mounted to the chamber 118 in a Cartesian arrangement with processing modules 120 arrayed in substantially parallel vertical planes or rows. This results in the processing apparatus 100 having a more compact footprint than a comparable conventional processing apparatus, such as those described herein. Moreover, the transport chamber 118 may be capable of being provided with any desired length (i.e., the length is scalable) to add any desired number of processing modules 120, as will be described in greater detail below, in order to increase throughput. The transport chamber 118 may also be capable of supporting any desired number of transport apparatus 1599 therein and allowing the transport apparatus 1599 to reach any desired processing chamber 120 coupled to the transport chamber 118 without interfering with each other. This in effect decouples the throughput of the processing apparatus 100 from the handling capacity of the transport apparatus 1599, and hence the processing apparatus 100 throughput becomes processing limited rather than handling limited. Accordingly, throughput can be increased as desired by adding processing modules 120 and corresponding handling capacity on the same platform.

Still referring to FIG. 1A, the transport chamber 118 in this aspect has a general rectangular shape though in other aspects the chamber may have any other suitable shape. The chamber 118 has a slender shape (i.e. length much longer than width) and defines a generally linear transport path for the transport apparatus 1599 therein. The chamber 118 has longitudinal side walls 118S. The side walls 118S have transport openings or ports 1180 (also referred to as substrate pass through openings) formed therethrough. The transport ports 1180 are sized large enough to allow substrates to pass through the ports (can be sealable through valves) into and out of the transport chamber 118. As can be seen in FIG. 1A, the processing modules 120 in this aspect are mounted outside the side walls 118S with each processing module 120 being aligned with a corresponding transport port 1180 in the transport chamber 118. As can be realized, each processing module 120 may be sealed against the sides 118S of the chamber 118 around the periphery of the corresponding transport aperture to maintain the vacuum in the transport chamber. Each processing module 120 may have a valve, controlled by any suitable means to close the transport port when desired. The transport ports 1180 may be located in the same horizontal plane. Accordingly, the processing modules on the chamber are also aligned in the same horizontal plane. In other aspects, the transport ports 1180 may be disposed in different horizontal planes. As seen in FIG. 1A, in this aspect, the load locks 116 are mounted to the chamber sides 118S at the two front most transport ports 1180. This allows the load locks 116 to be adjacent the EFEM 14 at the front of the processing apparatus. In other aspects, the load locks 116 may be located at any other transport ports 1180 on the transport chamber 118 such as shown for example in FIG. 2. The hexahedron shape of the transport chamber 118 allows the length of the chamber to be selected as desired in order to mount as many rows of processing modules 120 as desired (for example see FIGS. 1B, 3, 4-7 showing other aspects in which the transport chamber 118 length is such to accommodate any number of processing modules 120).

As noted before, the transport chamber 118 in the aspect shown in FIG. 1A has a substrate transport apparatus 1599 having a single substrate handler 1500. The transport apparatus 1599 is integrated with the chamber 118 to translate substrate handler 1500 back and forth in the chamber 118 between front 118F and back 118R. The substrate handler 1500 of the substrate transport apparatus 1599 has at least one end effector 1520 for holding one or more substrates.

It should be understood that the transport apparatus 1599, shown in FIG. 1A is a representative transport apparatus and, includes the substrate handler 1500 which is magnetically supported from the linear tracks 1550. The transport apparatus 1599 will be described in greater detail below. The transport chamber 118 may form a frame with a level reference plane 1299 (e.g., that defines or otherwise corresponds (e.g., is substantially parallel) with a wafer transport plane 1290—see FIG. 12B) linear tracks 1550 may be mounted to the side walls 118S or floor of the transport chamber 118 and may extend the length of the chamber 118. This allows the substrate handler 1500 to traverse the length of the chamber 118. As will be described in greater detail below the linear tracks 1550 of FIG. 1A each include an array of electromagnets or actuators 1700, also referred to herein as a network of actuators as in FIGS. 14A, 15B, 15B, 16B, 16C, and 17 (e.g., that form at least one linear induction motor stator 1560), connected to the transport chamber 118 to form a drive plane 1598 at a predetermined height H relative to the reference plane 1299, the array of electromagnets 1700 being arranged so that a series of the electromagnets 1700 define at least one drive line within the drive plane 1598, and each of the electromagnets 1700A-1700n (see FIG. 15B) being coupled to an alternating current (AC) power source 1585 energizing each electromagnet 1700A-1700n, where the alternating power source is, in one aspect, a three phase alternating current power source. As noted above (see FIG. 15A), the base or reaction platen 1510 is formed of a paramagnetic, diamagnetic, or non-magnetic conductive material disposed to cooperate with the electromagnets 1700A-1700n of the array of electromagnets 1700 so that excitation of the electromagnets 1700A-1700n with alternating current from the alternating current source 1585 generates levitation forces FZ and propulsion forces FP (see FIG. 21) against the base 1510 that controllably levitate and propel the base 1510 along the at least one drive line 177-180 (see, e.g., FIGS. 1-8), in a controlled attitude relative to the drive plane 1598.

Figure 1B:
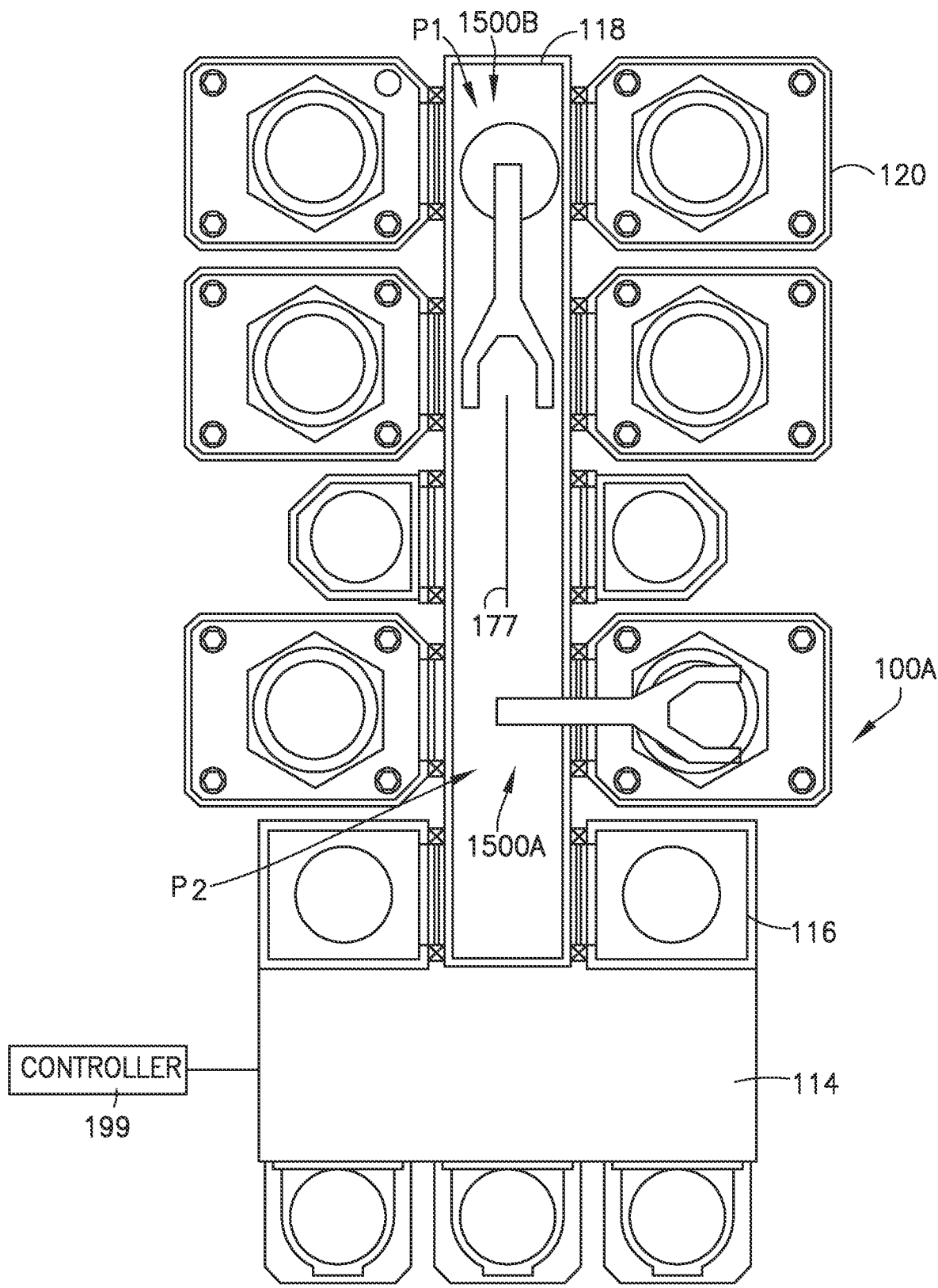
FIG. 1B is a schematic plan view of a substrate processing apparatus incorporating aspects of the disclosed embodiment.
Figure 2:
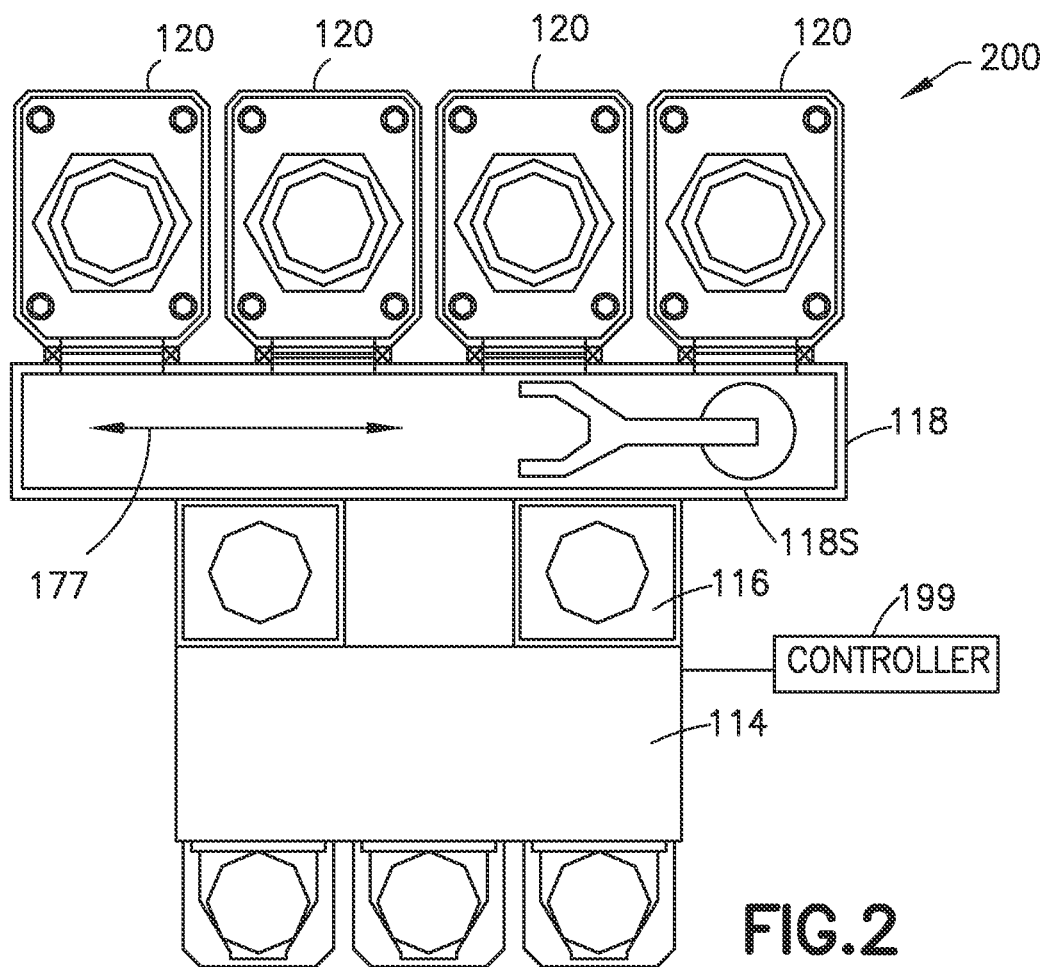
FIG. 2 is a schematic plan view of a substrate processing apparatus incorporating aspects of the disclosed embodiment.
Figure 3:
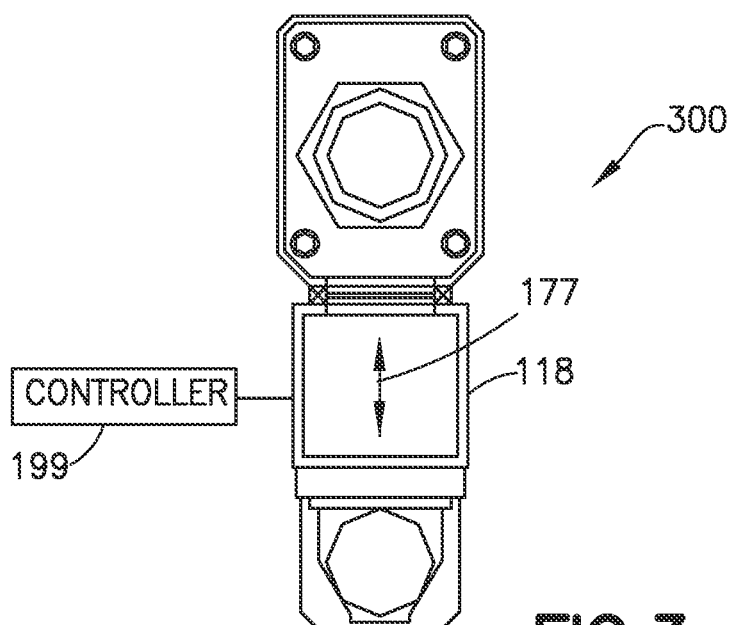
FIG. 3 is a schematic plan view of a substrate processing apparatus incorporating aspects of the disclosed embodiment.
Figure 8:
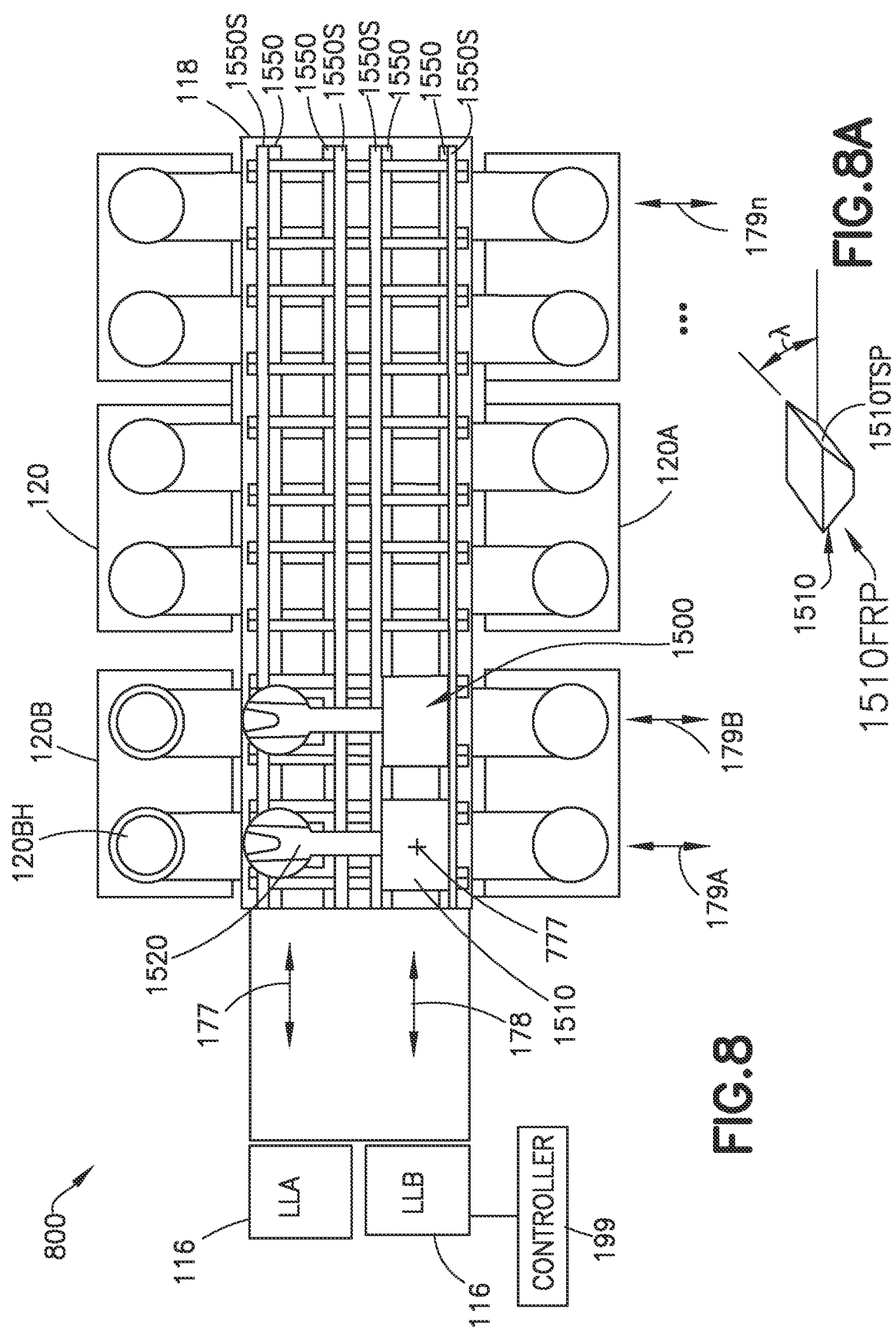
FIG. 8 is a schematic plan view of a substrate processing apparatus incorporating aspects of the disclosed embodiment.
Figure 9:
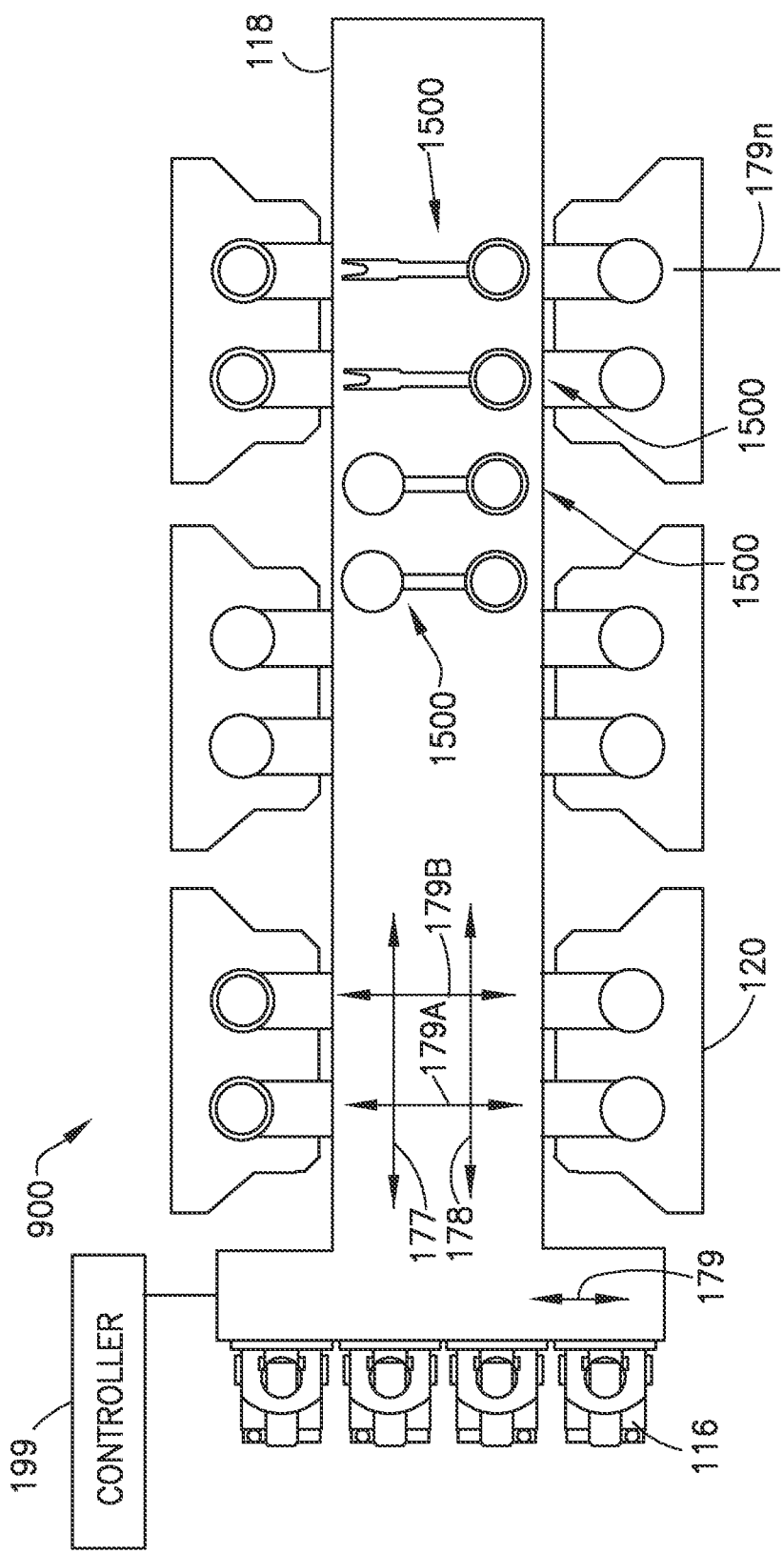
FIG. 9 is a schematic plan view of a substrate processing apparatus incorporating aspects of the disclosed embodiment.

FIG. 1B shows another aspect of a substrate processing apparatus 100A which is generally similar to apparatus 100. In this aspect, the transport chamber 118 has two substrate handlers 1500A, 1500B independently operated by the array of electromagnets 1700 (as in FIG. 16C). The substrate handlers 1500A, 1500B are substantially the same as the substrate handler 1500 in the previously described aspect. Both of the substrate handlers 1500A, 1500B may be supported from a common array of electromagnets 1700 as described before. The base 1510 of each substrate handler 1500A, 1500B may be driven by the same at least one linear induction motor stator 1560 as will be described herein, by individually controlling each coil element or electromagnet 1700A-1700n (as in FIG. 15B). Thus, as can be realized the end effector 1520 each substrate handler 1500 can be independently moved in linear movement and/or rotation using the at least one linear induction motor stator 1560. However, in this aspect the substrate handlers 1500A, 1500B are not capable of passing each other in the transport chamber 118 as the transport chamber 118 includes but one drive line 177 (compared to transport chambers having multiple substantially parallel drive lines as shown in FIGS. 8-10). Accordingly, the processing modules 120 are positioned along the length of the transport chamber 118 so that the substrate may be transported to be processed in the processing module in a sequence which would avoid the substrate handlers 1500A, 1500B from interfering with each other. For example, processing modules for coating may be located before heating modules, and cooling modules and etching modules may be located last.

However, referring to FIGS. 8-10, the transport chamber 118 may have any suitable width to provide for two or more drive substantially parallel drive lines 177, 178 that extend at least along a portion of a longitudinal length of the transport chamber 118 so that the two substrate handlers 1500A, 1500B pass adjacent each other (akin to a side rail or bypass rail). In the aspects illustrated in FIGS. 8-10 the transport apparatus 1599 has two drive lines 177, 178 but in other aspects any suitable number of substantially parallel longitudinally extending drive lines may be provided.

In accordance with some aspects of the disclosed embodiment, the array of electromagnets 1700 (or at least a portion thereof) may also be used as heater for the wafer handler (e.g., so as to control heating of the reaction platen and/or wafer to a desired predetermined temperature and for a desired predetermined time) as in the case where it is desired to eliminate water vapor (e.g., gas) or potentially pre-heat the wafer/substrate picked from, e.g., a load port en route to a process module or alternatively reduce thermal gradient between the wafer at the process module and the wafer handler end effector. The heating of the wafer handler may be effected with the reaction platen in transit or with the reaction platen held static in a predetermined location/position. Still In accordance with some aspects of the disclosed embodiment, the array of electromagnets 1700 (or at least a portion thereof) may also be used as heaters as in the case where it is desired that the transport chamber 118 be heated for degas as in the case to eliminate water vapor for example. Controlled heating of the transport chamber 118 to a predetermined temperature for a predetermined time may be with the reaction platen static. The controlled heating of the transport chamber 118 may facilitate thermal scanning with suitable thermal sensors/infrared sensors of the transport chamber 118, such as to identify presence and map a location of the reaction platen within the transport chamber 118 at cold start or power off of the transport chamber 118 and drives.

Figure 4:
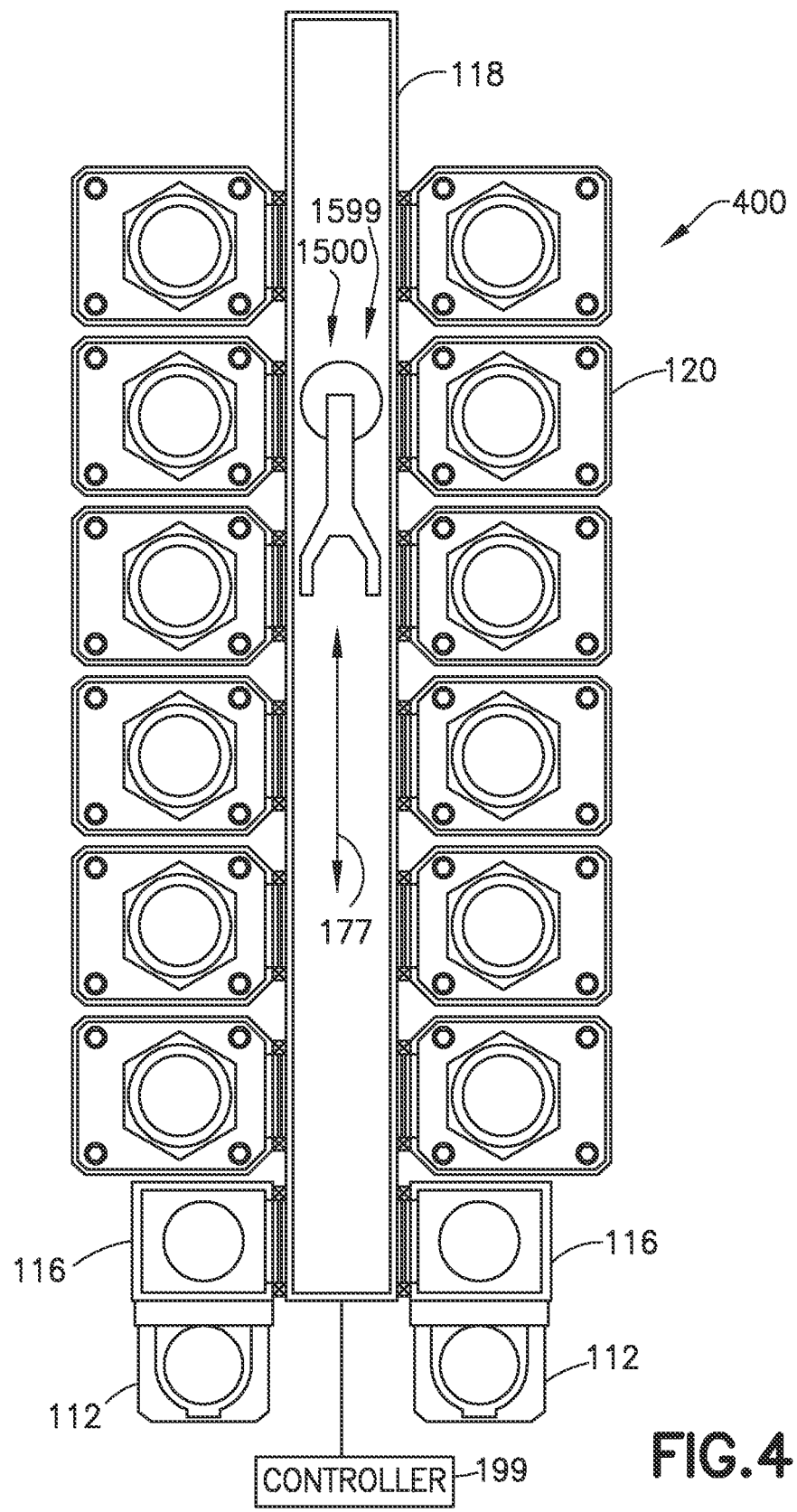
FIG. 4 is a schematic plan view of a substrate processing apparatus incorporating aspects of the disclosed embodiment.
Figure 5:
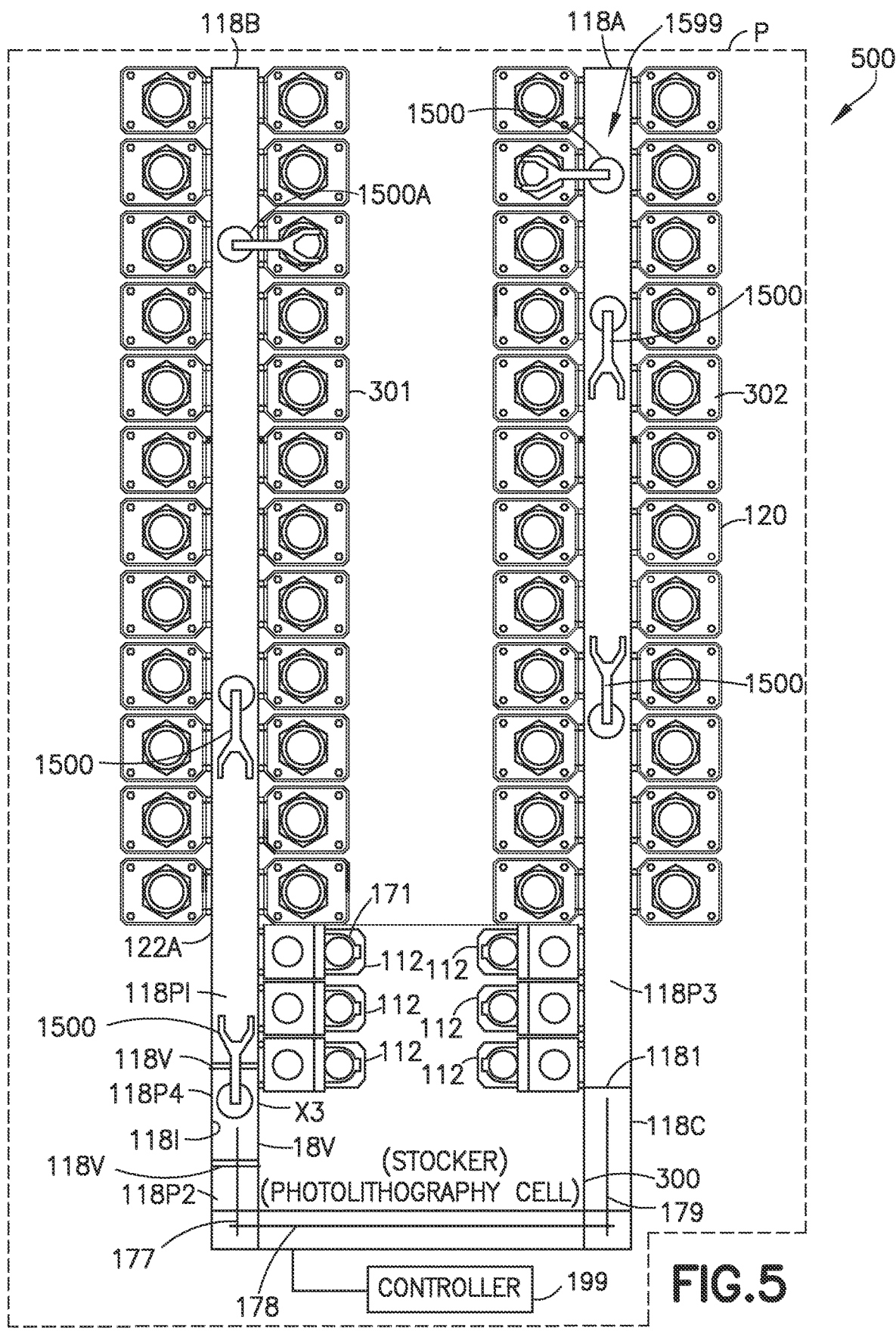
FIG. 5 is a schematic plan view of a substrate processing system incorporating aspects of the disclosed embodiment.

Referring now to FIGS. 4 and 5 there are shown other substrate processing apparatus 400, 500 in accordance with other aspects of the disclosed embodiment. As seen in FIGS. 4 and 5 the transport chamber(s) 118, 118A, 118B, 118C in these aspects is elongated to accommodate additional processing modules 120. The apparatus shown in FIG. 4 has twelve (12) processing modules 120 connected to the transport chamber 118. The processing apparatus 500 in FIG. 5 is illustrated as having two transport chambers 118A, 118B coupled to each other by a bridging chamber 118C that provides for movement of the substrate handlers 1500 between the transport chambers 118A, 118B. Here, each transport chamber 118A, 118B in FIG. 5 has 24 processing modules 120 connected thereto. The numbers of processing modules 120 shown in these aspects are merely exemplary, and the substrate processing apparatus may have any other number of processing modules 120 as previously described. The processing modules 120 in these aspects are disposed along the sides of the respective transport chamber 118A, 118B in a Cartesian arrangement similar to that previously discussed. The number of rows of processing modules 120 in these aspects, however have been greatly increased (e.g. six (6) rows in the apparatus of FIG. 4, and twelve (12) rows in each of the apparatus of FIG. 5). In the aspect shown in FIG. 4, the EFEM may be removed and the load ports 112 may be mated directly to the load locks 116. The transport chambers of the substrate processing apparatus 400, 500 in FIGS. 4, and 5 may have multiple substrate handlers 1500 to handle the substrates between the load locks 116 and the processing chambers 120. The number of substrate handlers 1500 shown is merely exemplary and more or fewer apparatus may be used. The substrate transport apparatus 1599 (a portion of which is illustrated in FIGS. 4 and 5) in these aspects are generally similar to that previously described, comprising the linear tracks 1550 and substrate handler(s) 1500. In the aspects shown in FIGS. 4 and 5, while only a single longitudinal drive line (e.g., drive lines 177, 178, 179 is illustrated in each chamber 118, 118A, 118B, 118C, it should be understood that in other aspects multiple drive lines may longitudinally extend along each chamber 118, 118A, 118B, 118C in a manner substantially similar to that illustrated in FIGS. 8-10. As can be realized, as with the other substrate transport apparatus 100, 100A, 200, 300, 800, 900, 1200, 1300 described herein, the substrate transport apparatus 400, 500 has a controller 199 for controlling the movements of the one or more substrate handlers 1500 of the substrate transport apparatus 1599.

Still referring to FIG. 5, the transport chambers 118A, 118B in this case may be mated directly to a tool 300 (e.g., a stocker, photolithography cell, or other suitable processing tool) where the substrates are delivered to and removed from the tool 300 through chamber 118C.

Figure 7:
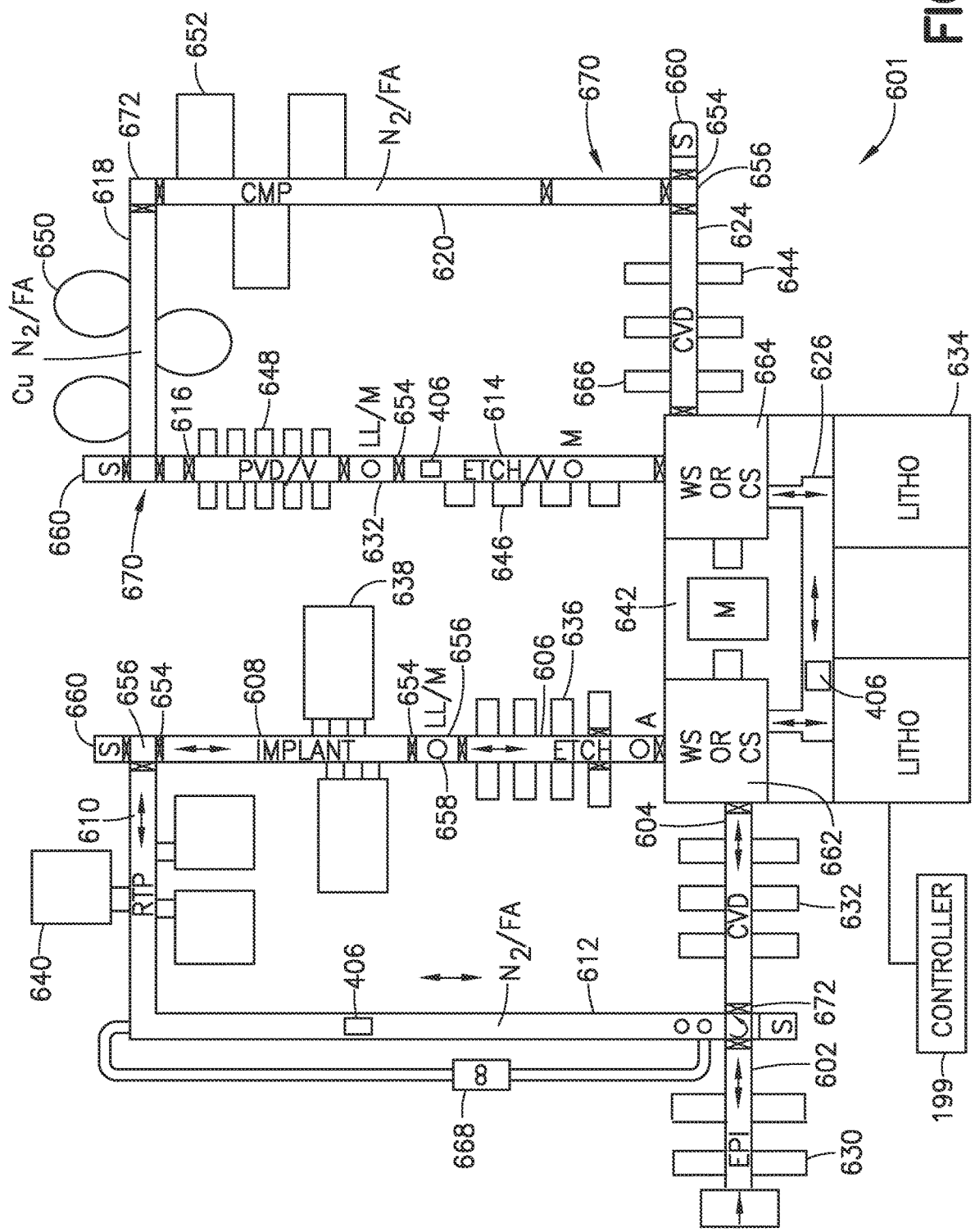
FIG. 7 is a schematic plan view of a substrate processing system incorporating aspects of the disclosed embodiment.

As may be realized from FIGS. 1B, 3 and 4-5 the transport chamber 118 may be extended as desired to run throughout the processing facility P (FIG. 5, and example of which is illustrated in FIG. 7). As seen in FIG. 5, and as will be described in further detail below, the transport chamber (generally referred to as transport chamber 118) may connect and communicate with various sections or bays 118P1-118P4 in the processing facility P such as for example storage, lithography tool, metal deposition tool or any other suitable tool bays. Bays interconnected by the transport chamber 118 may also be configured as process bays or processes 118P1, 118P3. Each bay has desired tools (e.g. lithography, metal deposition, heat soaking, cleaning) to accomplish a given fabrication process in the semiconductor workpiece. In either case, the transport chamber 118 has processing modules 120, corresponding to the various tools in the facility bays, communicably connected thereto, as previously described, to allow transfer of the semiconductor workpiece between chamber 118 and processing modules 120. Hence, the transport chamber 118 may contain different environmental conditions such as atmospheric, vacuum, ultra-high vacuum (e.g., $10^{-5}$ Torr), inert gas, or any other, throughout its length corresponding to the environments of the various processing modules connected to the transport chamber. Accordingly, the section 118P1 of the chamber in a given process or bay or within a portion of the bay, may have for example, one environmental condition (e.g. atmospheric), and another section 118P2, 118P3 of the chamber 118 may have a different environmental condition. As noted before, the section 118P1-118P4 of the chamber 118 with different environments therein may be in different bays of the facility, or may all be in one bay of the facility. FIG. 5 shows the chamber 118 having four sections 118P-118P4 with different environments for example purposes only. The chamber 118 in this aspect may have as many sections with as many different environments as desired.

As seen in FIG. 5, the substrate handlers 1500 in the transport chamber 118 are capable of transiting between sections 118P1-118P4 of the chamber 118 with different environments therein. Hence, as can be realized from FIG. 5, each of the substrate handlers 1500 may with one pick move a semiconductor workpiece from the tool in one process or bay of the processing facility to another tool with a different environment in a different process or bay of the process facility. For example, substrate handler 1500A may pick a substrate in processing module 301, which may be an atmospheric module, lithography, etching or any other desired processing module in section 118P1, of transport chamber 118. The substrate handler 1500A may then move along drive line 177 (or a drive line substantially parallel thereto where more than one longitudinal drive line are provided) from section 118P1 of the chamber 118 to section 118P3 (e.g., where the other substrate handlers 1500 are controller to avoid interference with substrate handler 1500A in any suitable manner). In section 118P3, the substrate handler 1500A may place the substrate in processing module 302, which may be any desired processing module.

As can be realized from FIG. 5, the transport chamber 118 may be modular, with chamber modules connected as desired to form the chamber 118 (e.g., formed by the three chamber sections 118A, 118B, 118C, where each chamber section 118A, 118B, 118C may also include one or more chamber modules that are coupled to each other in any suitable manner). Referring also to FIG. 1A, the modules may include internal walls 118I, similar to walls 118F, 118R in FIG. 1A, to segregate sections 118P1-118P4 of the chamber 118. Internal walls 181 may include slot valves, or any other suitable valve allowing one section of the chamber 118P1-118P4 to communicate with one or more adjoining sections. The slot valves 118V, may be sized to allow, one or more substrate handlers 1500 to transit through the valves 18V from one section 118P1-118P4 to another. In this way, the substrate handlers 1500 may move anywhere throughout the chamber 118. The valves 118V may be closed to isolate sections 118P1-1184 of the chamber 118 so that the different sections may contain disparate environments as described before. Further, the internal walls 118I of the chamber modules may be located to form load locks (see section 118P4) as shown in FIG. 5. The load locks 118P4 (only one is shown in FIG. 5 for example purposes) may be located in chamber 118 as desired and may hold any desired number of substrate handlers 1500 therein.

In the aspect shown in FIG. 5, processes within chamber sections 118A and 118B may be the same processes, for example etch, where the processing apparatus 500 including tool 300 (such as a stocker) are capable of processing substrates without any associated material handling overhead associated with transporting FOUPS from the stocker to individual process modules 120 via an automated material handling system, and transporting individual wafers via EFEM's to the respective processing modules 120. Instead, a robot within the stocker directly transfers FOUPS 171 to the load ports (three load ports are shown per chamber section, more or less could be provided depending on throughput requirements) where the wafers are batch moved into locks and dispatched to their respective process module(s) depending on the desired process and/or throughput required. The chamber sections 118A, 118B or the stocker 300 may further have metrology capability, sorting capability, material identification capability, test capability, inspection capability, etc. as required to effectively process and test substrates.

Figure 38:
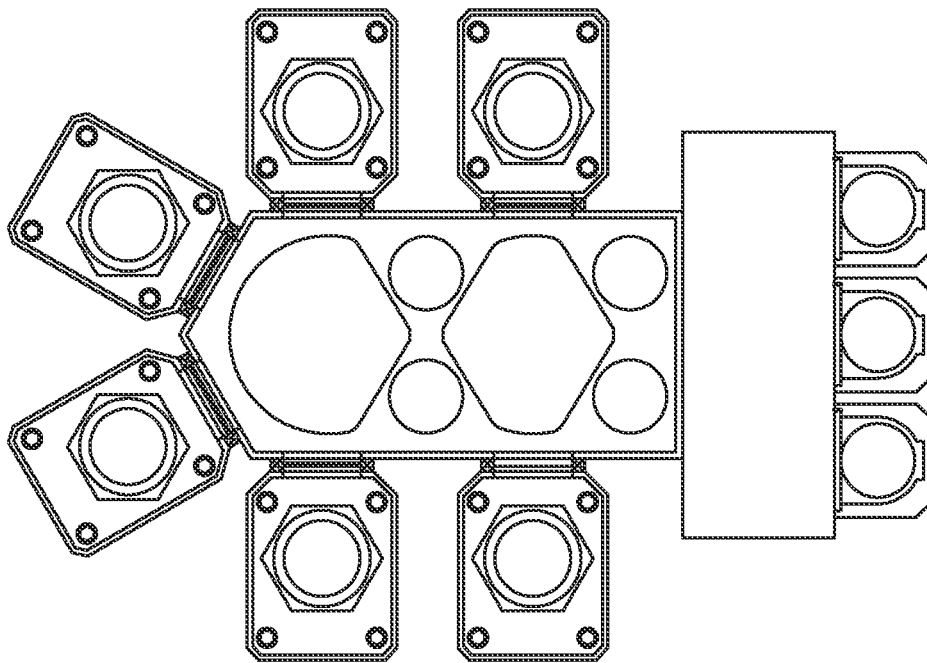
FIG. 38 is a schematic plan view of conventional substrate processing apparatus.
Figure 37:
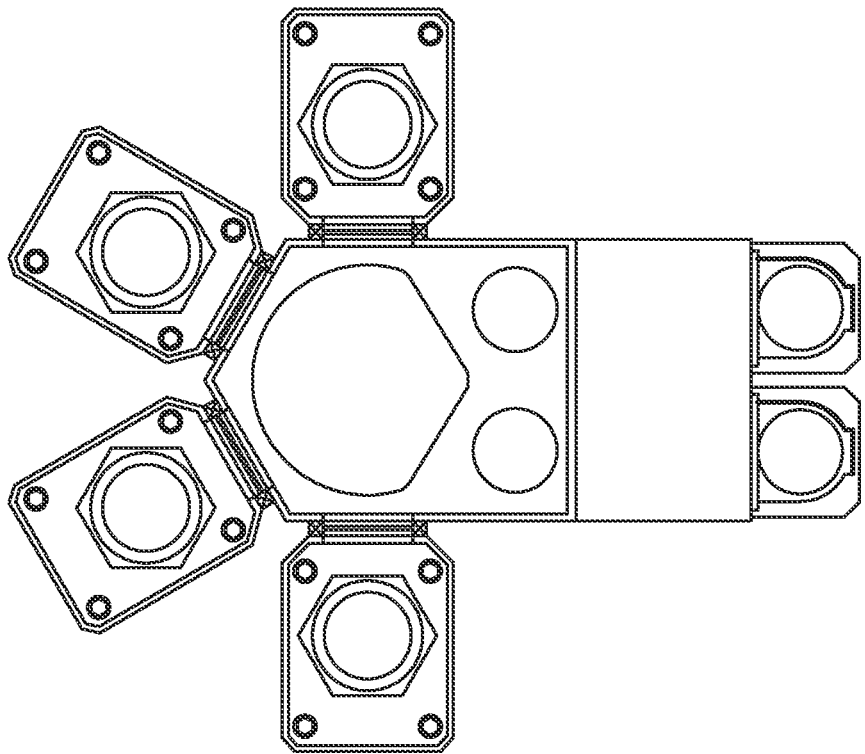
FIG. 37 is a schematic plan view of a conventional substrate processing apparatus.

In the aspect of the disclosed embodiment shown in FIG. 5, more or less chamber sections 118A and 118B may be provided that have different processes, for example etch, CMP, copper deposition, PVD, CVD, etc. where the chamber sections 118A, 118B, etc. in combination with the tool 300 being, for example a photolithography cell are capable of processing substrates without the associated material handling overhead associated with transporting FOUPs from stockers to individual process tool bays and a lithography bay via an automated material handling system, and transporting individual wafers via EFEM's to the respective processing tools. Instead, the automation within the lithography cell directly transfers FOUPS, substrates or material to the load ports 112 (again three load ports are shown per chamber section/process type, noting more or less could be provided depending on throughput requirements) where the substrates are dispatched to their respective process depending on the desired process and/or throughput required. An example of such an alternative is shown in FIG. 7. In this manner, the apparatus in FIG. 5 processes substrates with less cost, lower footprint, less WIP required (compared to the conventional processing systems described herein)— therefor with less inventory and with a quicker turnaround when looking at the time to process a single carrier lot (or "hot lot"), and with a higher degree of contamination control resulting in significant advantages for the fabrication facility operator. The chamber sections 118A, 118B (each of which may be referred to as a tool or tool section) or the tool or cell 300 may further have metrology capability, processing capability, sorting capability, material identification capability, test capability, inspection capability, etc. as required to effectively process and test substrates. As can be realized from FIG. 5, the chamber sections 118A, 118B, and tool 300 may be coupled to share a common controller environment (e.g. inert atmosphere, or vacuum). This ensures that substrates remain in a controlled environment from tool 300 and throughout the substrate processing apparatus 500. This eliminates use of special environment controls of the FOUPs as in conventional substrate processing apparatus such as those shown in FIGS. 37 and 38.

Referring now to FIG. 7, there is shown an exemplary fabrication facility layout 601 incorporating aspects of the disclosed embodiment that are shown in FIG. 5. Wafer handlers 406, similar to wafer handlers 1500 transport substrates or wafers through process steps within the fabrication facility 601 through transport chambers 602, 604, 606, 608, 610, 612, 614, 616, 618, 620, 624, 626. Process steps may include epitaxial silicon 630, dielectric deposition 632, photolithography 634, etching 636, ion implantation 638, rapid thermal processing 640, metrology 642, dielectric deposition 644, etching 646, metal deposition 648, electroplating 650, chemical mechanical polishing 652. In other aspects, more or less processes may be involved or mixed; such as etch, metal deposition, heating and cooling operations in the same sequence. As noted before, wafer handlers 406 may be capable of carrying a single wafer or multiple wafers and may have transfer capability, such as in the case where wafer handler 406 has the capability to pick a processed wafer and place an unprocessed wafer at the same module. Wafer handlers 406 may travel through isolation valves 654 for direct tool to tool or bay to bay transfer or process to process transfer. Valves 654 may be sealed valves or simply conductance type valves depending upon the pressure differential or gas species difference on either side of a given valve 654. In this manner, wafers or substrates may be transferred from one process step to the next with a single handling step or "one touch". As a result, contamination due to handling is minimized. Examples of such pressure or species difference could be for example, clean air on one side and nitrogen on the other; or roughing pressure vacuum levels on one side and high vacuum on the other; or vacuum on one side and nitrogen on the other. Load locks 656, similar to chambers 118P4 in FIG. 5, may be used to transition between one environment and another; for example between vacuum and nitrogen or argon. In other aspects, other pressures or species may be provided in any number of combinations. Load locks 656 may be capable of transitioning a single wafer handler or multiple wafer handlers in a manner substantially similar to that described herein where a single drive line or multiple substantially parallel and/or orthogonal drive lines are provided. Alternately, substrate(s) may be transferred into load lock 656 on shelves (not shown) or otherwise where the wafer handler 406 is not desired to pass through the valve. Additional features 658 such as alignment modules, metrology modules, cleaning modules, process modules (ex: etch, deposition, polish, etc.), thermal conditioning modules or otherwise, may be incorporated in lock 656 or the transport chambers. Service ports 660 may be provided to remove wafer handlers 406 or wafers from the tool. Wafer or carrier stockers 662, 664 may be provided to store and buffer process and or test wafers. In other aspects, stockers 662, 664 may not be provided, such as where carts are directed to lithography tools directly. Another example is where indexer or wafer storage module 666 is provided on the tool set. Recirculation unit 668 may be provided to circulate and or filter air or the gas species in any given section such as tool section 612. Recirculation unit 668 may have a gas purge, particle filters, chemical filters, temperature control, humidity control or other features to condition the gas species being processed. In a given tool section more or less circulation and or filter or conditioning units may be provided. Isolation stages 670 may be provided to isolate wafer handlers 406 and/or wafers from different processes or tool sections that cannot be cross contaminated. Locks or interconnects 672 may be provided to change wafer handler 406 orientation or direction in the event the wafer handler 406 may pick or place within a generic workspace without an orientation change. In other aspects or methods any suitable combination of process sequences or make up could be provided.

Figure 6:
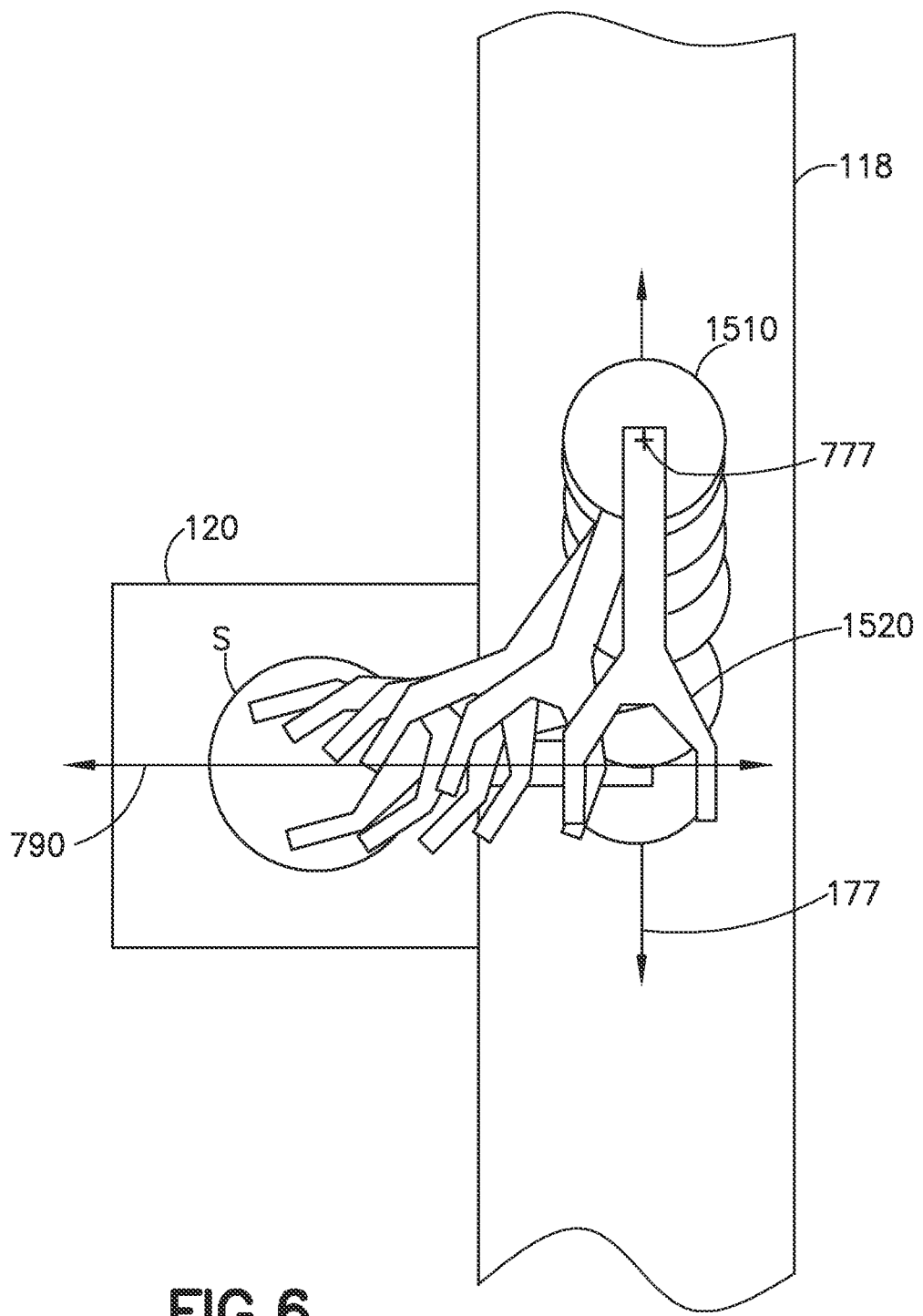
FIG. 6 is an exemplary substrate handler motion of the substrate processing apparatus described herein in accordance with aspects of the disclosed embodiment.

Referring now to FIG. 6, the controller 199 controls the propulsion forces, generated by the array of electromagnets 1700, across the base 1510 so as to impart a controlled yaw moment on the base, yawing the base 1510 about a yaw axis (e.g., axis of rotation 777), substantially normal to the drive plane 1598, from a first predetermined orientation relative to the frame of the chamber 118 (such as where the end effector 1520 is substantially aligned with drive line 177), to a second different predetermined orientation relative to the frame of the chamber 118 (such as where the end effector is extended into process module 120). As may be realized yawing of the base 1510 may be performed in conjunction with propulsion motion of the base 1510 (such as where a single drive line is provided in the chamber 118) or with the base at a predetermined location (such as where the base 1510 is rotation while remaining substantially stationary along the X and Y axes). In one aspect, referring also for FIG. 15C, the controller 199 controls the propulsion forces (e.g., $Fx_{right}$, $Fx_{left}$), generated by the array of electromagnets 1700, so as to impart a moment couple (illustrated in FIG. 15C with movement of the substrate handler 1500 along the X axis) on the base 1510 effecting controlled yaw of the base 1510 so as to effect at least one of positioning and centering of a substrate (also referred to as a wafer payload or payload) on the base 1510 relative to a predetermined substrate holding location (such as a load lock, process module, etc.) of the frame of the chamber 118. As may be realized, pitch (rotation about Y axis) and roll (rotation about X axis) (see FIGS. 15A and 15B) control may be effected with the controller 199 (controlling lift forces Fz across the reaction platen) simultaneously with yaw motion countering dynamic moment coupling and maintaining substantially flat yaw of the wafer holder/reaction platen in the wafer transfer plane.

Where a single drive line 177 is provided in each transport chamber (as illustrated in FIGS. 1A, 1B, 2, 4, and 5) or where access to a process module, such as process module 120A (see FIG. 8) from a drive line 178 closest to the process module 120A (such as when multiple substantially parallel longitudinal drive lines 177, 178 are provided—see FIG. 8), the controller 199 is configured to drive the base 1510 simultaneously in two or more of yaw, pitch, roll, and in propulsion (as described herein) to pick and place substrates from any suitable substrate holding stations (e.g. load locks 116, process modules 120, etc.). For example, the controller 199 is configured to energize the actuators 1700 as described herein so that the base moves along the drive line 177 and rotates about a base rotation axis 777 so that a substrate seating surface 1520A of the substrate handler 1520 enters a process module 120 or other suitable holding station where the substrate S travels along a substantially straight line path 790 in a predetermined wafer/substrate transfer plane. Referring to FIGS. 8-11, in other aspects, where multiple longitudinal drive lines 177, 178 are provided in the transport chamber 118 the base 1510 may be rotated so that the substrate handler 1520 is aligned with a desired/predetermined substrate holding station prior to entrance into the substrate holding station. For example, the base 1510 may be positioned at an intersection between drive lines 178 and 179A, where drive line 179 provides for extension and retraction of the substrate handler into substrate holding station 120BH of process module 120B (e.g., in a propulsion direction substantially orthogonal (or any suitable angle that enables access to the process module) to the propulsion direction along drive lines 177, 178). The base 1510 may be rotated about rotation axis 777 so that the substrate handler 1520 is aligned with the substrate holding station 120BH and the base may be moved along drive line 179A to move or extend the substrate handler 1520 into the substrate holding station 120BH for picking/placing a substrate(s).

Figure 14A:
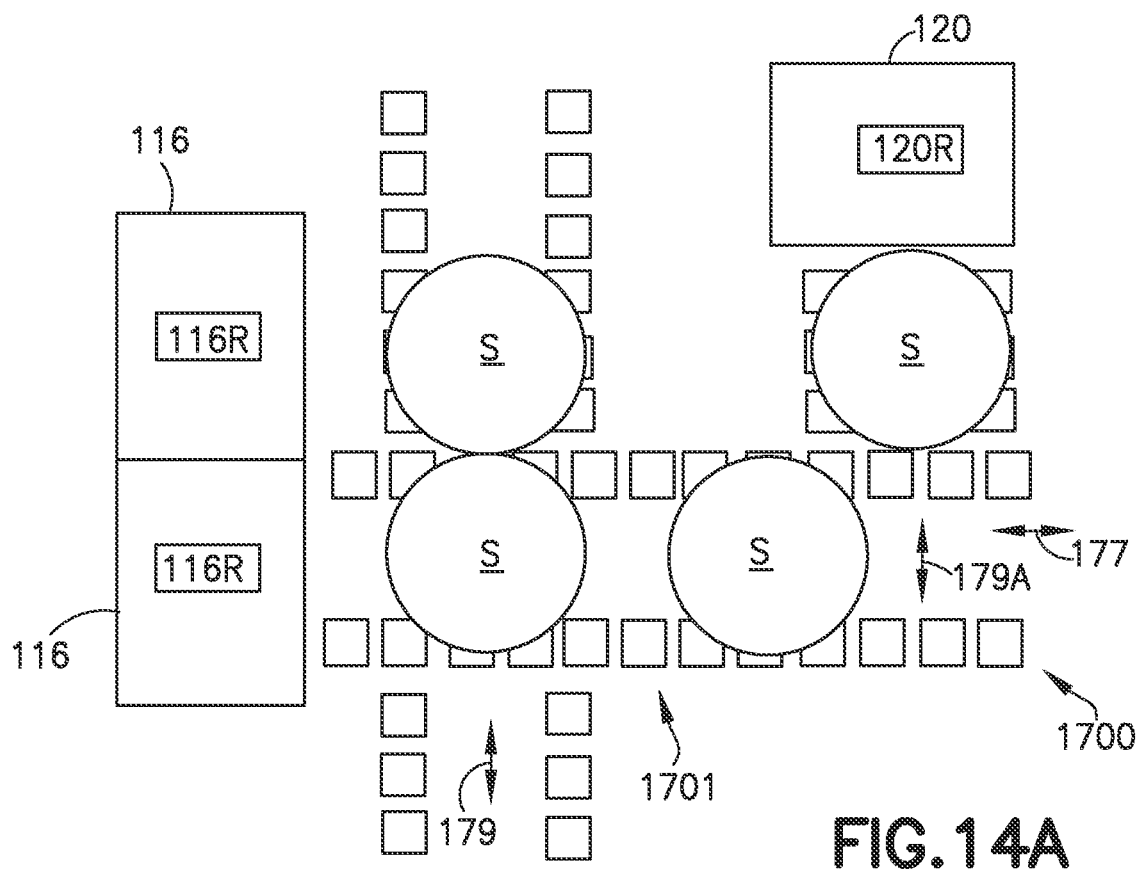
FIG. 14A is a schematic plan view of a portion of the substrate processing apparatus of FIG. 14 in accordance with aspects of the disclosed embodiment.
Figures 14B, 14C:
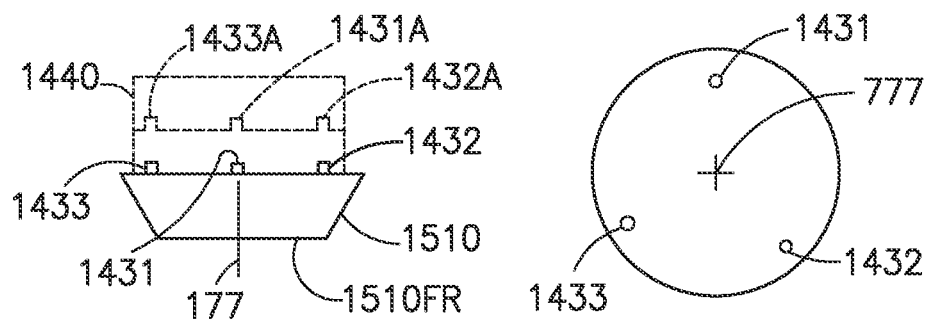
FIG. 14B is a schematic elevation view of a substrate transport cart in accordance with aspects of the disclosed embodiment.
FIG. 14C is a schematic plan view of the substrate transport car in FIG. 14B in accordance with aspects of the disclosed embodiment.

Referring to FIGS. 14 and 14A-14C, while the substrate handler 1500 has been described as including an end effector 1520, in other aspects one or more substrate handlers may be configured as a cart 1500C that is configured to support one or more substrates on the base 1510. For example, the base 1510 may include one or more substrate supports 1431-1433 configured to stably hold a substrate (e.g., from the bottom or edge grip) so that substrate handlers 1500, 1500A, 1500B or substrate transports within, e.g., a load or other substrate holding station, may transport substrate(s) to and from the substrate supports 1431-1433. In one aspect, the substrate supports 1431-1433 may be configured to substantially center one or more substrates on the base 1510 (i.e., the supports are self-centering supports, that are either passive supports or may be actuated (e.g., piezo-electric) from a suitable power source energized on the reaction platen) so that a center of the substrate(s) is substantially coincident with the axis of rotation 777 of the base. In some aspects, one or more of the carts 1500C may include a substrate support rack 1440 for holding two or more substrates in a stack, where each rack level includes respective substrate supports 1431-1433, 1431A-1433A. Referring to FIGS. 14 and 14A, the carts 1500C may provide an interface between the substrate handlers 1500A, 1500B and the load locks 116 where a transport apparatus 116R (such as a SCARA arm, linear sliding arm, etc.) of the load lock transfers substrate(s) to the cart 1500C and the substrate handlers 1500A, 1500B pick the substrates from the cart and vice versa. In other aspects, where the process module 120 includes a transport apparatus 120R (such as a SCARA arm, linear sliding arm, etc.) the carts 1500C may be employed to transfer substrate(s) to and from the process module 120. While the base 1510 of the carts 1500C (and of the substrate handlers 1500, 1500A, 1500B) are illustrated as having a circular shape when viewed from the top (see FIG. 14C) in other aspects, the base 1510 may have any suitable shape (e.g., square, rectangular, circular, etc. when viewed from the top) that otherwise interfaces with the array of electromagnets 1700 for effecting one or more of linear propulsion, lift, yaw, pitch, roll, and rotation control of the base 1510.

Referring to FIGS. 12A, 12B, 13A, 13B, while the transport chamber 118 has been described above as a longitudinally extended chamber that forms part of a linear processing tool, in other aspects, the transport chamber may have a cluster tool configuration. For example, referring to FIGS. 12A and 12B the transfer chamber 118T1 has a substantially square configuration (although in other aspects the transfer chamber may have any suitable shape such as hexagonal, octagonal, etc.). In this aspect an electrical machine 1599R (substantially similar to the linear electrical machine 1599) is configured as a side-by-side transport apparatus that includes at least two side-by-side substrate handlers 1500A, 1500B that are substantially similar to substrate handler 1500 described herein. The array of electromagnets 1700 in this aspect is configured to move the substrate handlers 1500A, 1500B so that the substrate handlers 1500A, 1500B rotate about common axis of rotation 1277 (such axis being akin to a θ axis of, for example, a conventional SCARA type robot) for changing a direction of "extension and retraction" (the terms extension and retraction are being used herein for convenience noting that the extension and retraction is effected by linear propulsion movement of the substrate handler 1500, 1500A, 1500B along a respective drive line) of the side-by-side transport apparatus. For example, the array of electromagnets 1700 has an arrangement that forms drive lines 177, 178, 179, 180. Here drive lines 177, 178 are spaced from one another and substantially parallel to one other so as to be substantially aligned with a respective transport openings 1180A, 1180F and 1180B, 1180E. The drive lines 179, 180 are substantially orthogonal to drive lines 177, 178 and are spaced from one another and substantially parallel to one other so as to be substantially aligned with a respective transport openings 1180C, 1180H and 1180D, 1180G. The drive lines can be in any suitable pattern (such as arced or curved segments with constant or varying radii) and orientation and the description that follows is for exemplary purposes. The electromagnets 1700A-1700N (illustrated in FIG. 12A but not numbered for clarity of the figure) provide for at least linear propulsion of the substrate handlers 1500A, 1500B through the transport openings 1180A-1180H. In this aspect, the array of electromagnets 1700 also includes rotational electromagnet sub-arrays 1231-1234 that effect, under control of controller 199, with the electromagnets that form the drive lines 177-180 the rotation of the substrate handlers 1500A, 1500B about the common axis of rotation 1277. Alternatively, the electromagnets may form a dense enough and large enough grid without being specifically designated for propulsion or rotation and can perform that function based on the base's 1510 position and the control law of the controller 199. As may be realized, while the substrate handlers 1500A, 1500B may rotate about the common axis of rotation 1277 at the same time, extension and retraction of the substrate handler 1500A, 1500B may be independent of extension and retraction of the other one of the substrate handler 1500A, 1500B. In general, the motion of the substrate handler 1500A, 1500B is independent of each other and the complexity of that motion can range from one degree of freedom to six degrees of freedom.

Figure 12A:
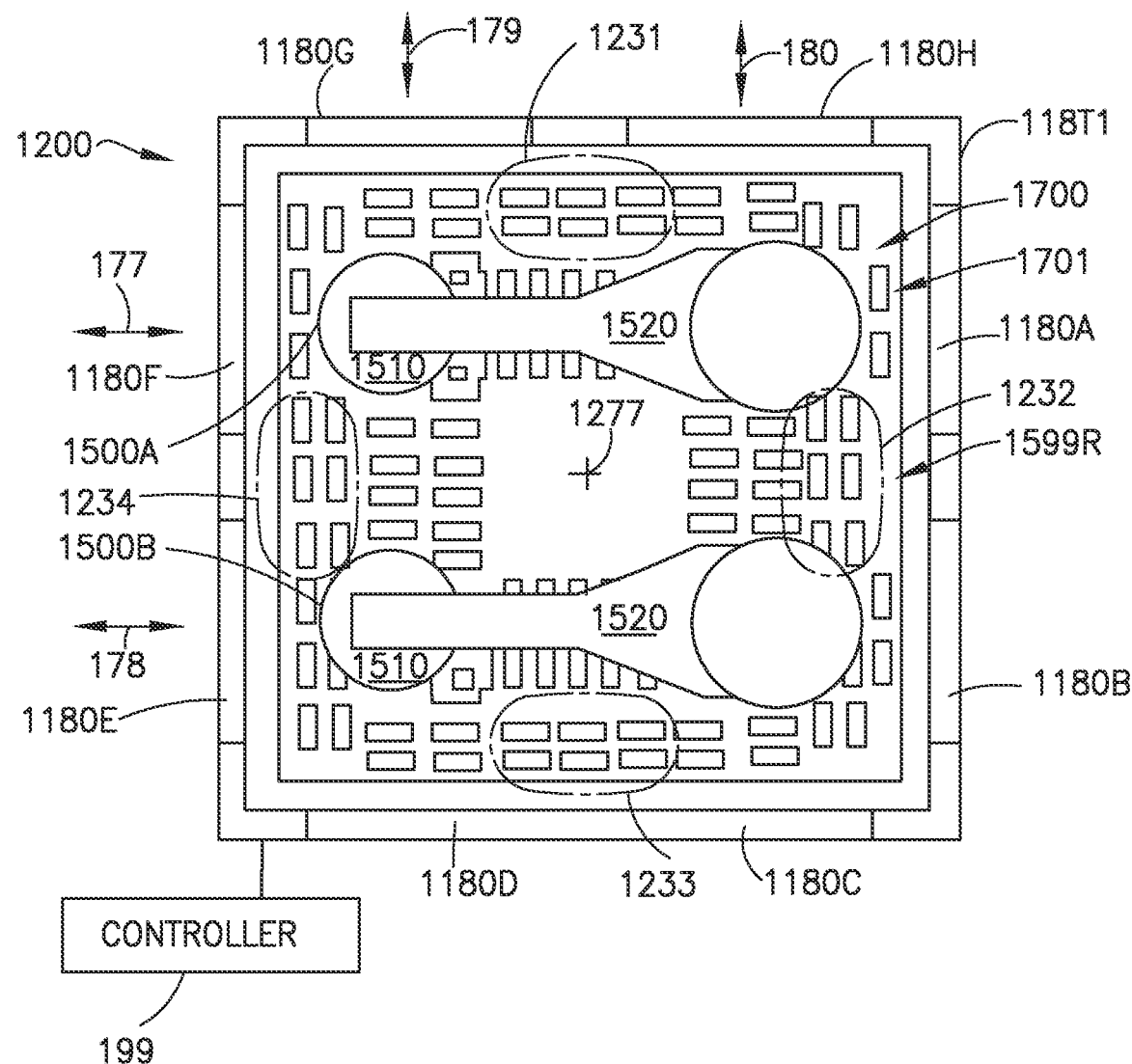
FIG. 12A is a schematic plan view of a substrate processing apparatus incorporating aspects of the disclosed embodiment.

Referring to FIG. 12B, in one aspect, the electrical machine 1599R includes multiple transport levels 1220A, 1220B that are stacked one above the other. In this aspect, each level 1220A, 1220B is formed by a respective level support 1221 each having a respective reference plane 1299R that is substantially parallel with the level reference plane 1299 of the transport chamber 118T1 frame. Each level support 1221 includes an array of electromagnets 1700 substantially similar to that illustrated in FIG. 12A for linearly driving the side-by-side substrate handlers 1500A, 1500B along drive lines 177-180 and rotating the side by side substrate handlers 1500A, 1500B (e.g., with full six degree of freedom control) about the common axis of rotation 1277. Each level support 1221 is coupled to a common Z axis drive 1211 that moves the level supports 1221 and the substrate handlers 1500A, 1500B thereon in the Z direction so as to align the end effectors 1520 of the substrate handlers 1500A, 1500B on the respective level supports 1221 with a substrate transport plane 1290 of the transport openings 1180 of the transport chamber 118T1.

The Z axis drive 1211 may be any suitable linear actuator such as a screw drive, electromagnetic drive, pneumatic drive, hydraulic drive, etc.

Figure 13A:
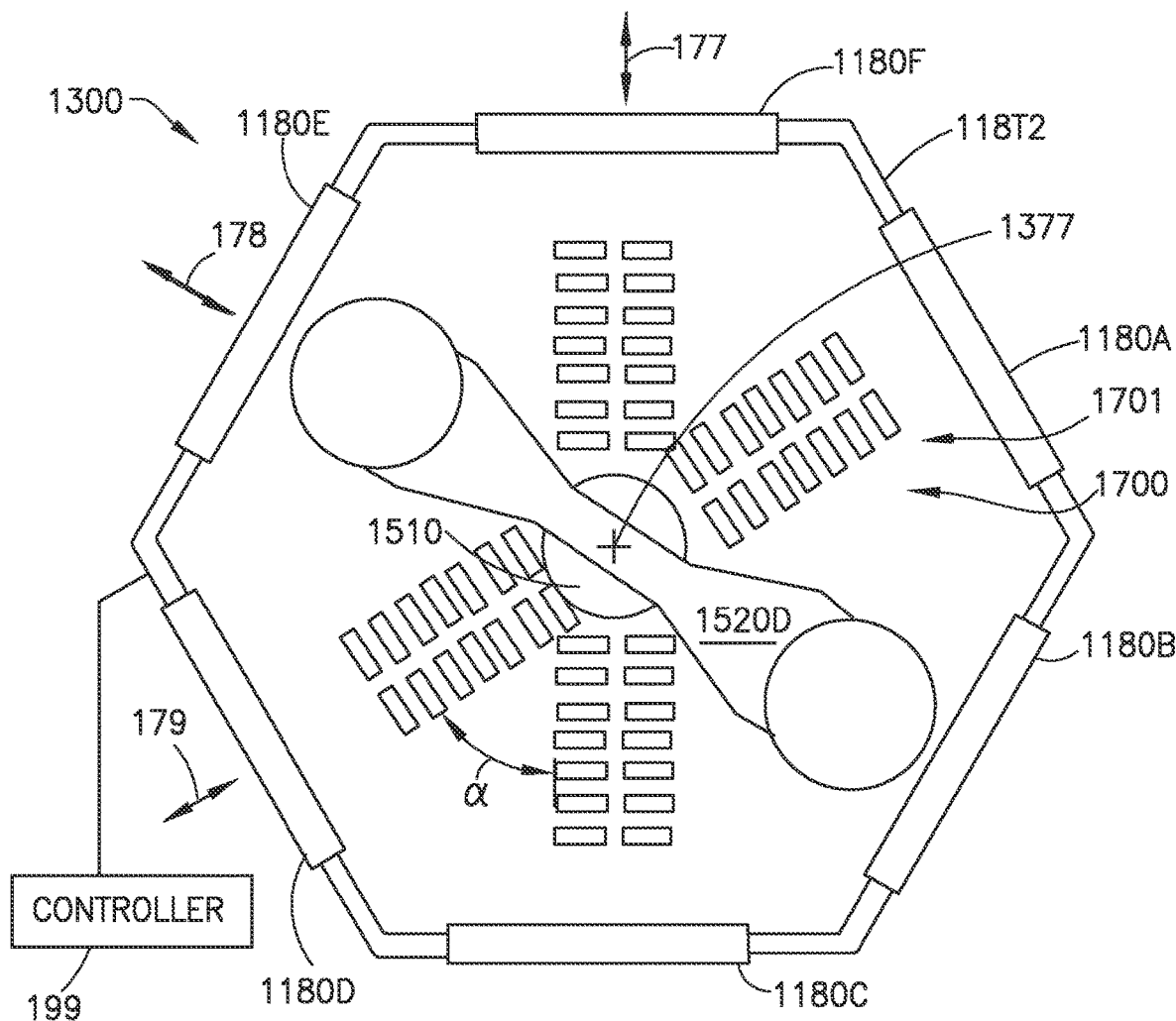
FIG. 13A is a schematic plan view of a substrate processing apparatus incorporating aspects of the disclosed embodiment.

In another aspect referring to FIGS. 13A and 13B the transfer chamber 118T2 has a substantially hexagonal configuration (although in other aspects the transfer chamber may have any suitable shape as noted herein). In this aspect the electrical machine 1599R (substantially similar to the linear electrical machine 1599 of FIG. 15C) is configured as a radial transport apparatus that includes a substrate handler 1500 having a double ended/sided end effector 1520D, as will be described herein (although in other aspects a single ended/sided end effector may be employed). The array of electromagnets 1700 in this aspect is configured to rotate the substrate handler 1500 about axis of rotation 1377 (such axis being akin to a θ axis of, for example, a conventional SCARA type robot) for changing a direction of "extension and retraction" (the terms extension and retraction are being used herein for convenience noting that the extension and retraction is effected by linear propulsion movement of the substrate handler 1500 along a respective drive line), and linearly propel the substrate handler 1500 so as to extend through the transport openings 1180A-1180F. For example, the array of electromagnets 1700 has an arrangement that forms radially offset drive lines 177, 178, 179, where an angle α between adjacent drive lines depends on the number of sides/facets of the transport chamber 118T2 on which the transport openings 1180A-1180F are located. The electromagnets 1700A-1700N (illustrated in FIG. 12A but not numbered for clarity of the figure) provide for at least linear propulsion of the substrate handler 1500 through the transport openings 1180A-1180H and rotation of the substrate handler 1500 about axis of rotation 1377 with full six degree of freedom control so as to maintain linear transport and rotation in a desired attitude in pitch and roll.

Referring to FIG. 13B, in one aspect, the electrical machine 1599R includes multiple transport levels 1320A, 1320B that are stacked one above the other in a manner substantially similar to that described above with respect to FIG. 12B. For example, each level 1320A, 1320B is formed by a respective level support 1321 each having a respective reference plane 1299R that is substantially parallel with the level reference plane 1299 of the transport chamber 118T1 frame. Each level support 1321 includes an array of electromagnets 1700 substantially similar to that illustrated in FIG. 13A for linearly driving (along drive lines 177-179) and rotating (about axis 1377) the substrate handler 1500. Each level support 1321 is coupled to a common Z axis drive 1311 (that is substantially similar to Z-axis drive 1211) that moves the level supports 1321 and the substrate handler 1500 thereon in the Z direction so as to align each of the end effector 1520D of the substrate hander 1500 on the respective level supports 1321 with a substrate transport plane 1390 of the transport openings 1180 of the transport chamber 118T2.

Referring to FIGS. 12B and 13B, the vertical motion provided by the Z actuator 1211 can be used for enabling the wafer handler 1220A or 1220B to perform wafer handoff operations such as pick or place to/from a wafer process station. The supports 1221, 1321 can include a single module (level) with the purpose of providing additional elevation capability to the wafer handler 1220A, 1220B to achieve larger vertical strokes during the wafer handoff operations. For example, in the case of process modules or load locks that have more than one stacked wafer slot, it would be advantageous to have a vertical lift apparatus such as Z-axis actuator 1211, 1311 to be able to reach each of the stacked wafer slots without increase of applied levitation power provided by the electrical machine 1599R.

Referring to FIGS. 12A and 12B, the vertical lift apparatus (or Z-axis actuator) 1211 and level 1221, in another aspect, has dual (or more) separate and independently operable apparatus, e.g., one for each wafer handler 1520. This would give the ability to perform independent vertical strokes for different wafer handlers that can access different slots on at least two independent stations (e.g., process modules, load locks, etc.).

Referring now to FIGS. 15A, 15B, 15C, 16A, 16B, 16C the linear electrical machine 1599 will be described in greater detail (again noting that the electrical machine 1599R is substantially similar to the linear electrical machine 1599). Generally, the linear electrical machine 1599 includes a structure 1500 without magnets and any, moving parts such as bearings, revolute or prismatic joints, metal bands, pulleys, steel cables or belts. As noted above, the base 1510 is formed of a paramagnetic material, diamagnetic material, or a non-magnetic conductive materal. The base 1510 may have any suitable shape and size for cooperating with the electromagnets 1700A-1700n of the array of electromagnets 1700 so as to stably transport substrates S in the manner (s) described herein, one aspect, as illustrated in FIGS. 9 and 11-160 the base 1510 is shown with a frusto-conical shape where the tapered side 1510TS of the frustum 1510FR face the array of electromagnets 1700 (although other suitable shapes are operative). Here the tapered side 1510TS of the frusto-conical shape have an angle λ (see FIG. 15B) that is between about 50° and about 60° relative to the planar surfaces of the frustum 1510FR; while in other aspects the angle λ may be greater than about 60° or less than about 50°. In other aspects, the base may have a frusto-pyramidal shape as shown in FIGS. 8, 8A, and 10. Here each side 1510TSP of the frustum 1510FRP have an angle λ (see FIG. 8B) that is between about 50° and about 60° relative to the planar surfaces of the frustum 1510FRP; while in other aspects the angle λ may be greater than about 60' or less than about 50°. While the frusta-pyramidal shape is illustrated as having four sides, in other aspects the frusto-pyramidal shape may have any suitable number of sides, such as, for example, six or eight sides or may be round or have curved sides. In other aspects, the base 1510 may not have a frusto-conical or frusta-pyramidal shape and it may comprise of a planar shape with suitable and asymmetric contour and size in order to be properly controlled by electromagnets 1700.

The end-effector 1520, 1520D may be substantially similar to conventional end effectors; however, as described herein the end effector is rigidly coupled to the base 1510. As an example, the end effector may be a single sided/ended (see end effector 1520) with a single substrate holding location 1520A, a double sided; ended (see end effector 1520D) with two longitudinally spaced apart substrate holding locations 1520A, 1520B, a side-by-side configuration where multiple substrate holding locations are arranged side-by-side (e.g., laterally spaced apart) and supported from a common base so as to extend through side-by-side substrate transport openings, a stacked configuration were multiple substrate holding locations are arranged in a stack one above the other and supported from a common base so as to extend through vertically arrayed substrate transport openings, while in other aspects the end effector may have any suitable configuration. The end effector 1520, 1520D may be made of materials that can one or more of withstand high temperatures, have low mass density, have low thermal expansion, have low thermal conductivity and have low outgassing. A suitable material from which the end effector 1520, 1520D may be constructed is Alumina Oxide ($Al_2O_3$), although any suitable material may be used.

In one aspect, the end-effector 1520, 1520D is coupled to the base 1510 with a substantially rigid and unarticulated stanchion 1510S so as to set the end-effector 1520, 1520D at a suitable nominal height H2 relative to, for example, level reference plane 1299. The substrate handler 1500, as described herein, is moved in space (in at least three degrees of freedom) using electrodynamic levitation principles. The actuation elements (e.g., actuators 1700), as shown in FIGS. 15A-15C, 16B, and 16C include independently controlled coils or electromagnetics 1700A-1700n (a so referred to herein as coil segments) that generate desired magnetic field that induces thrust and lift force vectors the base 1510.

In some aspects, referring to FIGS. 10, 10A, 11, and 11A, multiple substrate handlers may be nested with respect to each other so as to travel linearly along the drive lines 177-180 as a single unit with the end effectors 1520 of the nested substrate handler disposed in a stack one above the other. For example, referring to FIGS. 10 and 10A the nested bases 1510FP (may be symmetrical as a body of revolution, revolute symmetry e.g., frusto-conical, or bi-symmetrical, e.g., frusto-pyramidal, or a channel shaped cross section of which are illustrated in FIG. 10A) are configured so that one base 1510FP may be inserted into another base 1510FP so as to stack the bases 1510FP in manner similar to that of stacking cups one inside the other. The bases 1510FP may be configured so that when stacked the vertical space between end effectors 1520 (e.g., when the end effectors 1520 are substantially level with the level reference plane 1299) is substantially the same as a vertical space between stacked substrate holding stations so as to provide for simultaneous picking and placing of substrates by the stacked end effectors 1520. The stacking of the bases 1510FP provides, in one aspect, depending on the levitation forces generated by the array of electromagnets 1700, independent vertical or Z-axis movement of at least one of the bases 1510FP (and the respective substrate handler 1500A, 1500B the base is part of). In this example, the uppermost substrate handler 1500B may be moved in the Z-axis independent of the lowermost substrate handler 1500A; however, when the uppermost substrate handler 1500B is lifted away from the lowermost substrate handler 1500A, the lowermost substrate handler 1500A may also be moved in the Z-axis direction independent of the uppermost substrate handler 1500B. Here, bi-symmetrical bases are interlocked and rotation of the substrate handlers 1500A, 1500B is linked by virtue of the shape of the bases 1510FP so that the substrate handlers 1500A, 1500B rotate in unison. The stackable configuration of the bases 1510FP provides the stacking of any suitable number of substrate handlers one above the other (in this example two are shown stacked one above the other but in other aspects more than two substrate handlers may be stacked one above the other).

Referring to FIGS. 11 and 11A, the revolute symmetry bases 1510FC may be stacked one above the other, moved in the propulsion direction, and moved relative to each other along the Z-axis in a manner substantially similar to that described above with respect to the frusto-pyramidal bases 1510FP. However, in this aspect, the revolute symmetry shape of the bases 1510FC does not interlock and provides for independent rotation of each substrate handler 1500A, 1500B about substrate handler axis of rotation relative to another of the substrate handlers 1500A, 1500B. Independent rotation of the frusto-conical based substrate handlers 1500A, 1500B effects a fast swapping of substrates from a single substrate holding station such as where end effector 1520 of substrate handler 1500A is aligned with substrate holding station 120BH for picking substrate S1, where end effector 1520 of substrate handler 1500B is rotated to a position so as to not extend into the substrate holding station 120BH. Once the substrate S1 is removed from substrate holding station 120BH by substrate handler 1500A, the positions of the end effectors 1520 of the substrate handlers may be swapped so that end effector 1520 of substrate handler 1500B is aligned with the substrate holding station 120BH for placing substrate S2 at the substrate holding station 120BH while end effector 1520 of substrate handler 1500A is rotated to a position so as to not enter the substrate holding station 120BH. As may be realized, the substrate handlers 1500A, 1500B may be moved along the Z-axis to accommodate the stacked heights of the end effectors relative to a height of the substrate holding station 120BH. Though symmetrical (revolute about one or more axis) bases have been illustrated, in other aspects one or more bases may be asymmetrical or lacking any axis of symmetry.

As described herein linear propulsion is generally provided by two parallel linear tracks 1550 (may be a single track) of independently controlled electromagnets 1700A-1700n. The number of electromagnets 1700A-1700n are spaced apart from one another depending on dimensions of the base 1510 so as to control all six degrees of freedom (roll, pitch, yaw, and translation in each of the X, Y, Z directions) of the substrate handler in space. For example, as illustrated in FIG. 15B, the electromagnets 1700A-1700n may be spaced apart from each other so that two or more electromagnets 1700A-1700n (cooperating so as to form a motor actuator (primary) 1701 and in combination with the base (secondary) 1510 the motor) of each parallel linear track 1550 are disposed underneath the base 1510 at all times in the direction of motion of the base so as to stably levitate and propel the base 1510 (as may be realized, FIGS. 15A, 15B schematically illustrate a representative configuration of the system, and are provided to show generally an exemplary representation of the interrelationship between the base 1510 and the electromagnets 1700A-1700n, and is not intended as limiting in any way. The size, numbers, and spacing (e.g., pitch) of the electromagnets 1700A-1700n in both the X and Y axes may vary, as may the size and shape of the base 1510 in relation to the electromagnets 1700A-1700n. In one aspect, as illustrated in. FIG. 8, the array of electromagnets 1700 may also include stabilization tracks 15505 disposed laterally outward of the tracks 1550. The stabilization tracks may be substantially similar to the tracks 1550 and are configured to provide additional stabilization of the base 1510 through the generation of additional lift and/or propulsion forces (e.g., in addition to the lift and propulsion forces generated by electromagnets of the parallel linear tracks 1550) that act on the base 1510. The result is a substrate handler 1500 that can move along a direction of the tracks 1550 (i.e., the propulsion direction) while changing orientation in one or more of roll, pitch and yaw. According to magnetic induction principles where the electromagnets 1700A-1700n are akin to the "primary" and the base 1510 corresponds to the "secondary" where electrical currents are induced by means of Eddy current effects.

Figure 17:
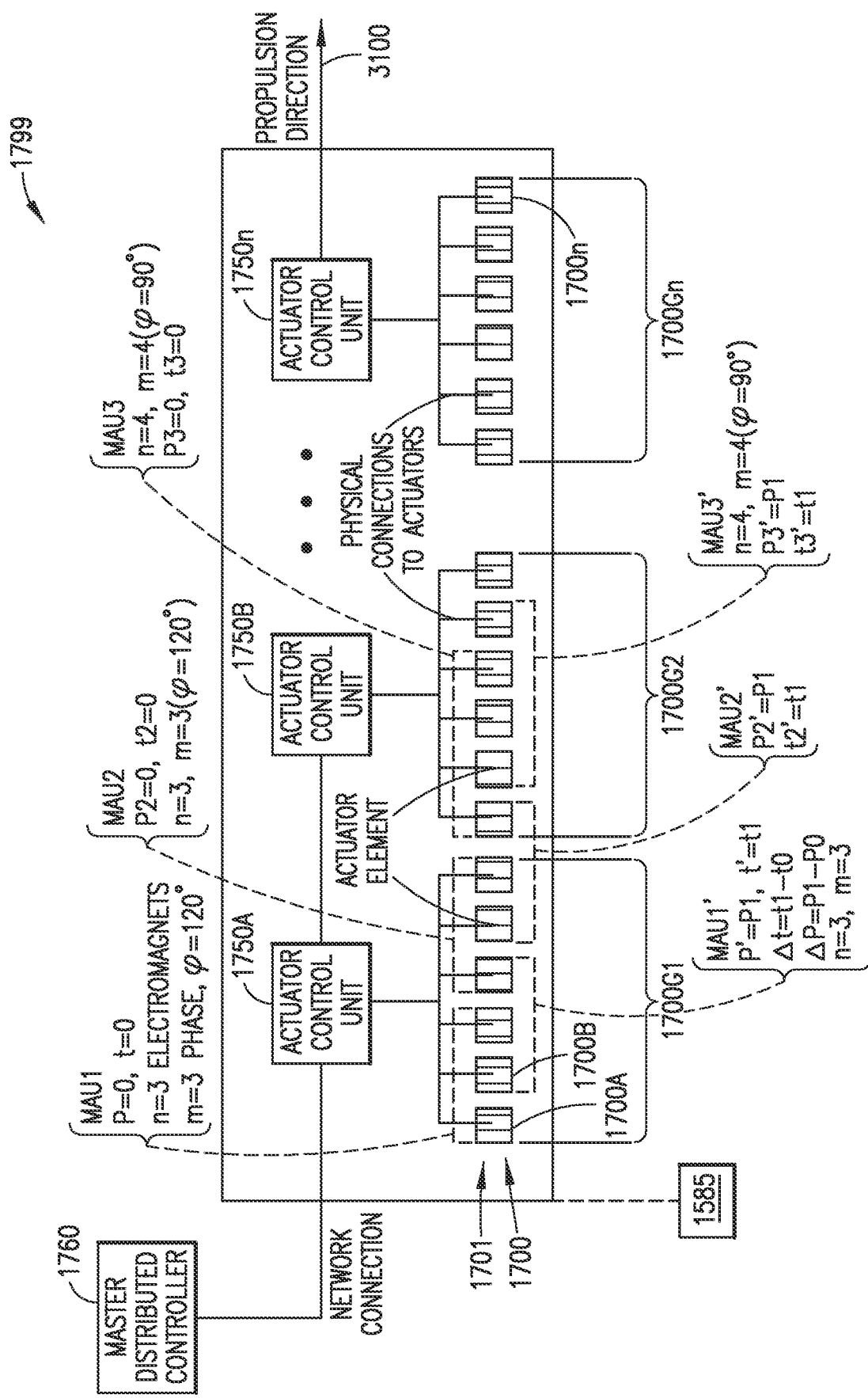
FIG. 17 is a schematic illustration of an exemplary actuator control system network in accordance with aspects of the disclosed embodiment.

FIG. 17 shows an actuator control system network 1799, in accordance with an aspect of the disclosed embodiment, configured to effect individual control of each electromagnet 1700A-1700n to provide the desired force components and degrees of freedom described and illustrated with respect to FIGS. 15A-16C. In one aspect, the actuator control system is configured so that the electromagnets 1700A-1700n form motor actuator units (collectively referred to as the motor actuator), each motor actuator unit having m number of electromagnets/coils cooperating to form the motor (where m is a dynamically selectable number of two or more electromagnets forming one or more of the motor actuator units as will be described further below). The actuator control system network 1799 is thus a scalable motion control system that has a clustered architecture with at least a master controller 1760 and distributed local drive controllers 1750A-1750n as will be described in greater detail below. In this aspect, groups of electromagnets 1700G1-1700Gn are coupled to a respective local drive controller 1750A-1750n that is configured to control the electrical currents on electromagnet 1700A-1700n within the respective group of electromagnets 1700G1-1700Gn. The local drive controller 1750A-1750n can be a "slave" in a network that is connected to a master controller 1760 that is configured to specify the desired forces (e.g., thrust and lift) for each individual electromagnet 1700A-1700n to effect the desired motion of the substrate handler 1500 in space. As will be described herein, the electromagnets 1700A-1700n can be physical electromagnets/coils that ran be dynamically configured when it comes to the respective "phase" definitions of each coil with respect to "phase" definitions of the other electromagnets/coils of the given motor actuator unit so that the position of the given motor actuator unit (formed of cooperative excitation phases of the motor under propulsion) may be deemed as moving virtually in unison with the base propulsion, though the physical electromagnets/coils are fixed (e.g., static) as will be described further below. This provides continuity in the desired force vectors for motion control of the substrate handler.

Figure 19:
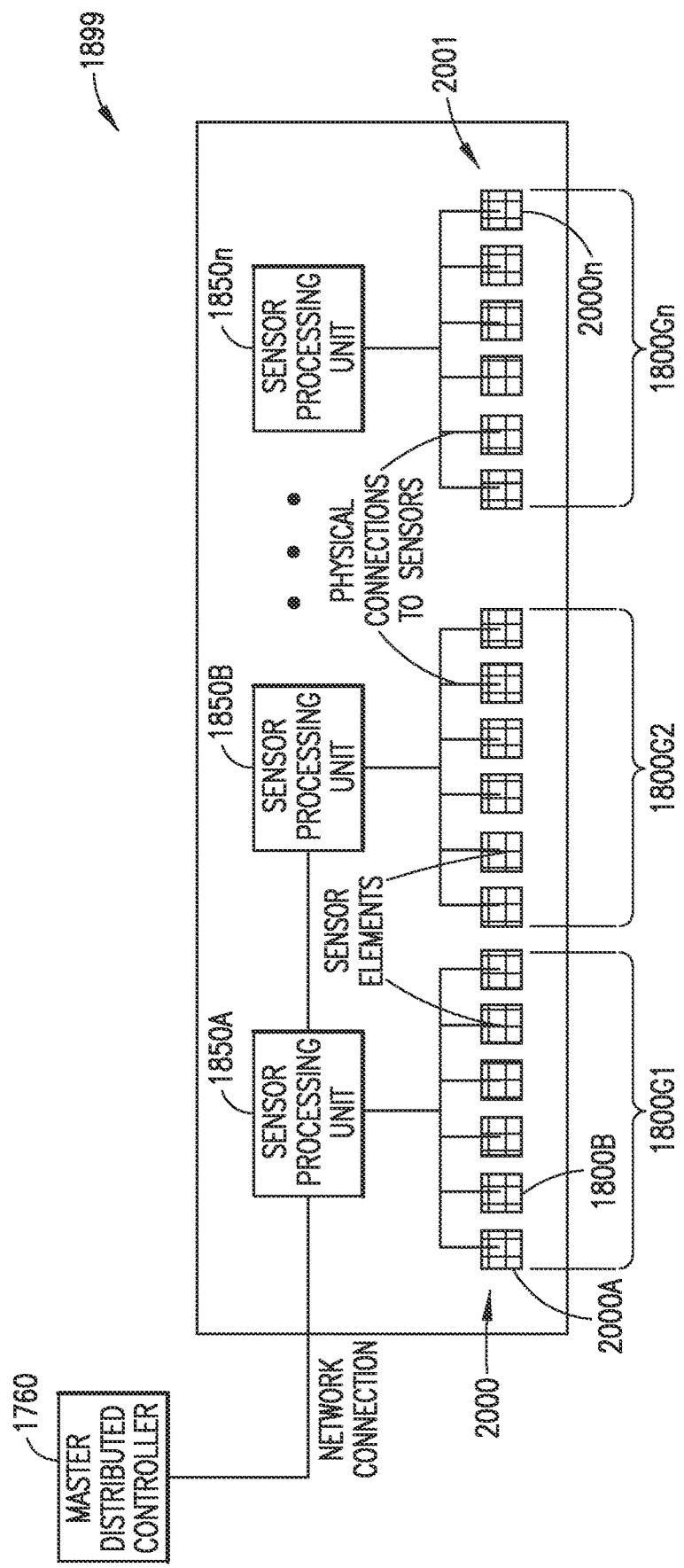
FIG. 19 is a schematic illustration of an exemplary sensor control system network in accordance with aspects of the disclosed embodiment.

In accordance with aspects of the disclosed embodiment, and referring to FIGS. 18 and 19, position feedback sensors 2000 are distributed on the frame of the chamber 118. The sensors 2000 are configured for sensing position of the base 1510 along the drive plane 1598 and are communicably coupled to the controller 199 so the controller 199 registers the sensed position of the base 1510, wherein the controller 199 is configured to sequentially excite the electromagnets 1700A-1700n of the array of electromagnets 1700 corresponding to the sensed position in the manner described herein.

FIGS. 18 and 19 illustrate a sensor control system network 1899, in accordance with an aspect of the disclosed embodiment, that is configured to provide position feedback of the substrate handler 1500 in space, e.g., relative to the frame of the transport chamber 118. The sensor control system network 1899 may be a scalable sensor control system that has a clustered architecture with at least the master controller 1760 and distributed local sensor controllers 1850A-1850n as will be described in greater detail below. In this aspect, groups of sensors 1800G1-1800Gn are coupled to a respective local sensor controller 1850A-1850n (also referred to herein as a sensor processing unit)that is configured as a "slave" in a network that is connected to the master controller 1760 (or other suitable master controller in communication with master controller 1760). Each of the local sensor controller 1850A-1850n includes a central processing unit 1851 and associated hardware interfaces 1852 that can support different types of sensor technologies such as those described herein. The local sensor controller 1850A-1850n can be integrated into a real time network such as EtherCat and/or a non-real time network such as Ethernet or similar. The sensors 2000 can be distributed along the propulsion path (e.g., drive lines 177-180) of the substrate handler so as to detect the location/position of the substrate handler in space, e.g., relative to the frame of the transport chamber 118.

Figure 20:
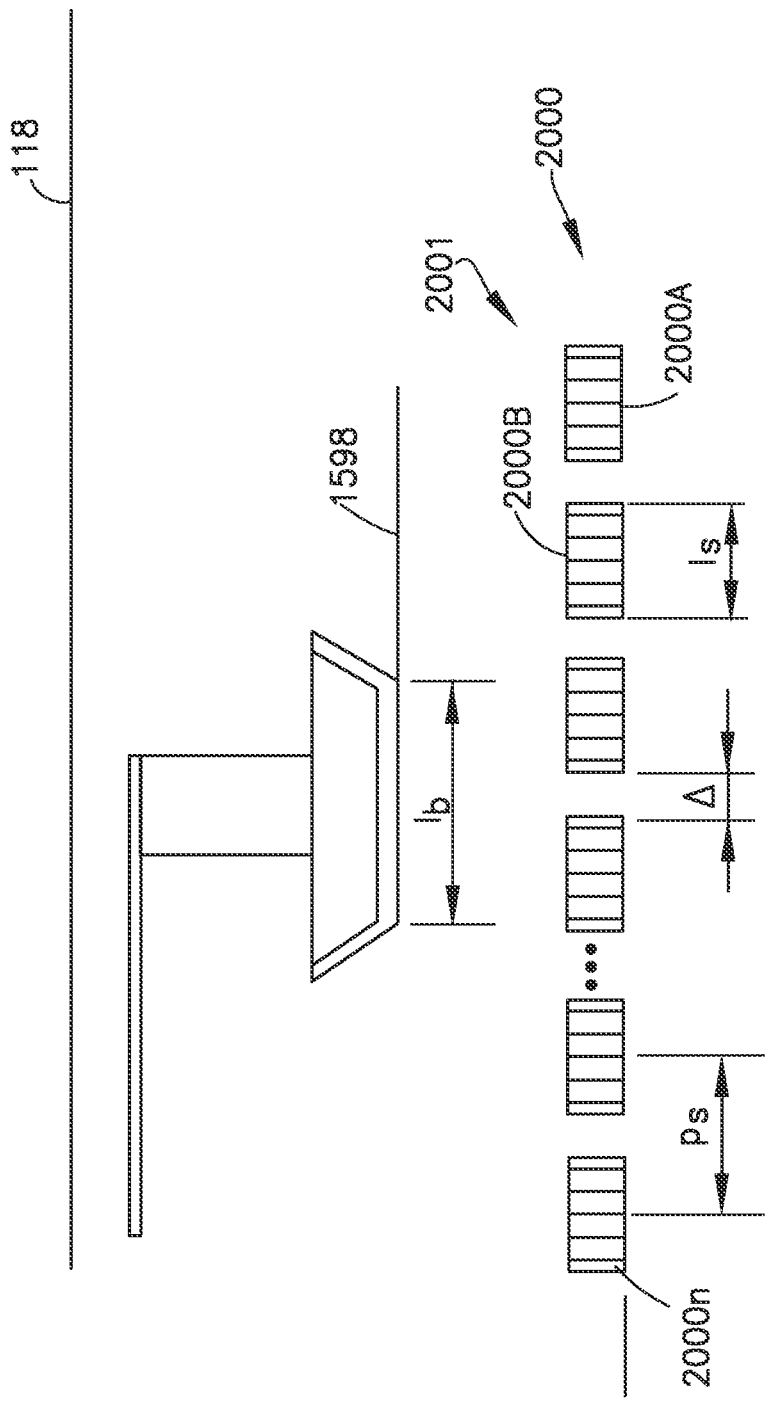
FIG. 20 is a schematic illustration of a portion of the sensor control system network of FIG. 19 in accordance with aspects of the disclosed embodiment.

FIG. 20 illustrates a distributed sensor arrays 2001 that includes sensors 2000A-2000n relative to a substrate handler 1500 base 1510 and how the relationship between characteristic dimensions of the base 1510 and the sensors 2000A-2000n that effects a continuous feedback of the position of the substrate handler 1500. As can be seen in FIG. 20, the sensors 2000A-2000n are disposed at a predetermine intervals or sensor pitch Ps where a sensor spacing Δ is provided between adjacent sensors 2000A-2000n. Each sensor 2000A-2000n has a length so as to provide a predetermined sensing range Ls and the base 1510 has a length Lb. The relationship between these characteristics to provide continuous feedback is:

$$Ls/2 > Ps - Ls => Ps < (3/2)Ls \quad [2]$$

where the length Lb of the base 1510 is:

$$Lb = nPs + Ls/2 \text{ (where } n=1,2,3,\ldots) \quad [3]$$

In accordance with aspects of the disclosed embodiment, each sensor 2000A-2000n includes any suitable deice (s) that can measure the longitudinal displacement and/or the air gap between the substrate handler 1500 base 1510 and a bottom reference surface, such as the level reference plane 1299 (see, e.g., FIG. 15A). The Master Controller 1760 is configured to track the location of the substrate handler 1500 by dictating which local sensor controller 1850A-1850n should be actively reporting feedback from the appropriate sensors 1700A-1700n. The combination of the actuator control system network 1799 and the sensor control system Network. 1899 forms a motion control infrastructure for the six degrees of freedom of the substrate handler 1500 as shown in FIGS. 15A-16C.

Figure 39:
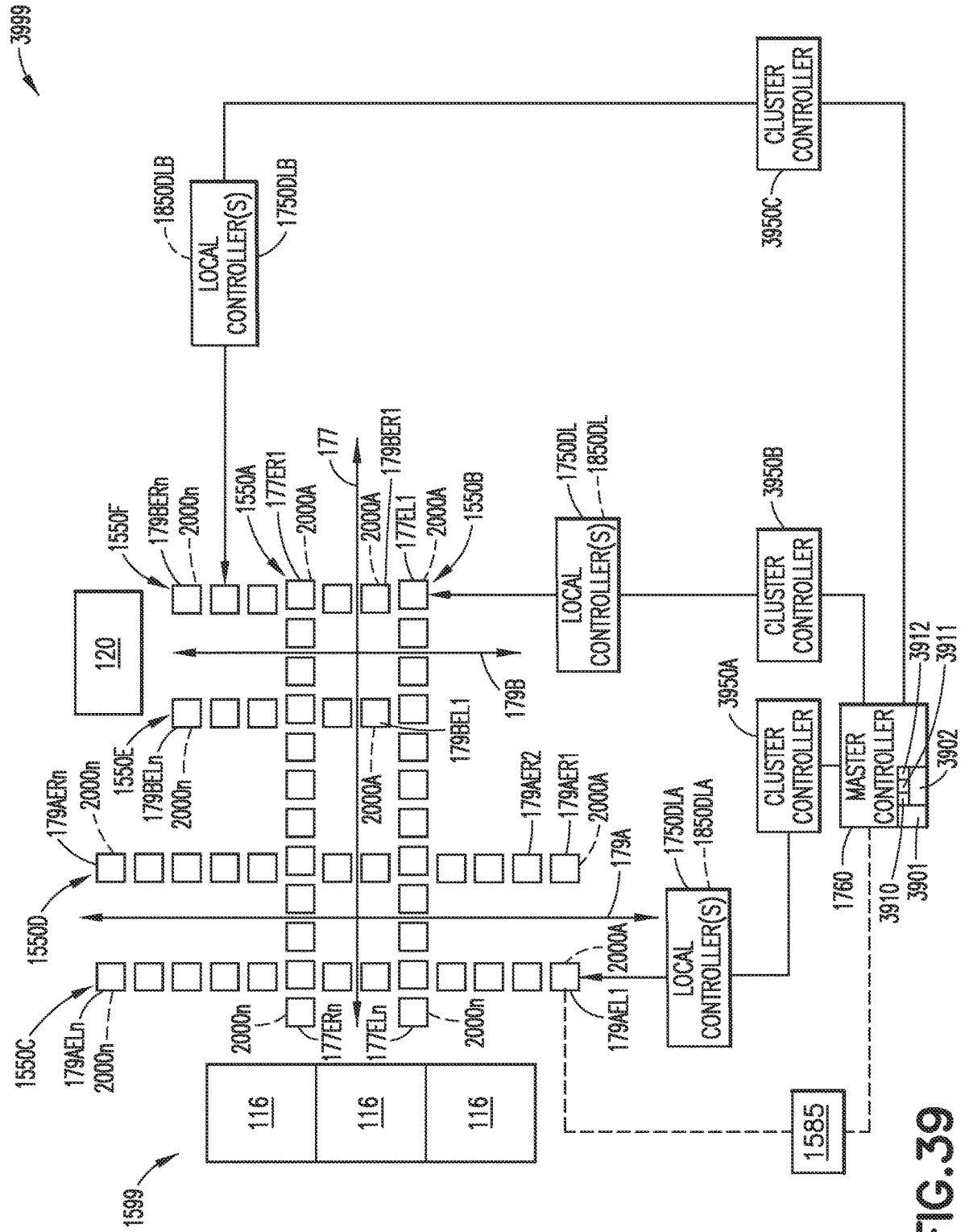
FIG. 39 is a schematic illustration of a clustered control architecture in accordance with aspects of the disclose embodiment.

Referring to FIG. 39, a control system network 3999 that has a clustered architecture representative of the actuator control system network. 1799 and the sensor control system network 1899 will be described. In the example illustrated in FIG. 39, there are three drive lines 177, 179A, 1798, each having respective array of electromagnets forming respective tracks 1550A-1550F (though shown as linear, may be arcuate). For example, drive line 177 is formed by tracks 1550A and 1550B having electromagnets 177ER1-177ERn and 177EL1-177ELn. Drive line 179A is formed by tracks 1550C and 1550D having electromagnets 179AER1-179AERn and 179AEL1-179AELn. Drive line 1798 is formed by tracks 1550E and 1550F having electromagnets 179BER1-179BERn and 179BEL1-179BELn. The configuration of the electrical machine illustrated in FIG. 39 is exemplary and may have any other suitable configuration.

In FIG. 39 the control system network includes the master controller 1760, cluster controllers 3950A-39500 and local controllers 1750DL, 1750DLA, 1750DLB, 1850DL, 1850DLA, 1850DL1. Local controller 1750DL corresponds to drive line 177, local controller 1750DLA corresponds to drive line 179A, and local controller 1750DLB corresponds to drive line 179B. Each of the local controller(s) 1750DL, 1750DLA, 1750DTE is substantially similar to distributed local drive controllers 1750A-1750n so that each drive line 177, 179A, 179B includes a distributed arrangement of local drive controllers 1750A-1750n as described above with respect to FIG. 17 for controlling respective groups 170001-17000n of electromagnets 1700A-1700n. Similarly, Local controller 1850DL corresponds to drive Line 177, local controller 1850DLA corresponds to drive line 179A, and local controller 1850DLB corresponds to drive line 179B. Each of the local controller(s) 1850DL, 1850DLA, 1850DLB is substantially similar to distributed local sensor controllers 1850A-1850n so that each drive line 177, 179A, 179B includes a distributed arrangement of local sensor controllers 1850A-1850n as described above with respect to FIG. 18 for controlling respective groups 180001-1800Gn of sensors 2000A-2000n.

In one aspect, as shown in FIG. 39 each of the local controllers 1750DL, 1750DLA, 1750DLB, 1850DL, 1850DIA, 1850DLB is connected (e.g., through a wireless and/or wired connection) to a respective cluster controller 3950A-3950C. For example, each of the local controllers 1750DL, 1850DL, of crave line 177 are coupled to cluster controller 3950B, each of the local controllers 1750DMA, 1850DLA of drive line 179A are coupled to cluster controller 3950A, and each of the local controllers 1750DLB, 1850DLB of drive line 179B are coupled to cluster controller 3950C. In other aspects, the local controllers may be connected (e.g., through a wireless or wired connection) directly to the master controller 1760 as shown in FIGS. 17 and 19). In still other aspects, the local controllers may be connected (e.g., through a wireless or wired connection) to both the master controller 1760 and the respective cluster controller 3950A-3950C to provide redundant substantially failsafe control of the local controllers.

Each of the cluster controllers 3950A-39500 are connected (e.g., through a wireless or wired connection) to the master controller 1760. Each of the master controller 1760, cluster controllers 3950A-3950C, and local controllers 1750DL, 1750DLA, 1750DLB, 1850DL, 1850DLA, 1850DLB includes any suitable processors and non-transitory computer program code to effect motion control of the substrate handlers 1500 as described herein. The master controller 1760 supervises the overall operation of the control system network 3999, each of the cluster controllers 3950A-39500 supervises the operations of the respective local controllers 1750DL, 1750DLA, 1750DLB, 1850DL, 1850DLA, 1850DLB, and each local controller 1750DL, 1750DLA, 1750DLB, 1850DL, 1850DLA, 1850DLB is utilized to drive the electromagnets and/or provide position feedback (of a substrate handler 1500) corresponding to the respective drive lines 177, 179A, 179B.

The clustered architecture provides the features of a centralized control network and the features of a distributed control network where required, within the network topology. The architecture as disclosed herein is advantageous because clusters may be distributed where required within the network, and each cluster controller 3950A-3950C is capable of providing highly centralized control within the cluster it manages. Network traffic associated with highly centralized control is generally confined within each cluster and local controllers 1750DL, 1750DLA, 1750DLB, 1850DL, 1850DLA, 1850DLB may be located close to electromagnets or sensors to which they control, reducing problems associated with power and signal cabling. In addition, the clustered architecture allows for direct control of the local controllers 1750DL, 1750DLA, 1750DLB, 1850DL, 1850DLA, 1850DLB by the master controller 1760 where required. Furthermore, because intense network traffic is generally confined within the clusters, and the clusters are capable of a high level of control, the architecture may accommodate a large number of clusters. Thus, the architecture provides a high level of scalability and allows for an efficient distribution of controllers. It is noted that while a clustered control architecture is described above, clustered architecture is merely an example of a suitable control architecture, although any suitable control architecture may be employed.

In another aspect of the disclosed embodiment, the local controllers 1750DL, 1750DLA, 1750DLB, 18501M, 1850DLA, 1850DLB shown in FIG. 39 can be directly connected to the master controller 1760. In this aspect, the master controller software is responsible for (e.g., the master controller is configured to control) several aspects of the real time control of the wafer handler's motion and the local controllers would be responsible (e.g., configured for) all low level feedback and actuation aspects of the control architecture.

Still referring to FIG. 39 and also to FIGS. 15A-16C, in accordance with aspects of the disclosed embodiment, the processor 3901 of the master controller 1760 is programmed with a dynamic model 3910 of the base 1510 (e.g., the dynamic model is stored in any suitable memory 3902 accessible by the processor 3901) with a payload (e.g., substrate(s) S) thereon and without a payload. The processor 3901 is also programmed with a dynamic model 3911 of frictional forces μ between the substrate S and the end effector 1520. A form factor 3912 of the machine electronics (e.g., number of electromagnets, spacing between electromagnets, number of drive lines and their respective orientations, propulsion to lift relationship, etc.) relative to the base 1510 may also be stored in memory 3902 and accessible by the processor 3901.

The master controller 1760 is programmed or otherwise configured to determine kinematic motion of the base 1510 from an initial substrate handler pose to a final substrate handler pose. The master controller 1760 is also programmed or otherwise configured to determine the kinematics of attitude/yaw control (in three degrees of freedom—pitch, roll, yaw) related to the determined kinematic motion. In one aspect, the kinematic motion and the kinematics of attitude/yaw are determined e.g., using one or more of dynamic model 3910, dynamic model 3911 and form factor 3912 in combination with a predetermined substrate process recipe (e.g., where and when the substrate is to be transferred and what process is to be performed on the substrate).

One method for controlling a machine such as the electrical machines described herein is to calculate a trajectory for each of propulsion (along the X and/or Y axes), lift (along the Z axis), roll, pitch, yaw. Such trajectories can be conveniently defined by a series of position, velocity and time values grouped into frames, referred to as PVT frames.

Figure 40A:
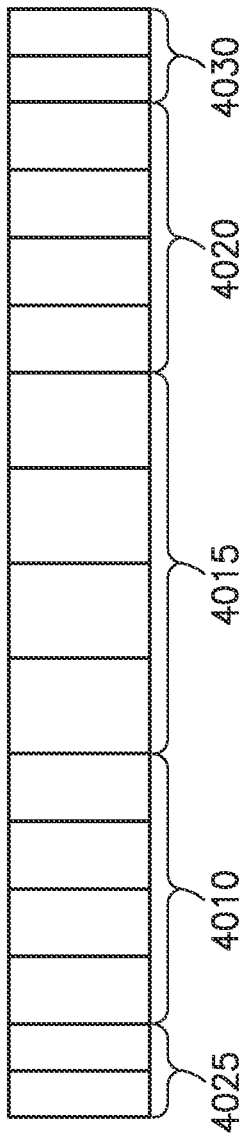
FIG. 40A is a schematic illustration of a PVT frame in accordance with aspects of the disclosed embodiment.

FIG. 40A shows an exemplary PVT frame 4005. The PVT frame 4005 includes position data 4010 (which may include start location (X,Y,Z), end location (X,Y,Z), and attitude (roll, pitch, yaw), velocity data 4015, and time data 4020. In one aspect the data is in binary format grouped together in one or more bytes. In another aspect each of the position data 4010, velocity data 4015, and time data 4020 occupies four bytes (while in other aspects the each of the position data 4010, velocity data 4015, and time data 4020 occupies more or less than four bytes). PVT frame 4005 may optionally include header information 4025 and trailing information 4030, both of which may include identification, parity, error correction, or other types of data. PVT frame 4005 may include additional data of varying lengths or amounts between or among the header, position, velocity, time, and trailing data. It should be noted that the PVT frame 4005 is not limited to any particular length. In other aspects, the PVT frame is either reduced to a PT frame or a P frame only. The communication from the master controller 1760 to the cluster/local controllers 1750DL, 1750DLA, 1750DLB, 1850DL, 1850DLA, 1850DLB may include different sets of values, which are peripherally related to the desired motion, for example, these values could De frequencies, phase offsets, current values and/or voltage values of the electromagnets/coil under control. The master controller 1760 implements the desired algorithmic transformation, calculates and streams via the motion network such quantities (effectively to every coil through an hierarchical scheme of cluster and local controllers).

It is a feature of the aspects of the disclosed embodiment to use these series of values as inputs for the dynamic models 3910, 3911 of the controlled electrical machine to calculate theoretical lift forces and propulsion forces to be applied by predetermined electromagnets 1700A-1700n so that the base 1510 follows the desired trajectory. It is also a feature of the aspects of the disclosed embodiment to use elements of the dynamic models 3910, 3911 to scale feedback control signals used by the local controllers 1750DL, 1750DLA, 1750DLB, 1850DL, 1850DLA, 1850DLB for each electromagnet under their control.

The lift forces, propulsion forces, and scaling terms may advantageously account for non linearities and dynamic cross coupling among individual drive lines 177, 179A, 179B. The lift forces, propulsion forces may be referred to herein as feedforward terms and the scaling term may be referred to as a gain term.

Figure 40B:
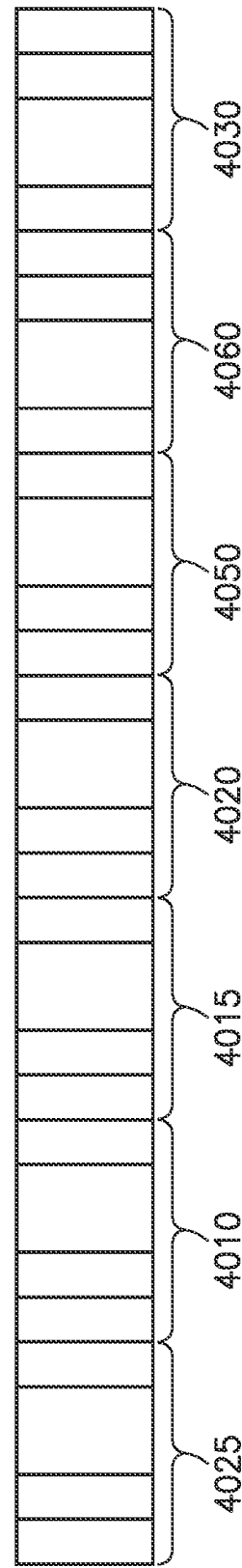
FIG. 40B is a schematic illustration of a PVT-FG frame in accordance with aspects of the disclosed embodiment.

Using the electrical machine 1599 shown in FIG. 39 (also referring to FIGS. 15A-16C) as an example, the master controller 1760 may generate a trajectory for each drive line 177, 179A, 179B, along which a substrate handler 1500 is to travel, in terms of a commanded position, velocity and acceleration. Using an inverse kinematic model of one or more of the base 1510 and/or frictional forces p, the master controller 1760 may utilize the trajectory information to generate corresponding feedforward, and gain terms. These terms may be grouped together with the trajectory information in frames specific to each drive line 177, 179A, 179B, referred to as PVT-FG frames. FIG. 40B illustrates an exemplary PVT-FG frame 4095. PVT-FG frame 4095 includes optional header 4025, position data 4010, velocity data 4015, time data 4020, and optional trailing information 4030, similar to PVT frame 4005. In addition, PVT-FG frame 4095 includes at least one feedforward term 4050 and at least one gain term 4060. The data may be in binary format grouped together in one or more bytes. In one aspect of the PVT-FG frame 4095 the position data 4010, velocity data 4015, time data 4020, feedforward term 4050, and gain term 460 each occupy four bytes (while in other aspects they may each occupy more or less than four bytes). Similar to PVT frame 4005, PVT-FG frame 4095 may include other data of varying lengths or amounts, distributed among or between the various terms.

The PVT-FG frames may (or in other aspects the PVT frames) then be distributed over the control system network 3999. The cluster controllers 3950A-3950C, receive the data, and may interpolate between two consecutive frames to obtain an instantaneous position, velocity, feedforward term and gain value, and utilize this information to effect control of the substrate handler 1500. For example, each cluster controller 3950A-3950C employs the PVT-FG frames (or in some aspects the PVT frames), or other suitable information/commands, from the master controller 1760 to generate the propulsion forces Fx (propulsion force along the X axis), Fy (propulsion force along the Y axis), and lift force Fz (along the Z axis) to effect one or more of levelling, propulsion, and three degree of freedom attitude control (e.g., roll, pitch, yaw) of the substrate handler 1500 and base 1510 thereof. In some aspects, the form factor 3912 of the machine electronics may be programmed at the cluster controller 3950A-3950C level, rather than or in addition to being programmed in the master controller 1760, where the form factor is used to establish the lift to propulsion relationship(s), and with the data provided by the master controller 1760 to generate the lift and propulsion forces noted above. In other aspects, the cluster controllers 3950A-3950C and local controllers 1750DL, 1750DLA, 1750DLB, 1850DL, 1850DLA, 1850DLB may receive corresponding data from the master controller 1760, and utilize the data to control the electromagnets 1700A-1700n and movement of the substrate handler 1500 along one of more of the drive lines 177, 179A, 179B.

The cluster controllers 3950A-3950C (or alternatively the local controllers 1750DL, 1750DLA, 1750DLB, 1850DL, 1850DLA, 1850DLB) command electromagnet 1700A-1700n modulation, which commands are sent to and received by the respective local controllers 1750DL, 1750DLA, 1750DLB, 1850DL, 1850DLA, 1850DLB, to effect one or more of dynamic phase allocation and the creation of virtual multiphase motor actuator units as described in greater detail herein.

Figure 21:
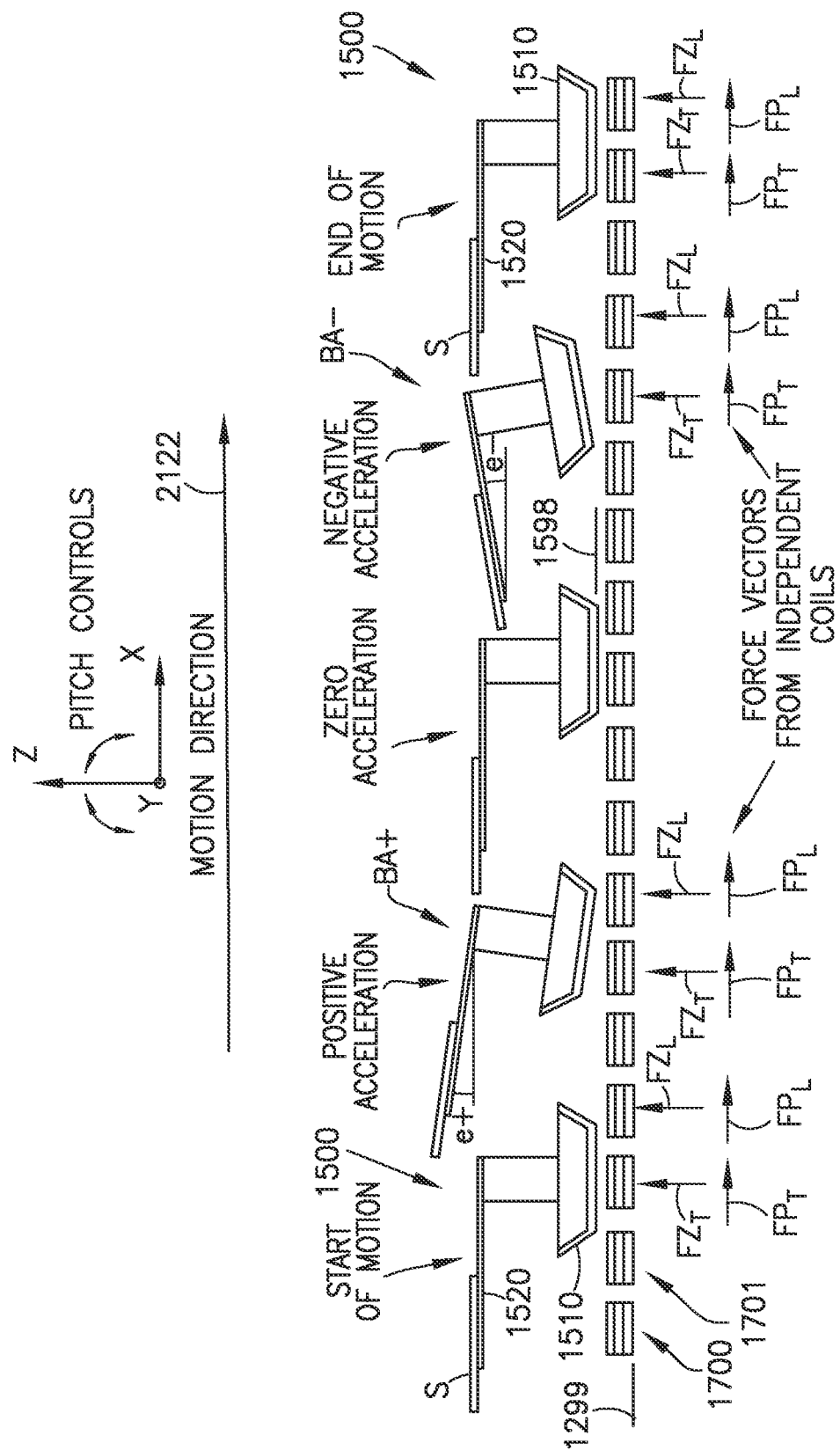
FIG. 21 is a schematic illustration of an exemplary motion control of a substrate handler in accordance with aspects of the disclosed embodiment.

FIG. 21 illustrates an exemplary controlled motion (s) of the substrate handler 1500 in accordance with aspects of the disclosed embodiment with respect to increased substrate handler throughput while carry ng a substrate S. Here, the controller 199 controls the levitation forces (e.g., $FZ_T$, $FZ_L$), generated by the array of electromagnets 1700, so as to impart differential levitation forces (illustrated in FIG. 21) across the base 1510 that effect a controlled inclination (e.g., e+ or e−) of the base 1510, relative to the drive plane 1598, that controls a predetermined reaction platen attitude in at least one of pitch (shown in FIGS. 15B, 21 and 27) and roll (shown in FIGS. 15A and 29). In one aspect, the controller 199 controls the levitation forces (e.g., $FZ_T$, $FZ_L$), generated by the array of electromagnets 1700 of the motor actuator units (that are virtually moving), so as to effect a predetermined bias attitude BA+ or BA− of the base 1510, relative to the drive plane 1598, that imparts a bias reaction force F2 (FIG. 23), from a base payload seating surface (e.g., such as a substrate seating surface 1520SS (FIGS. 23, 25A, 25B) of the end effector 1520 or a seating surface defined by substrate supports of cart 1431-1433 of cart 1500C) on a substrate S supported by the base seating surface, in a direction countering payload inertial force arising from acceleration of the reaction platen along the drive plane 1598. The controller 199 is configured to determine acceleration of the base 1510 (and the substrate handler thereof) along the drive plane 1598 at least from changes in the position of the base 1510 sensed by the sensors 2000, and in response to the acceleration determined, control the bias attitude of the base 1510 to provide the predetermined bias attitude countering the payload inertial force arising from the acceleration of the base 1510. In other aspects the controller 199 may apply a predefined acceleration from commanded trajectory for bias attitude control. Here, the controller 199 controls excitation of the electromagnets 1700A-1700n of the virtually moving motor actuator units of the array of electromagnets 1700 so as to set the bias attitude BA+ or BA− to bias the base 1510 against inertial forces tending to displace a substrate S, seated against the base 1510 (e.g., on an end effector 1520 thereof or substrate supports 1431-1433 thereof), relative to the base 1510 along a seat between the substrate S and the base 1510 (see, e.g., FIGS. 23, 25A, 25B).

As an example of countering payload inertial forces, starting at the left-hand side of FIG. 21, a substrate handler 1500 (which may be any of the substrate handlers described herein) is depicted at a starting point of a motion in direction 2122 in FIG. 21. As the substrate handler begins to move, a set of propulsion force vectors FP and lift force vectors FZ are generated by the Control System (e.g., the actuator control system network 1799 and the sensor control system Network 1899 which may be part of controller 199) so as to cause the substrate handler 1500 to accelerate in the motion direction with an increased Pitch angle e+ (e.g., the end effector 1520 is tilted in, e.g., a clockwise direction). To effect the increased pitch angle e+ the lift force vectors FZ are generated so that a magnitude of a trailing lift force vector $FZ_T$ is larger than a magnitude of a leading lift force vector $FZ_L$ (where leading and trailing are in reference to the motion direction). As the substrate handler reaches approximately its halfway point towards the end of the motion (e.g., such as where there is substantially zero acceleration of the substrate handler 1500), the pitch angle e+ is reduced in magnitude so that the tilted orientation of the end effector 1520 is reversed from the clockwise orientation to zero (e.g., substantially parallel with the level reference plane 1299—the trailing lift force vector $FZ_T$ and the leading lift force vector $FZ_L$ are substantially equal). At this point in the trajectory, the substrate handler 1500 motion begins a deceleration stage where the pitch angle e− is decreased so that the end effector 1520 pitches to a counter clockwise orientation. To effect the decreased pitch angle e− the lift force vectors FZ are generated so that the magnitude of the trailing lift force vector $FZ_T$ is less than a magnitude of the leading lift force vector $FZ_L$). As the substrate handler 1500 reaches its final destination, the pitch angle e− is increased to zero so that the tilted orientation of the end effector 1520 is substantially parallel with the level reference plane 1299, as in the start of the motion.

Figure 21A:
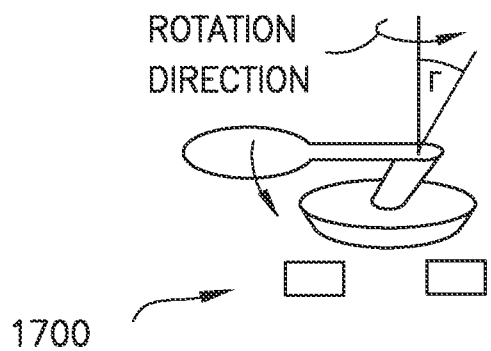
FIG. 21A is a schematic perspective illustration of a substrate handler motion in accordance with aspects of the disclosed embodiment.

As may be realized, while the pitch of the end effector is increased or decreased to account for acceleration and deceleration of the substrate handler 1500 substantially without slippage of the substrate S relative to the end effector while travelling along a substantially straight/linear path (such as along drive lines 177-180), in other aspects, the roll r and/or pitch e of the substrate handler 1500 may be increased or decreased to provide for higher rotational accelerations of the substrate handler 1500 (such as about one or more of axes 777, 1277, 1377 in a manner substantially similar to that described above with respect to the linear motion (see FIG. 21A which illustrates rolling of the end effector in rotation direction with roll control as shown in FIG. 15A where lift force vector $FZ_{left}$ is greater than lift force vector $FZ_{right}$).

Figure 22:
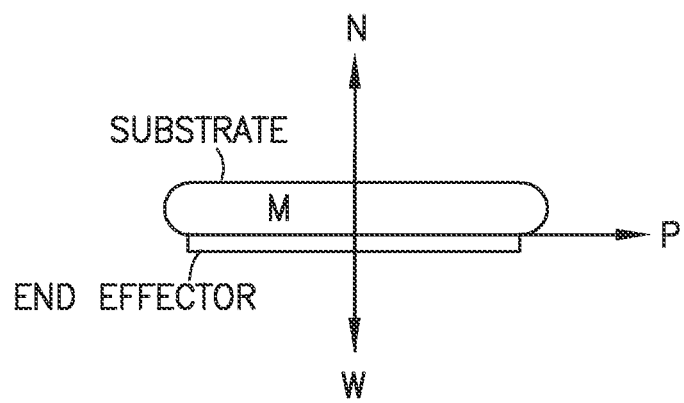
FIG. 22 is a free body force diagram with respect to a maximum allowed acceleration with conventional substrate transport apparatus.

The motion control illustrated in FIG. 21 effects a substantially faster substrate motion transport (e.g., provides for higher accelerations substantially without substrate slippage relative to the end effector) when compared to conventional substrate transport where the end effector is parallel with the wafer transfer plane throughout end effector motion. As an example, if the pitch angle e of FIG. 21 is set to be zero (as with conventional substrate transports) during the entire motion then the maximum allowable propulsion acceleration is limited to the static coefficient of friction (μ) between the substrate S and a contact surface of the end effector 1520. This is illustrated in FIG. 22, which constitutes the typical use case in a conventional substrate transport where the substrate S is held by its back side in contact with the end-effector. As it can be seen in FIG. 22, the maximum acceleration imposed to the substrate S μg before wafer slippage takes place. Where "g" is the acceleration of gravity (about 9.8/S²), µ is the coefficient of friction, M is the mass of the substrate, W is the weight of the substrate, and N is the normal force.

Figure 23:
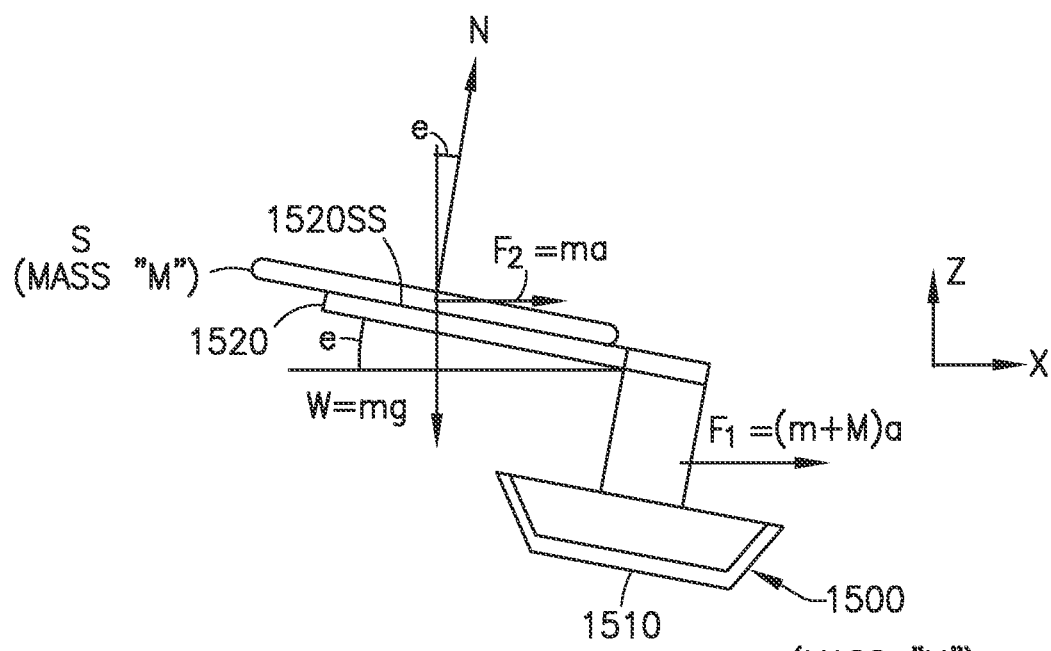
FIG. 23 is a free body force diagram illustrating an effect of pitch angle on acceleration of a substrate handler with respect to substrate slippage in accordance with aspects of the disclosed embodiment.
Figure 24:
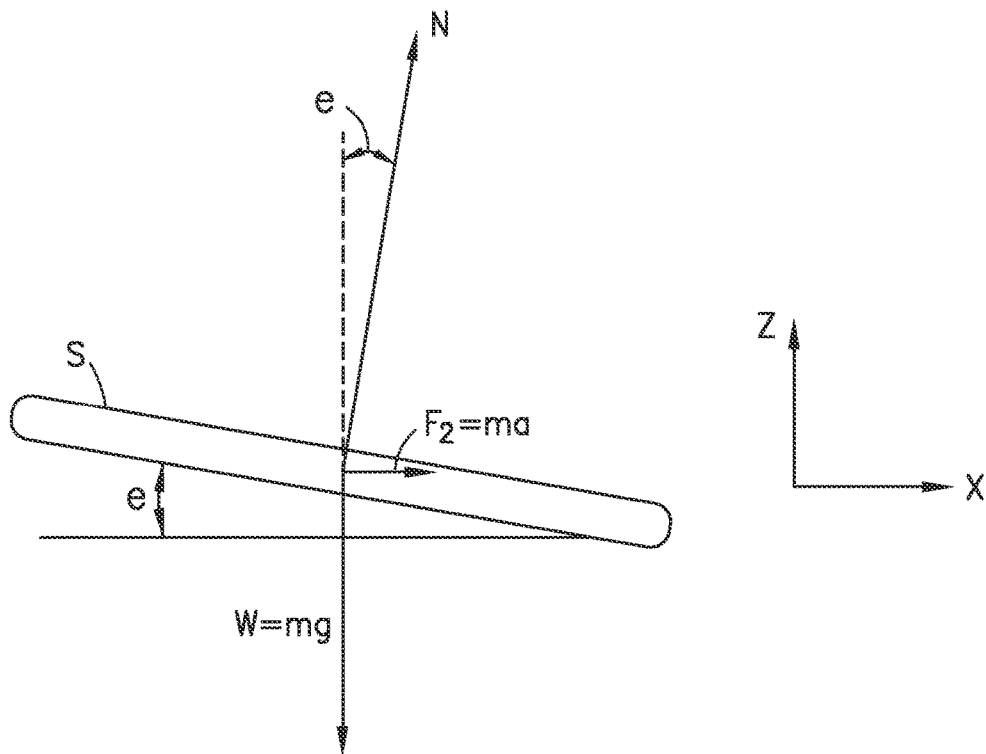
FIG. 24 is a free body force diagram of a substrate illustrating the effects of pitch angle, without friction, on substrate slippage in accordance with aspects of the disclosed embodiment.
Figure 24A:
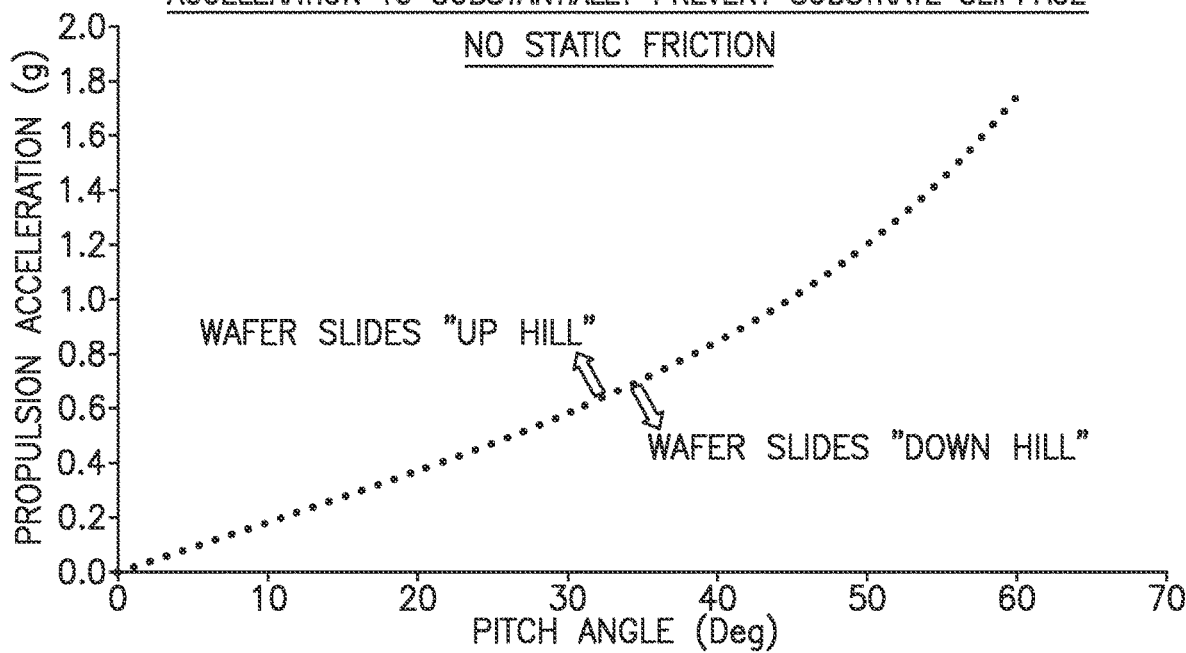
FIG. 24A is an exemplary graph illustrating propulsion acceleration in relation to pitch angle, without friction, with respect to substrate slippage in accordance with aspects of the disclosed embodiment.

FIG. 23 illustrates the case where the substrate (having a mass in) is carried by substrate handler 1500 (having a mass M) with a pitch angle e while the substrate handier 1500 is accelerated in the X direction. The force diagrams in FIG. 23 illustrate the dynamics of the motion of the substrate S and substrate handler 1500. In FIG. 23, the substrate hander 1500 is accelerated along the propulsion direction X with acceleration a. As a result, the force at the substrate handler is represented by the variable F1. The acceleration a along the X direction, impacts the reaction (normal) force N on the substrate S in a way that once added to the weight of the substrate W yields a resultant wafer force F2. It is possible to relate the angle e and the acceleration a in such a way that the substrate S substantially does not slip relative to the end effector 1520 of the substrate handler 1500. To substantially prevent wafer slippage, two situations can be considered for the sake of clarity. First, it is assumed that there is no friction between the substrate and the end effector 1520. FIG. 24 illustrates a free body diagram of the substrate S on the end effector 1520 in the absence of friction µ. As can be seen in FIG. 24, despite the absence of friction µ, an acceleration a can be determined in terms of the pitch angle e such that the substrate mass in is traveling along the X direction. This relation is expressed by equation (4) below:

$$a = g \tan e \quad [4]$$

where g is the acceleration of gravity (9.8 m/s²). FIG. 24A illustrates wafer slippage regions in terms of the pitch angle e. It is noted that the substrate S will slip relative to the end effector 1520 without friction µ if the pitch angle e is substantially zero. The curve illustrated in FIG. 24A represents the desired pitch angle "e" to keep the substrate S moving at an acceleration "a" along the X direction without slippage. Alternatively, the same curve of FIG. 24A can be interpreted as the demanded acceleration "a" of the substrate handler 1500 to prevent the substrate S from slipping while moving along the X direction with the pitch angle "e". Deviation from the curve illustrated in FIG. 24A will cause the substrate S to slide either "downhill" or "uphill" (where the terms downhill and uphill are used for convenience relative to the pitch) relative to the end effector 1520 depending on the acceleration value.

Figure 25A:
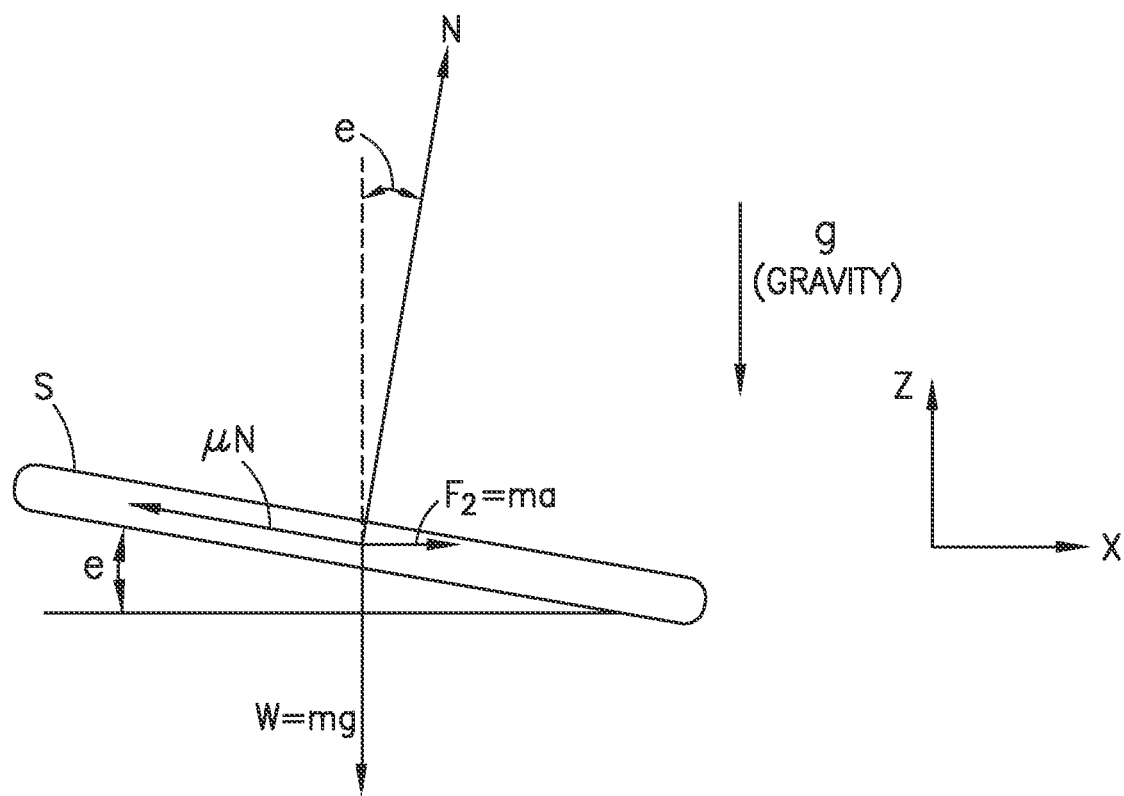
FIG. 25A is a free body force diagram of a substrate illustrating the effects of pitch angle, with friction, on substrate slippage in accordance with aspects of the disclosed embodiment.
Figure 25B:
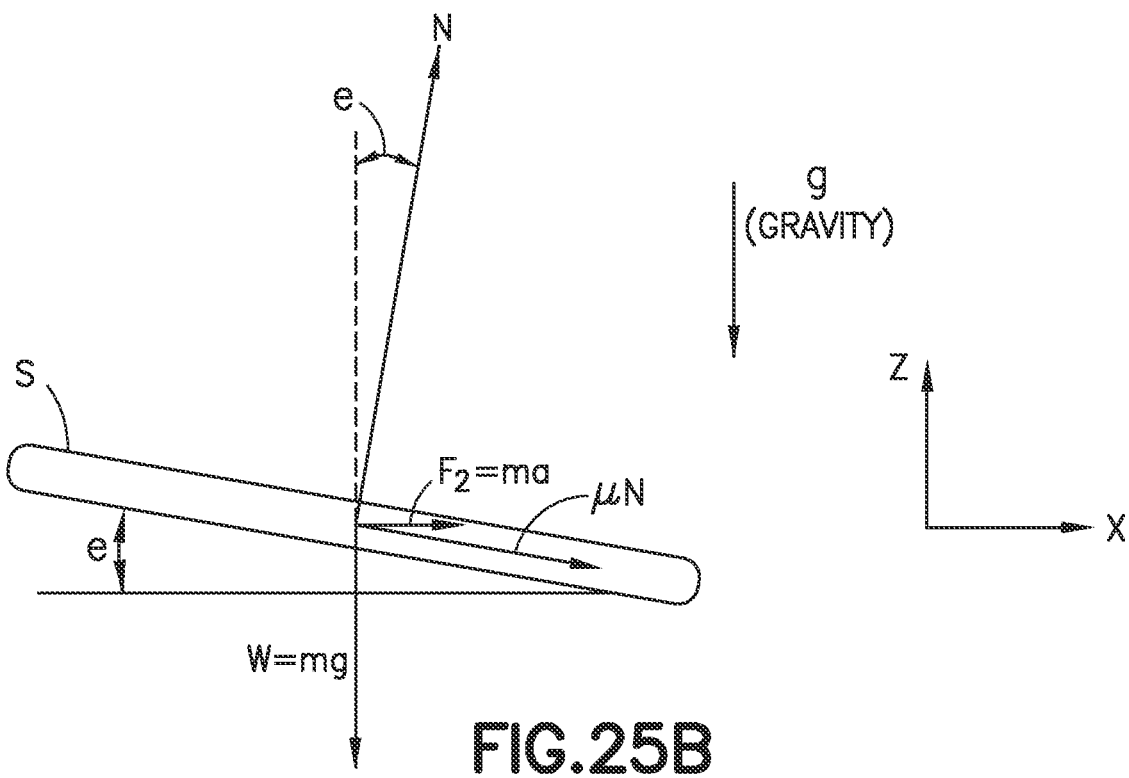
FIG. 25B is a free body force diagram of a substrate illustrating the effects of pitch angle, with friction, on substrate slippage in accordance with aspects of the disclosed embodiment.

FIGS. 25A and 25B show the effect of a non-zero static friction coefficient µ on the relation between acceleration a and pitch angle e. For example, FIG. 25A illustrates a minimum propulsion acceleration before slippage of the substrate S relative to the end effector 1520 takes place. In this case, the friction force direction points "uphill" to substantially prevent the wafer mass m from sliding "downhill" (again relative to the direction of pitch). Here, the "slowest" expected acceleration to prevent wafer slippage is calculated as:

$$a_{min} = [-\mu + \tan e]/[1 + \mu \tan e] \quad [5]$$

FIG. 25B, illustrates the case for the maximum (e.g., fastest) expected propulsion acceleration a before slippage of the substrate S relative to the end effector 1520. In this case, the friction force direction points "downhill" to substantially prevent the wafer mass m from sliding "uphill" (again relative to the direction of pitch). Here, the "fastest" expected acceleration a is calculated as:

$$a_{max} = [\mu + \tan e]/[1 - \mu \tan e] \quad [6]$$

Consequently, in the presence of a non-zero static friction coefficient µ the propulsion acceleration a should stay within the limits below in order to prevent substrate S slippage, for a given pitch angle:

$$a_{min} < a < a_{max} \quad [7]$$

Figure 26:
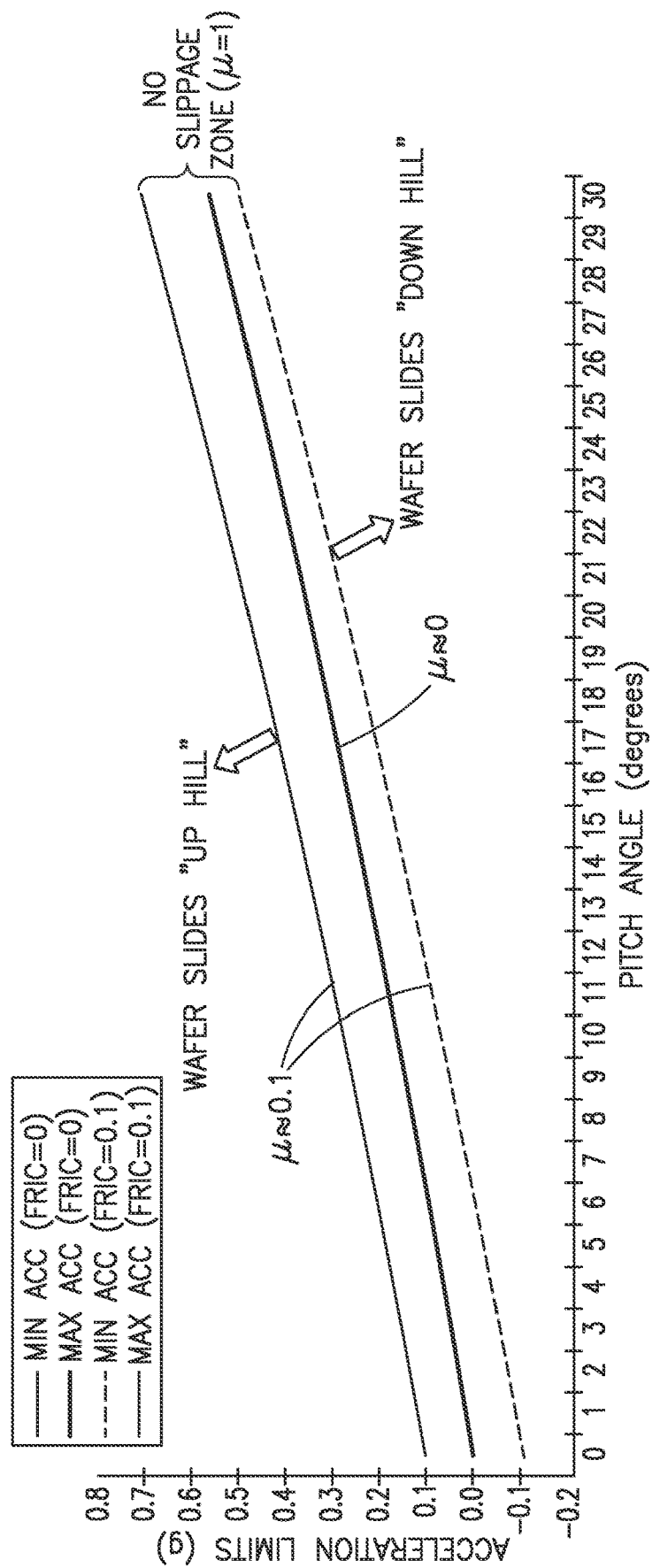
FIG. 26 is an exemplary graph illustrating acceleration limits in relation to pitch angle, with friction, with respect to substrate slippage in accordance with aspects of the disclosed embodiment.

FIG. 26 provides an example of the dependency between acceleration a and pitch angle e for a static coefficient of µ that is about 0.1, which is a typical value for substrate handlers used in high temperature applications. The curve of FIG. 24A is repeated in FIG. 26 under the case of µ equal to about 0. The region between the top and bottom curves (µ equal to about 0.1) represents a non-slippage region. (e.g., a region of acceleration for a given pitch angle where the substrate slippage relative to the end effector substantially does not occur). The areas outside this region may have wafer slippage either in the upwards of downwards direction relative to the substrate handler inclination (i.e., pitch angle e). In the example of FIG. 26, the maximum acceleration with a substantially zero pitch angle is about 0.1 g which is the fastest acceleration that conventional substrate handlers can provide for typical high temperature applications. If the pitch angle e is set to about 16 degrees of inclination, the substrate can be transported at accelerations as high as 0.4 g using the same end effector material (as in conventional substrate handlers) which constitutes a substantial throughput improvement compared to the conventional substrate handlers. The pitch angle e can be set according to a predetermined acceleration in order to maximize throughput such as depicted in FIG. 21.

Figure 27:
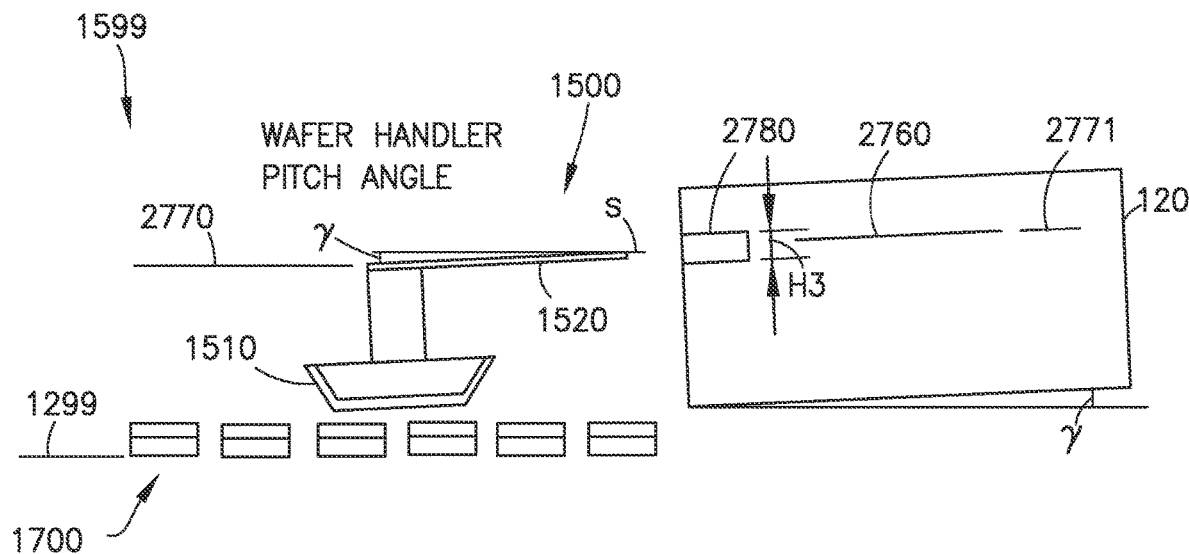
FIG. 27 is a schematic elevation view of a substrate handler illustrating pitch control of the substrate handler in accordance with aspects of the disclosed embodiment.

FIG. 27 illustrates active control of the substrate handler 1500 orientation in roll, pitch, and yaw with respect to leveling of the substrate handler 1500 relative to a substrate station, such as process module 120. Mechanical deflection imposes challenges on entering and exiting process module openings 2780 which are becoming increasingly smaller in height H3 due to the need of optimizing process module 120 process times. Conventional substrate transports generally suffer from the inherent potential of mechanical deflection due to the presence of articulated links with bearings that add weight and decrease stiffness, noting that compensating for the end-effector orientation as the wafer goes through the process module opening 2780 may not be practical. In these cases, it is becoming increasingly difficult to be able to comply with more restrictive mechanical deflection constraints. The aspects of the disclosed embodiment provide a solution to mechanical deflection that dynamically compensates for any mechanical deflection by controlling the substrate handler orientation in space, relative to the level reference plane (e.g., by adjusting the roll, pitch and yaw angles as described herein) such that a substrate passes through the process module opening 2780 substantially without contact between the substrate S and the opening 2780 and substantially without contact between the end effector 1520 and the opening 2780.

FIGS. 15A-16C illustrate the controlled adjustment, by the local drive controller(s) 1750A-1750n and the local sensor controller (s) 1850A-1850n, of the roll and yaw angles of the substrate handler 1500 in addition to the pitch angle. Referring also to FIG. 27, the controlled adjustment of each of the roll, yaw, and pitch angles (e.g., by differentially varying at least the lift force vectors acting on the base 1510 as described herein) effects leveling a position of the substrate handler 1500 at any suitable substrate holding station such as a process module 120 so that a plane 2770 of the substrate S (and end effector 1520 on which the substrate S is supported) is substantially the same as a plane 2771 defined by the substrate holding station 120 substrate support surface 2760. In some aspects, the roll, yaw, and pitch angles are adjusted independent of each other. The controlled adjustment of the substrate handler 1500 orientation angles (e.g., roll, pitch, and yaw) also provides for compensation of mechanical deflection of the end effector 1520 due to, for example, the substrate loading as well as the weight of the substrate handler 1500 structure.

Figure 28:
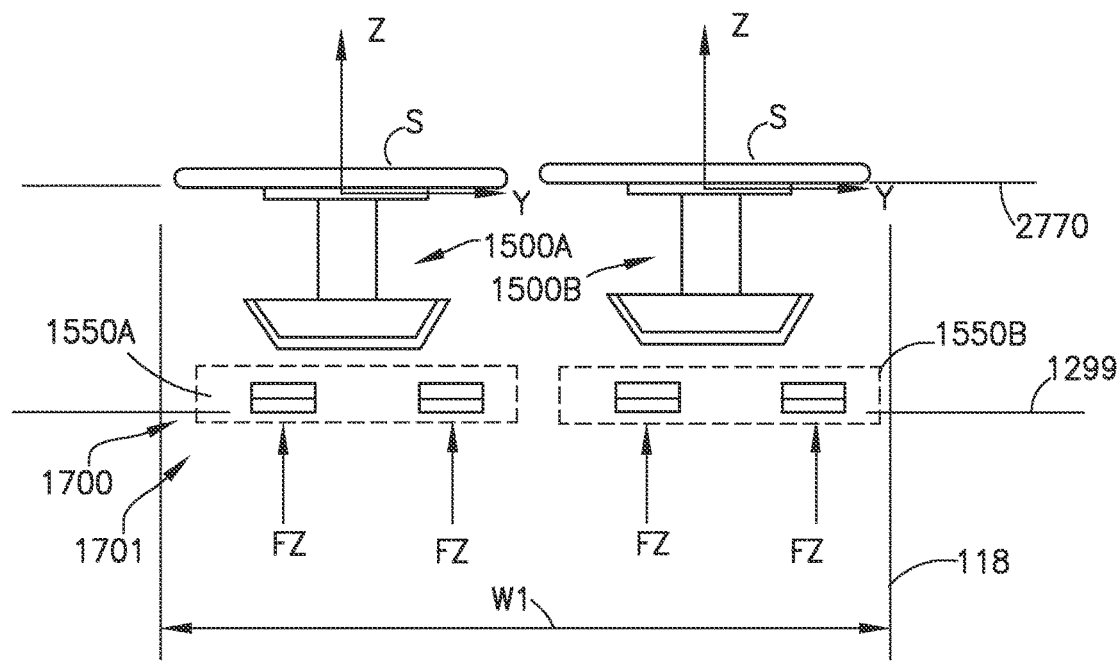
FIG. 28 is a schematic elevation view of one substrate handler passing by another substrate handler within a transport chamber in accordance with aspects of the disclosed embodiment.
Figure 29:
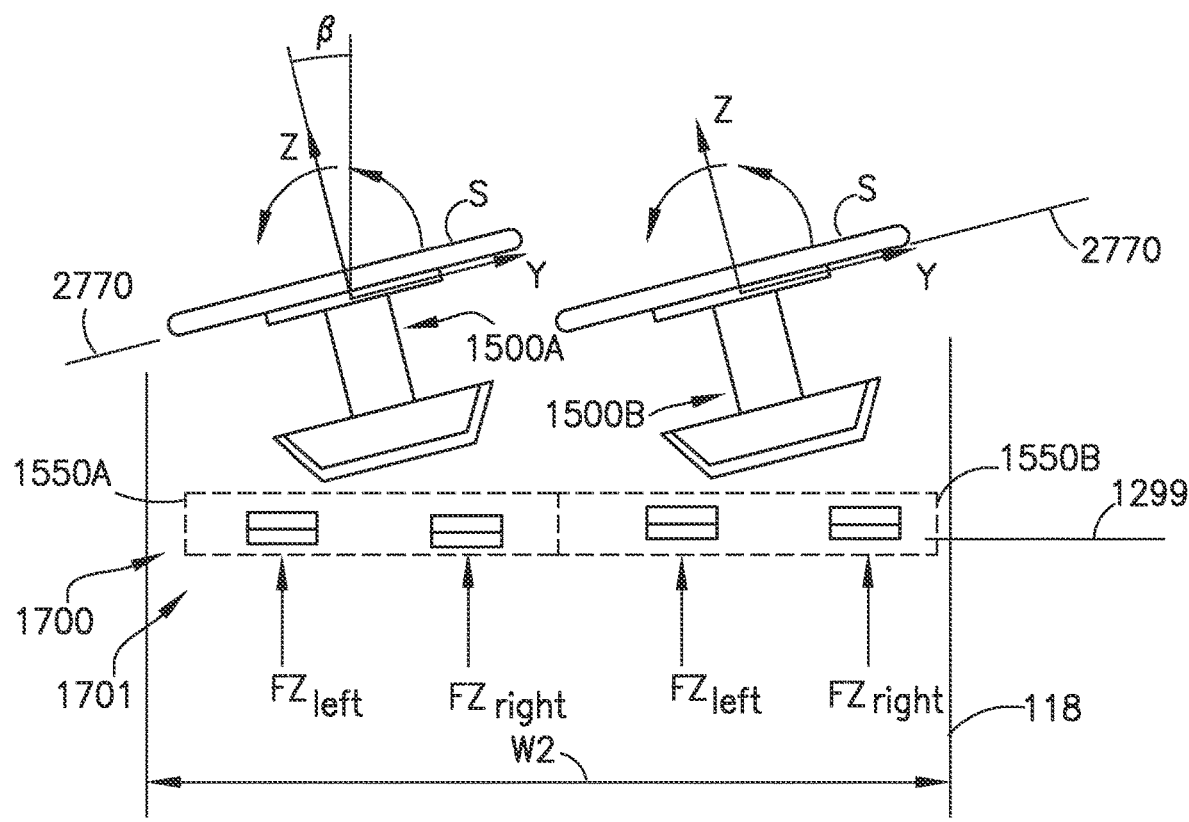
FIG. 29 is a schematic elevation view of one substrate handler passing by another substrate handler within a transport chamber in accordance with aspects of the disclosed embodiment.

Referring to FIGS. 8-11 and 28 and 29, as described above, in some aspects multiple drive lines 177, 178 are provided so as to extend longitudinally along a length of the transport chamber 118 to provide passage of one substrate handler 1500 by another substrate handler along the longitudinal direction of the transport chamber 118. FIG. 28 illustrates passage of two substrate handlers 1500A, 1500B past one another with substrate handler 1500A traveling along an inbound track 1550A and with substrate handler 1500B travelling along an outbound track 1550B. Here each of the substrate handlers 1500A, 1500B have roll, pith, and yaw angles so that the plane 2770 of the end effector 1520 (and substrate s held thereon) is substantially parallel (i.e., level) with the level reference plane 1299. Here, with the end effectors 1520 level, the transport chamber 118 has a lateral width W1. However, in accordance with aspects of the disclosed embodiment, the width of the transport chamber 118 may be minimized or otherwise reduced from lateral width W1 to lateral width W2 by adjusting one or more of the roll, the pitch, and the yaw of the substrate handlers 1500A, 1500B as they pass one another along the length of the transport chamber 118. For example, as illustrated in FIG. 29 the roll angle of each substrate handler 1500A, 1500B may be adjusted to a predetermined angle β relative to the level reference plane 1299 to avoid contact between the substrate handlers 1500A, 1500B as they move past one another during a period of time that both substrate handlers 1500A, 1500B would otherwise occupy the same space. The predetermined roll angle β may depend on end effector configuration (e.g., so that the substrate S does not slip relative to the end effector). As may be realized it advantageous to have control of the roll, pitch, and/or yaw angles of each substrate handler 1500 in order to reduce a footprint of: the transport chamber 118 that houses the wafer handling automation, where the reduced footprint at least increases tool density on the fabrication facility floor and decreases pump down times of the transport chamber which may result in increased throughput.

Figure 30:
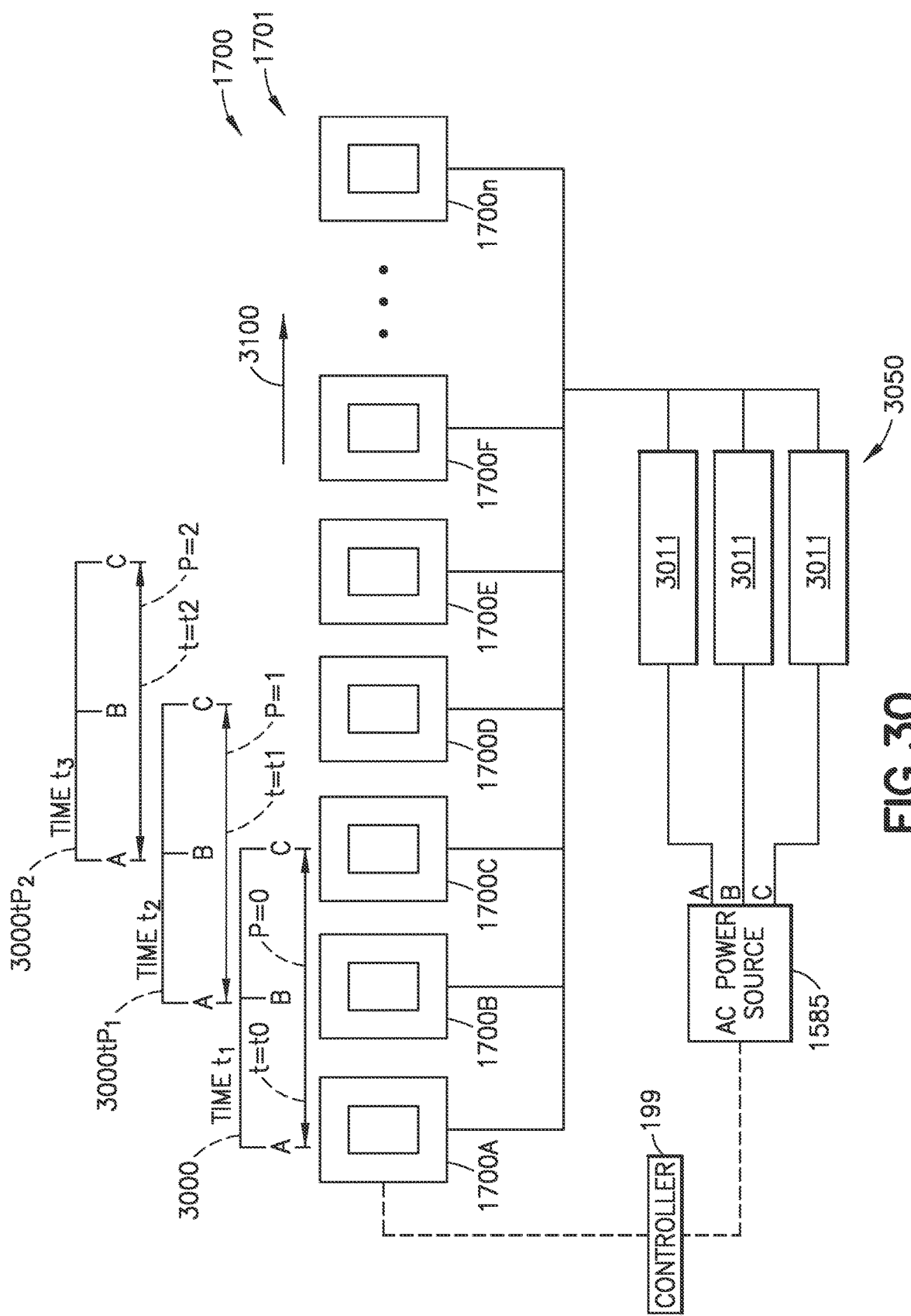
FIG. 30 is a schematic illustration of a portion of the actuator control system network showing dynamic phase allocation in accordance with aspects of the disclosed embodiment.

Referring now to FIGS. 17 and 30, an exemplary control of the array of electromagnets 1700 will be described where dynamic phase allocation is employed. As described herein, the controller 199 (which in one aspect is a clustered or master controller as described herein—see FIG. 39) is operably coupled to the array of electromagnets 1700 and the alternating current power source 1585 (the power source may be any suitable type and can be direct current in which case the controller driving circuit will modulate that to desired frequency/phase for as many alternating current power phases as desired) and configured so as to sequentially excite the electromagnets 1700A-1700n with multi-phase alternating current so that the base 1510 of a substrate handler 1500 is levitated and propelled with at least one of attitude control and yaw control with a common set of the electromagnets 1700A-1700n (such as those electromagnets of a respective drive line 177-180). As noted above, the controller 199 is configured to sequentially excite the electromagnets 1700A-1700n cooperating in multi-phase alternating current excitation that form motor actuator units 1701 corresponding to the position of the base 1510 sensed by the sensor 2000. The number n (an integer in the example of three or more, though in other aspects may be two or more) of electromagnets 1700A-1700n of each motor actuator unit 1701 as well as the location (static) of the respective n electromagnets 1700A-1700n of each motor actuator unit 1701 are dynamically selectable by the controller 199 in effecting lift and propulsion of the base (secondary) 1510 at any given time throughout operation of the motor actuator. Each of the electromagnets 1700A-1700n generates, from excitation with common multiphase alternating current having a single common frequency per phase, both the separately controllable levitation and the propulsion forces against the base 1510 so as to control the base 1510 with up to six independent degrees of freedom including at least one of attitude and yaw at least with the base 1510 levitated. The common single frequency per phase of each phase (here respective phases A, B, C) may be selectably variable from different desired excitation frequencies so that levitation and propulsion forces generated by the motor actuation unit 1701 enable substantially independent control of the base 1510 in each of the up to six independent degrees of freedom. In one aspect, the controller 199 controls the roll, pitch, and yaw angles generated by the array of electromagnets 1700A-1700n arranged in the respective motor actuator units 1701, including at least the attitude with the base 1510 levitated and propelled so as to move relative to the array of electromagnets 1700 along the at least one drive line 177-180 from a first predetermined position P1 (see FIG. 1B) with respect to the frame of the chamber 118 to a second different predetermined position P2 (see FIG. 1B) with respect to the frame of the chamber 118. In one aspect, the controller 199 controls the roll, pitch, and yaw angles generated by the array of electromagnets 1700, including at least the base 1510 attitude and the base 1510 yaw with the base 1510 levitated and stationary relative to the array of electromagnets 1700 in a predetermined position (such as position P2 in FIG. 1B) along the at least one drive line 177-180 with respect to the frame of the chamber 118.

Figure 32A:
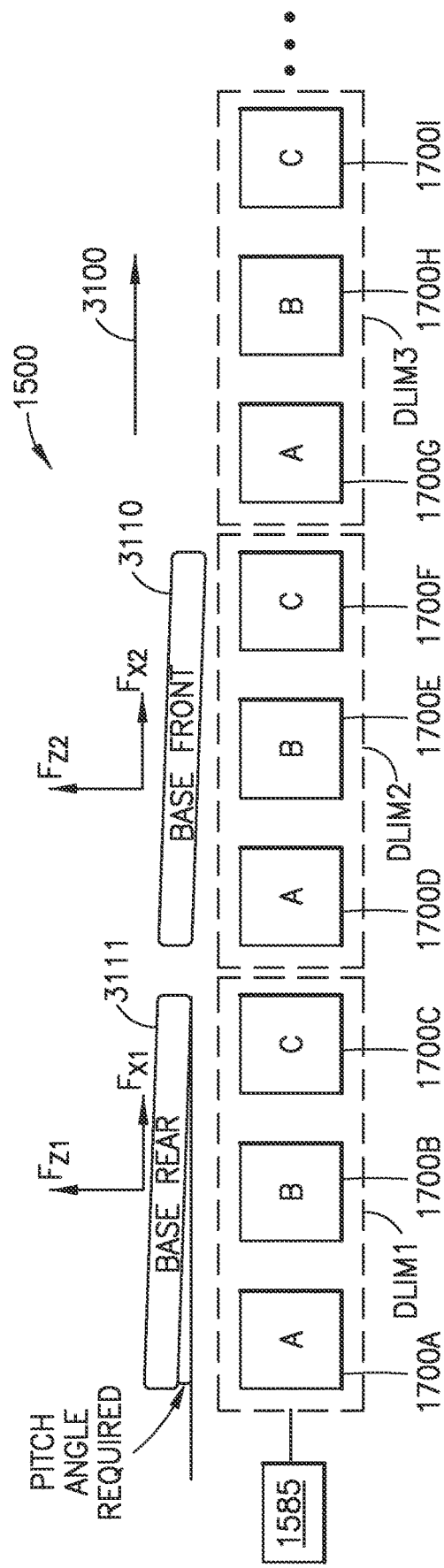
FIGS. 32A and 32B illustrate tilt control of a port on of a substrate handler utilizing the actuator control system network with dynamic phase allocation and virtual multiphase actuator units in accordance with aspects of the disclosed embodiment.
Figure 32B:
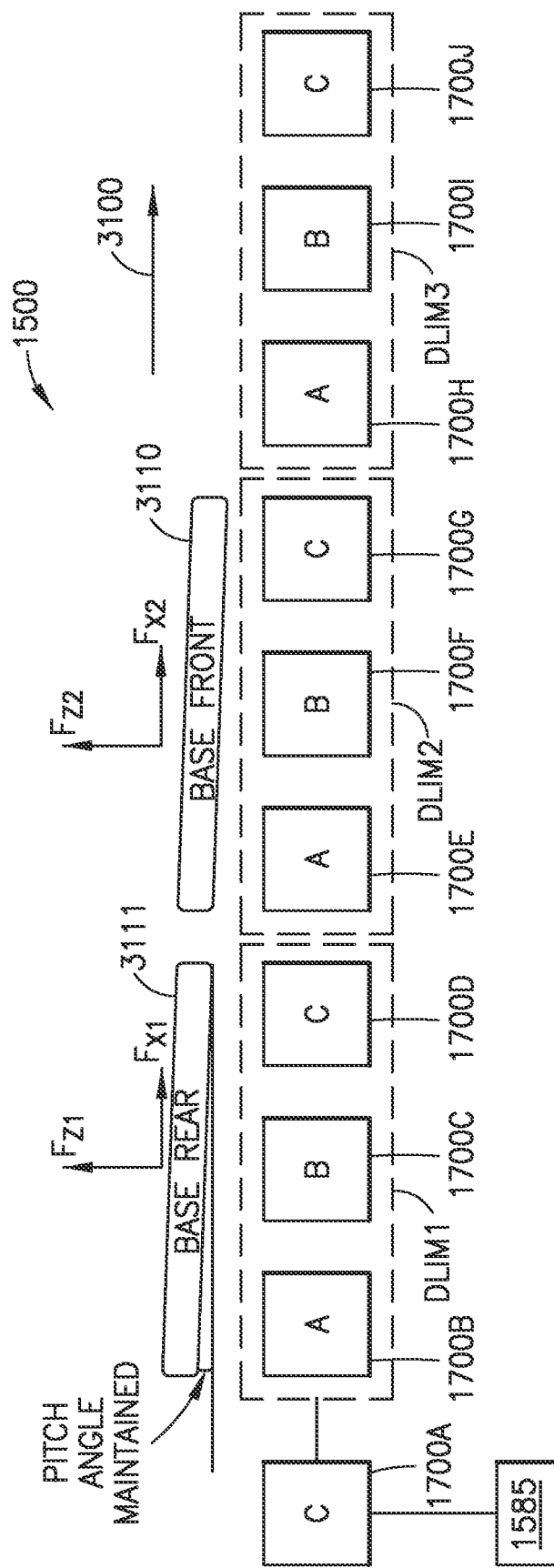

FIGS. 32A and 32B illustrate an example where each electromagnet (or coil unit) 1700A-1700n grouped so as to define a motor actuator unit 1701 having dynamically selected number of electromagnets, for example three electromagnets (n=3) and three corresponding phases (m=3) with an electrical angle between the phases of 120° (see also FIG. 17) also dynamically associated with the three different phases A, B, C so that association of each phase A, B, C with the corresponding static electromagnet 1700A 1700n comports with the dynamic state of the motor actuation unit 1701. Accordingly, with the electromagnets of the motor actuator unit. 1701 propelling the base 1510 (e.g., along direction 3100) each phase A, B, C respectively changes or moves from one static electromagnet to another (i.e., rolling the designation or allocation of the respective phases to consecutive electromagnets 1700A-1700n so as to generate a virtual (motion) multi-phase actuator unit 3000, 3000$tP_1$, 3000$tP_2$ of each of the linear electrical machine 1599 and the electrical machine 1599R proceeding in the direction of motion 3100 commensurate with motion of the base 1510 generated by the excitation of the electromagnets 1700A-1700n corresponding to the virtual motion multi-phase actuation unit 3000, 3000$tP_1$, 3000$tP_2$. This dynamic relationship or association producing the virtual motion multi-phase actuator unit 3000, 3000$tP_1$, 3000$tP_2$ between coil units and phase will be referred to here for convenience as "dynamic phase allocation" wherein the virtual motion of the representative virtual motion multi-phase actuator unit 3000, 3000$tP_1$, 3000$tP_2$ effecting propulsion of the base 1510 is illustrated schematically in FIG. 30 (see also FIG. 17). Here the virtual motion multi-phase actuator unit (or "MAU" in FIG. 17) 3000 has dynamically selected three electromagnets and associated phases A, B, C, shown in an initial (representative) position P=0 at time t=t0. The respective excitation of the virtual motion multi-phase actuator unit 3000 electromagnets generate propulsion forces that move the platen/base 1510 between t1 and t2 (see also FIGS. 32A-32B). Here, as shown, at P=0 and t=t0, electromagnets 1700A-1700C are grouped to form virtual motion multi-phase actuator unit 3000, and are respectively, associated with phases A, B, C. Coincident with generation of propulsion forces Fx, respective excitation of virtual motion multi-phase actuator unit 3000 electromagnets 1700A-1700C generate separately controllable lift forces Fy with a controlled variable height relative to the platen/base 1510, that simultaneously lifts and effect tilt adjustment of the platen/base 1510 simultaneously with propulsion (see FIGS. 32A-32B). As may be realized, under effect of the lift Fy and propulsion Fx forces imparted by the respective electromagnets 1700A-1700C of the virtual motion multi-phase actuator unit 3000 at time t=t0 and position P=0 the platen/base 1510 moves (relative to the transfer chamber and hence the static electromagnets 1700A-1700C) with a predetermined lift and tilt. To maintain steady state tilt of the platen/base 1510 during motion away from the group of electromagnets 1700A-1700C (defining virtual motion multi phase actuator unit 3000 at P=0 and T=T0) the controller 199 and circuitry 3050, of the respective electromagnets of the electromagnet array 1700A-1700n, are configured to dynamically "move" (or "change") the allocation of the respective phases A, B, C (from the initial virtual motion multi-phase actuator unit 3000 at P=0 and t=t0) commensurate with the travel of the platen/base 1510 at time t=t1 and position P=1 to corresponding electromagnets 1700B-1700D that now define virtual motion multi-phase actuator unit 3000tP1 disposed at position P=1 at time t=t1, and subsequently allocation of the respective phases A, B, C (from the virtual motion multi-phase actuator unit 3000tP1 at P=1 and t=t1) commensurate with the travel of the platen/base 1510 at time t=t2 and position P=2 to corresponding electromagnets 1700C-1700E that now define virtual motion multi-phase actuator unit 3000tP2 disposed at position P=2 at time t=t2, and so on. Dynamic phase allocation is repeated throughout platen/base 1510 motion so that the phase distribution with respect to the platen, and excitation by respective phases (here A, B, C) of the platen/base 1510 remain substantially steady state throughout motion of the platen/base 1510.

The virtual multi-phase actuator unit 3000, 3000tP$_1$, 3000tP$_2$ may comprise a series of electromagnets 1700A-1700n of the array of electromagnets 1700 coupled to at least the multiphase alternating current power source 1585 that define at least one drive line 177-180 within the drive plane 1598, where electromagnets 1700A-1700n in the series of electromagnets 1700A-1700n are dynamically grouped into at least one multiphase actuator unit DLIM1, DLIM2, DLIM3, and each of the at least one multiphase actuator unit DLIM1, DLIM2, DLIM3 being coupled to at least the multiphase alternating current power source 1585. In this case, on initiating propulsion (effecting motion of the base/secondary) by excitation of corresponding electromagnet groups of the motor actuation unit at an initial position (P=0, t=0) the definition of phases A, B, C and the associated "motors" (e.g., DLIM1, DLIM2, DLIM3) are changing in space and time (Pi, ti), as described above, in order to maintain substantially steady state force vectors FZ1, FZ2, FX1, FX2 imparted on the base 1510 throughout the range of motion, that provide a desired substantially steady state or constant tilt orientation of the substrate handler 1500 throughout the range of motion. As noted herein, an exemplary actuator control system network 1799 configured to effect dynamic phase allocation is described with respect to FIG. 17. As can be seen in FIGS. 32A and 32B, the dynamic phase allocation is controlled by the controller 199 so that the respective electromagnets 1700A-1700n grouped into corresponding motor actuation units (such as described herein) energized by the multiphase alternating current A, B, C present, with respect to the base 1510 (represented by the front portion 3110 and rear portion 3111), a substantially steady state multiphase distribution across respective electromagnets 1700A-1700n of the virtually moving at least one multiphase actuator unit DLIM1, DLIM2, DLIM3. It is noted that the phase currents A, B, C are illustrated within respective electromagnets 1700A-1700n and the phase current distribution across the at least one multiphase actuator unit DLIM1, DLIM2, DLIM3 remains constant or steady state with respect to the base 1510 (e.g., as an example of steady state note phase current A remains at the trailing end of the rear portion 3111, phase current C remains at the leading end of the rear portion 3111, and phase current B remains in the center of the rear portion 3111 throughout movement of the base 1510 and the at least one (virtually moving) multiphase actuator unit DLIM1, DLIM2, DLIM3 in the direction 3100).

Figure 32C:
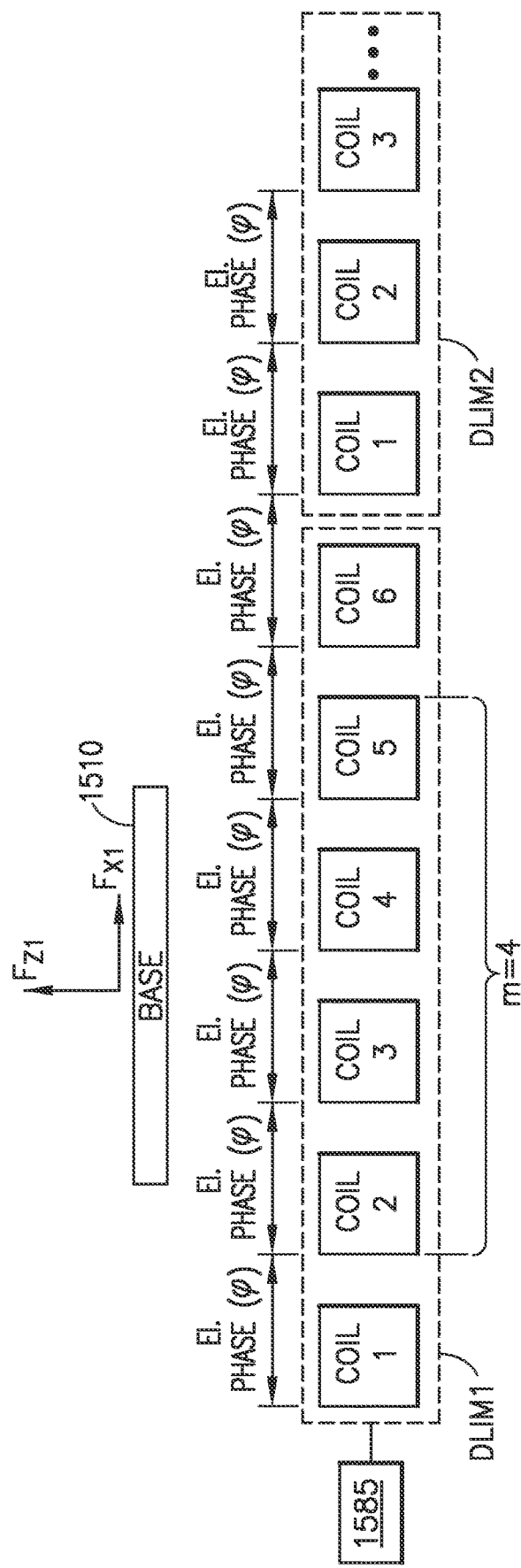
FIG. 32C illustrates electrical phase angle control with the actuator control system network to effect independent propulsion and lift control of a substrate handler in accordance with aspects of the disclosed embodiment.
Figure 33:
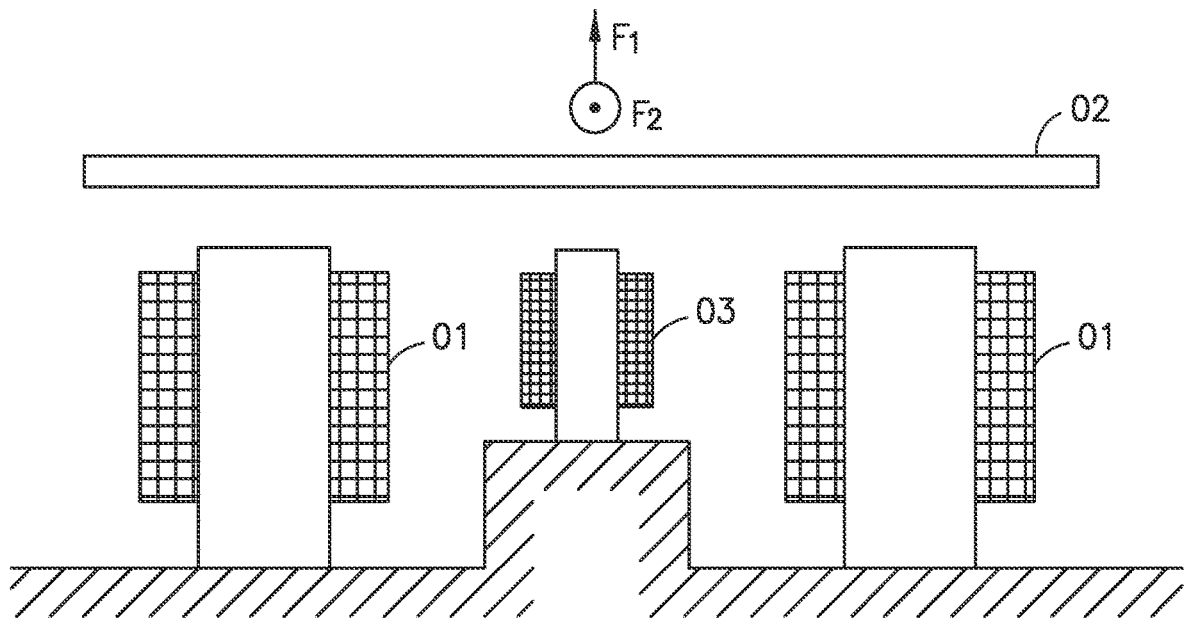
FIG. 33 is a schematic front view of a conventional transport apparatus.
Figure 34:
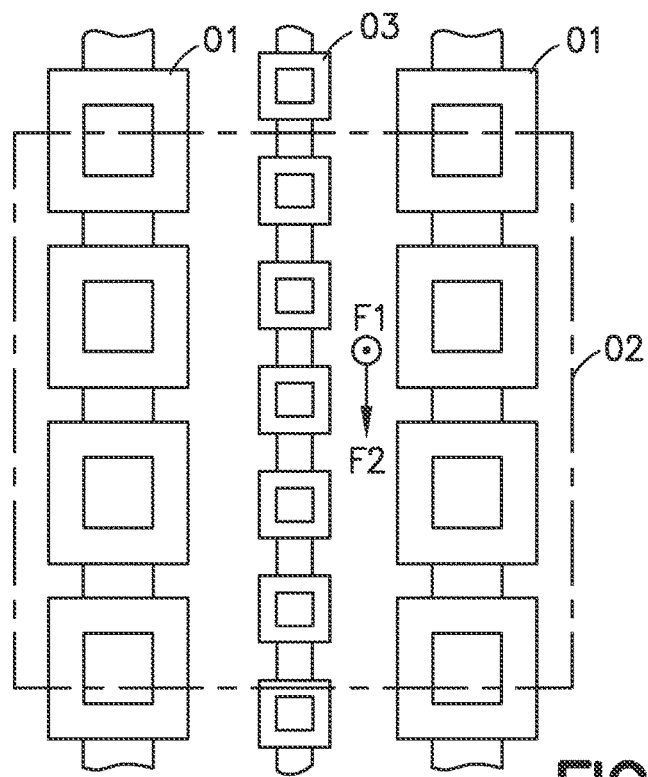
FIG. 34 is a schematic plan view of the conventional transport apparatus of FIG. 33.
Figure 35:
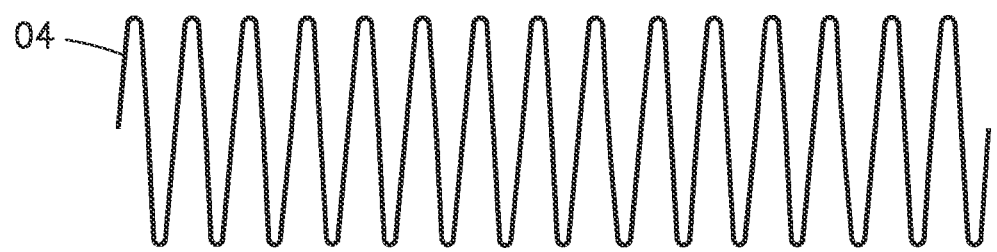
FIG. 35 is a diagram showing a waveform of a floating current in the conventional transport apparatus of FIG. 33.
Figure 36:
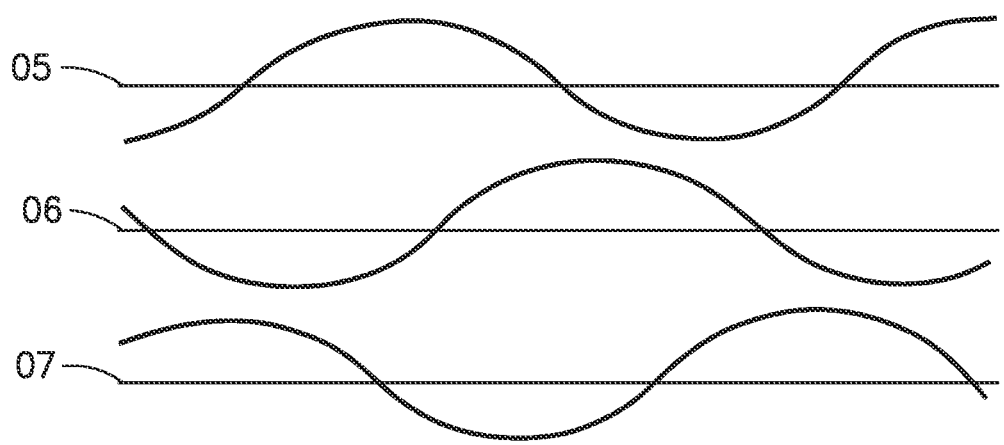
FIG. 36 is a diagram showing waveforms of three alternating currents for conveyance in the conventional transport apparatus of FIG. 33.

In greater detail of dynamic phase allocation, FIG. 30 depicts at time t1 electromagnets 1700A, 1700B, 1700C which are respectively defined as phases A, B, C (FIGS. 30 and 32A) which generate a spatial force vector(s) that provides separately controllable lift and propulsion forces of a predetermined substrate handler 1500 (i.e., a wafer handler identified by the sensors 2000 and selected for movement by the controller 199). As the substrate handler 1500 moves in space (e.g., along the drive line associated with the array of electromagnets 1700), at time t2 electromagnets 1700B, 1700C, 1700D respectively become phases A, B, C (FIGS. 30 and 32B). As the substrate handler 1500 continues to travel along the drive line (which in this example is in direction. 3100 as shown in FIGS. 32A, 32B, and 32C), at time t3 phases A, B, C are associated with electromagnets 1700C, 1700D, 1700E, respectively. This dynamic phase allocation effects continuous spatial and time control of the vectors that maintain propulsion, lift, and orientation of the predetermined substrate handler 1500. In one aspect, the alternating current power source 1585 is coupled to each of the electromagnets 1700A-1700n of the array of electromagnets 1700 through any suitable signal conditioning circuitry 3050 which may include current amplification power supply units 3011 or any other suitable signal processing. The phase A, B, C currents are transmitted to each of the local drive controllers 1750A-1750n which, under control of or in response to instruction from, master controller 1760 provide a specified one of the phase currents to the respective electromagnets in the manner noted above to effect dynamic phase allocation.

As described herein, the base 1510 (FIG. 16B) of a substrate handler cooperates with the electromagnets 1700A-1700n of the at least one multiphase actuator unit (FIG. 32B) DLIM, DLIM2, DLIM3 so that excitation of the electromagnets 1700A-1700n with alternating current generates levitation and propulsion forces against the base 1510 that controllably levitate and propel the base 1510 along the at least one drive line 177-180, in a controlled attitude relative to the drive plane 1598. The controller 199 (which in some aspects includes at least the master controller 1760 and any controller subordinate to the master controller such as the local drive controllers 1750A-1750n; however in other aspects the controller may have any suitable configuration), is operable co d to the alternating current power source 1585 and the array of electromagnets 1700. The alternating current power source 1585 may include any suitable associated circuitry 3050 through which the alternating current power source 1585 connected to the array of electromagnets 1700. The alternating current power source 1585 is controlled by the local drive controllers or any other suitable controller such as the master controller 1760. Typical control parameters for the alternating current power source comprise of signal amplitude, signal frequency, and phase shift relative to a reference coil unit. Other types of control parameters may be defined. As used herein the "phase" A, B, C as illustrated in FIG. 30 is similar to a particular coil in a multi-phase electrical motor; however, the each of the phase definitions (such as A, B, C in FIG. 30) is not physically tied to any particular coil.

As a comparison with prior art, if segmented linear induction motors with static phase allocation were to be used with their own dedicated controls, then it would be difficult to effect angle/tilt controls when the substrate handler transitions from one segment to the next. FIGS. 31A and 31B, illustrate this problem of maintaining pitch controls across static segmented linear induction motors. FIG. 31A shows the front portion 3110 and rear portion 3111 of a base 1510 or secondary with induced forces along the Z and X axes. The first motor segment (SLIM1) with phases A, B and C generate the forces Fz1 and Fx1 to lift and propel the rear portion 3111 of the base. The second motor segment (SLIM2) generates forces Fz2 and Fx2 for the front portion 3110 of the base using its respective phases A, B and C. As the base moves in direction 3100, the front and rear portions 3110, 3111 of the base will transition into the next linear induction motor segments. This is shown in FIG. 31B. At this position, the rear portion 3111 of the base overlaps with phases B and C of SLIM1 and phase A of SLIM2. At the same time, the front portion 3110 of the base overlaps with phases B and C of SLIM2 and phase A for SLIM3. As a result, it is not possible to maintain the same required forces Fz1, Fx1, Fz2, Fx2 since for instance SLIM2 phases are being shared by both front and rear portions 3110, 3111 of the base.

As described before, and now referring to FIG. 32C in one aspect, controlling propulsion and levitation simultaneously and separately (so that propulsion forces and lift forces are separately controllable in full, so that control of each may be deemed independent of another though both forces are effected by excitation with common multiphase alternating current having a single common frequency per phase, the common frequency per phase is selectably variable from different desired frequencies) may be effected by a variant of the dynamic phase allocation described herein, where one or more dynamic linear motor (DLIM) may include a selectable n number of phases associated with electromagnets defining the virtual motion multi phase actuator unit, where n can be an integer larger than three. The number n of electromagnets defining the virtual motion multi-phase actuator unit may be dynamically selected, for example, for effecting different moves of the platen/base 1510 depending on kinematic characteristics of the desired move. Here the excitation frequency commonly applied per phase of the virtual motion multi-phase actuator unit is selected by the controller 199 so as to generate desired kinematic performance and control of the platen/base 1510. Here, the phase control algorithm maintains the same electrical phase angle difference between the phases (e.g., electromagnets of the motor, as shown in FIG. 32C. The electrical phase difference is calculated relative to a reference phase or relative to each phase. The electrical phase angle difference φ between phases may range from about −180 degrees to about 180 degrees, where a value of about 0 degrees corresponds to no propulsion force, while positive and negative values provide for propulsion forces in positive and negative direction, respectively. Depending on the value of the electrical phase angle difference m the number of electromagnets within a respective dynamic linear motor varies. Here, the boundary between DLIM1 (illustrated for exemplary purposes with 6 electromagnets) and DLIM2 as shown in FIG. 32C is dynamic. In another aspect of the dynamic linear motor electromagnet/phase allocation, not all electromagnets of dynamic linear motor need to be energized at the same time. Referring to DLIM 1, only m (in this example m=4) electromagnets out of all n (in this example n=6) electromagnets of dynamic linear motor DLIM1 (where m is the number of electromagnets covered by the base (or secondary)) are energized to effect lift and propulsion of the base 1510, while the other electromagnets of the n electromagnets of the dynamic linear motor DLIM1 can be turned off.

Figure 41:
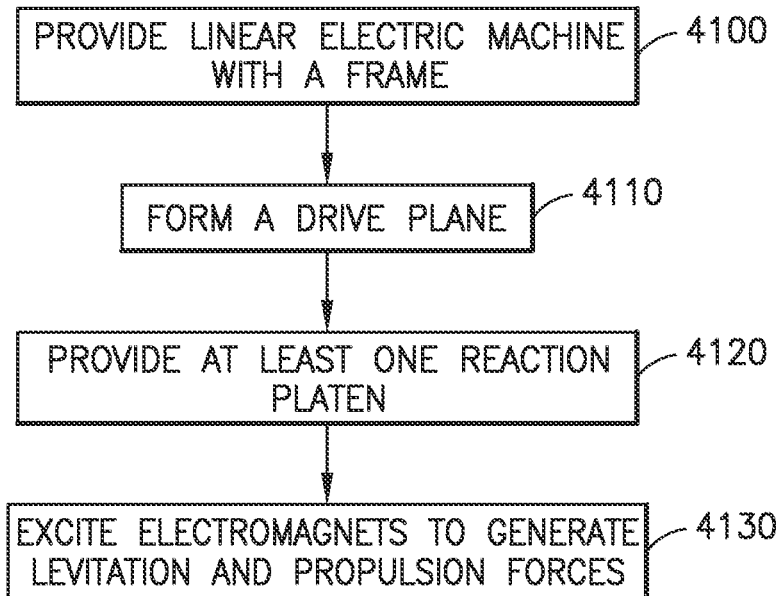
FIG. 41 is a flow chart of an exemplary method in accordance with aspects of the disclosed embodiment.

Referring now to, for example, FIGS. 1A-11, 15A-15C, 17, 28, 29, and 41 an exemplary method for a linear electrical machine 1599 will be described in accordance with one or more aspects of the disclosed embodiment. In the method the linear electrical machine 1599 is provided with a frame (FIG. 41, Block 4100), where the frame has a level reference plane 1299. A drive plane 1598 is formed (FIG. 41, Block 4110) with an array of electromagnets 1700 connected to the frame. The drive plane 1598 is located at a predetermined height H relative to the level reference plane 1299. The array of electromagnets 1700 being arranged so that a series of electromagnets of the array of electromagnets define at least one drive line 177, 178 within the drive plane 1598, and each of the electromagnets 1700A-1700n (see FIG. 15B) being coupled to an alternating current (AC) power source 1585 energizing each electromagnet 1700A-1700n. At least one reaction platen 1510 is provided (FIG. 41, Block 4120) where the at least one reaction platen 1510 is of paramagnetic, diamagnetic, or non-magnetic conductive material disposed to cooperate with the electromagnets 1700A-1700n of the array of electromagnets 1700. The electromagnets 1700A-1700n are excited with alternating current to generate levitation and propulsion forces FZ, FP (FIG. 41, Block 4130) against the reaction platen 1510 that controllably levitate and propel the reaction platen 1510 along the at least one drive line, in a controlled attitude relative to the drive plane 1598. In the method for the linear electric machine 1599 the electromagnets 1700A-1700n are sequentially excited, with a controller 199 operably coupled to the array of electromagnets 1700 and the alternating current power source 1585, with multiphase alternating current so that each reaction platen 1510 is levitated and propelled with up to six degrees of freedom including at least one of attitude control and yaw control with a common set of the electromagnets 1700A-1700n, each of which generates, from excitation with common multiphase alternating current having a single common frequency per phase, both the levitation and the propulsion forces FZ, FP against the reaction platen 1510 so as to control the reaction platen 1510 with up to six degrees of freedom including at least one of reaction platen attitude and reaction platen yaw at least with the reaction platen 1510 levitated.

Figure 42:
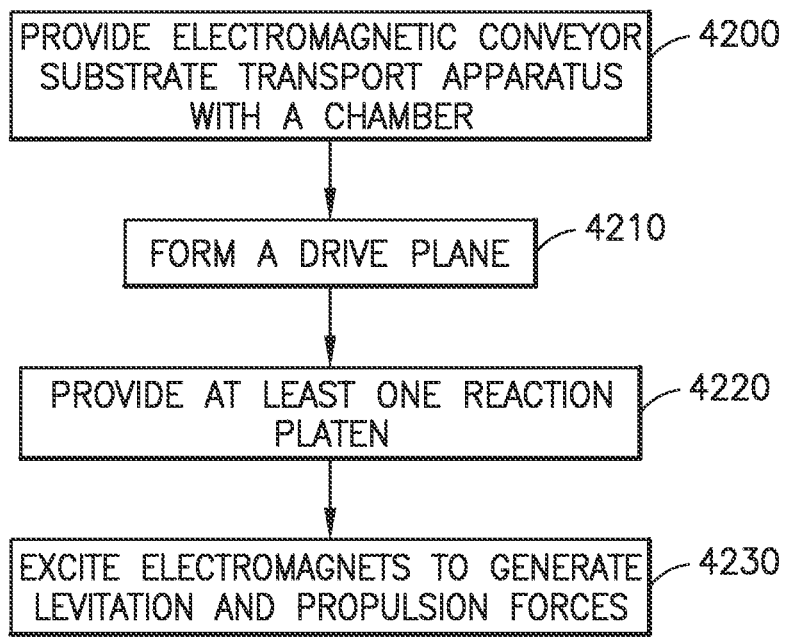
FIG. 42 is a flow chart of an exemplary method in accordance with aspects of the disclosed embodiment.

Referring now to, for example, FIGS. 1A-11, 15A 15C, 17, 28, 29, 30, and 42, a method for an electromagnetic conveyor substrate transport apparatus 1599 will be described in accordance with one or more aspects of the disclosed embodiment. In the method the electromagnetic conveyor substrate transport apparatus 1599 is provided with a chamber 118 (FIG. 42, Block 4200) configured to hold a sealed atmosphere therein, and having a level reference plane 1299 and at least one substrate pass through opening 1180 for transferring a substrate in and out of the chamber 118 through the opening 1180. A drive plane 1598 is formed (FIG. 42, Block 4210) with an array of electromagnets 1700 connected to the chamber 118. The drive plane 1598 is located at a predetermined height H relative to the level reference plane 1299. The array of electromagnets 1700 being arranged so that a series of electromagnets 1700A-1700n of the array of electromagnets 1700 define at least one drive line 177, 178 within the drive plane 1598, electromagnets 1700A-1700n in the series of electromagnets 1700A-1700n being grouped into at least one multiphase actuator unit, and each of the at least one multiphase actuator unit being coupled to a multiphase alternating current (AC) power source 1585. At least one reaction platen 1510 is provided (FIG. 42, Block 4220) where the at least one reaction platen 1510 is of paramagnetic, diamagnetic, or non-magnetic conductive material disposed to cooperate with the electromagnets 1700A-1700n of the at least one multiphase actuator unit. The electromagnets 1700A-1700n are excited with alternating current to generate levitation and propulsion forces FZ, FP (FIG. 42, Block 4230) against the reaction platen 1510 that controllably levitate and propel the reaction platen 1510 along the at least one drive line 177, 178, in a controlled attitude relative to the drive plane 1598. The electromagnets 1700A-1700n are sequentially excited, with a controller 199 operably coupled to the array of electromagnets 1700 and alternating current power source 1585, with multiphase alternating current so that a reaction platen 1510 is levitated and propelled, wherein each alternating current phase, of the multiphase alternating current, is dynamically allocated between respective electromagnets 1700A-1700n so that the alternating current phase of each respective electromagnet 1700A-1700n, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line 177, 178.

In accordance with one or more aspects of the disclosed embodiment a linear electrical machine comprises:
a frame with a level reference plane;
an array of electromagnets, connected to the frame to form a drive plane at a predetermined height relative to the level reference plane, the array of electromagnets being arranged so that a series of electromagnets of the array of electromagnets define at least one drive line within the drive plane, and each of the electromagnets being coupled to an alternating current power source energizing each electromagnet;
at least one reaction platen of paramagnetic, diamagnetic, or non-magnetic conductive material disposed to cooperate with the electromagnets of the array of electromagnets so that excitation of the electromagnets with alternating current generates levitation and propulsion forces against the reaction platen that controllably levitate and propel the reaction platen along the at least one drive line, in a controlled attitude relative to the drive plane; and
a controller operably coupled to the array of electromagnets and the alternating current power source and configured so as to sequentially excite the electromagnets with multiphase alternating current so that each reaction platen is levitated and propelled with up to six degrees of freedom including at least one of attitude control and yaw control with a common set of the electromagnets, each of which generates, from excitation with common multiphase alternating current having a single common frequency per phase, both the levitation and the propulsion forces against the reaction platen so as to control the reaction platen with up to six degrees of freedom including at least one of reaction platen attitude and reaction platen yaw at least with the reaction platen levitated.

In accordance with one or more aspects of the disclosed embodiment the controller controls the up to six degrees of freedom, generated by the array of electromagnets, including at least the reaction platen attitude with the reaction platen levitated and propelled so as to move relative to the array of electromagnets along the at least one drive line from a first predetermined position with respect to the frame to a second different predetermined position with respect to the frame.

In accordance with one or more aspects of the disclosed embodiment the controller controls the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the frame.

In accordance with one or more aspects of the disclosed embodiment the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the frame, to a second different predetermined orientation relative to the frame.

In accordance with one or more aspects of the disclosed embodiment the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the frame.

In accordance with one or more aspects of the disclosed embodiment the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment the linear electrical machine further comprises position feedback sensors distributed on the frame configured for sensing position of the reaction platen along the drive plane and communicably coupled to the controller so the controller registers the sensed position of the reaction platen, wherein the controller is configured to sequentially excite the electromagnets of the array of electromagnets corresponding to the sensed position.

In accordance with one or more aspects of the disclosed embodiment the controller is configured to determine acceleration of the reaction platen along the drive plane at least from changes in the sensed position, and in response to the acceleration determined, control a bias attitude of the reaction platen to provide the predetermined bias attitude countering the payload inertial force arising from the acceleration of the reaction platen.

In accordance with one or more aspects of the disclosed embodiment the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment an electromagnetic conveyor substrate transport apparatus comprises:
  a chamber configured to hold a sealed atmosphere therein, and having a level reference plane and at least one substrate pass through opening for transferring a substrate in and out of the chamber through the opening;
  an array of electromagnets, connected to the chamber to form a drive plane at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source;
  at least one reaction platen of paramagnetic, diamagnetic, or non-magnetic conductive material disposed to cooperate with the electromagnets of the at least one multiphase actuator unit so that excitation of the electromagnets with alternating current generates levitation and propulsion forces against the reaction platen that controllably levitate and propel the reaction platen along the at least one drive line, in a controlled attitude relative to the drive plane; and
  a controller operably coupled to the array of electromagnets and alternating current power source and configured so as to sequentially excite the electromagnets with multiphase alternating current so that a reaction platen is levitated and propelled, wherein each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

In accordance with one or more aspects of the disclosed embodiment the reaction platen is levitated and propelled with up to six degrees of freedom including at least one of attitude and yaw control with the virtually moving at least one multiphase actuator unit.

In accordance with one or more aspects of the disclosed embodiment the controller controls the up to six degrees of freedom, generated by the array of electromagnets, including at least the reaction platen attitude with the reaction platen levitated and propelled so as to move relative to the array of electromagnets along the at least one drive line from a first predetermined position with respect to the chamber to a second different predetermined position with respect to the chamber.

In accordance with one or more aspects of the disclosed embodiment the controller controls the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the chamber.

In accordance with one or more aspects of the disclosed embodiment the dynamic phase allocation is controlled so that the virtually moving at least one multiphase actuator unit moves virtually along the drive line substantially coincident with reaction platen movement along the drive line from propulsion by the virtually moving at least one multiphase actuator unit.

In accordance with one or more aspects of the disclosed embodiment the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the chamber, to a second different predetermined orientation relative to the chamber.

In accordance with one or more aspects of the disclosed embodiment the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the chamber.

In accordance with one or more aspects of the disclosed embodiment the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment the electromagnetic conveyor substrate transport apparatus further comprises position feedback sensors distributed on the chamber configured for sensing position of the reaction platen along the drive plane and communicably coupled to the controller so the controller registers the sensed position of the reaction platen, wherein the controller is configured to sequentially excite the electromagnets of the array of electromagnets corresponding to the sensed position.

In accordance with one or more aspects of the disclosed embodiment the controller is configured to determine acceleration of the reaction platen along the drive plane at least from changes in the sensed position, and in response to the acceleration determined, control a bias attitude of the reaction platen to provide the predetermined bias attitude countering the payload inertial force arising from the acceleration of the reaction platen.

In accordance with one or more aspects of the disclosed embodiment the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment the dynamic phase allocation is controlled so that the respective electromagnets energized by the multiphase alternating current present, with respect to the reaction platen, a substantially steady state multiphase distribution across respective electromagnets of the virtually moving at least one multiphase actuator unit.

In accordance with one or more aspects of the disclosed embodiment method for a linear electrical machine is provided. The method comprises:
  providing the linear electrical machine with a frame, the frame having a level reference plane;
  forming a drive plane with an array of electromagnets connected to the frame, the drive plane is located at a predetermined height relative to the level reference plane, the array of electromagnets being arranged so that a series of electromagnets of the array of electromagnets define at least one drive line within the drive plane, and each of the electromagnets being coupled to an alternating current power source energizing each electromagnet;
  providing at least one reaction platen of paramagnetic, diamagnetic, or non-magnetic conductive material disposed to cooperate with the electromagnets of the array of electromagnets; and
  exciting the electromagnets with alternating current to generate levitation and propulsion forces against the reaction platen that controllably levitate and propel the reaction platen along the at least one drive line, in a controlled attitude relative to the drive plane;
  wherein the electromagnets are sequentially excited, with a controller operably coupled to the array of electromagnets and the alternating current power source, with multiphase alternating current so that each reaction platen is levitated and propelled with up to six degrees of freedom including at least one of attitude control and yaw control with a common set of the electromagnets, each of which generates, from excitation with common multiphase alternating current having a single common frequency per phase, both the levitation and the propulsion forces against the reaction platen so as to control the reaction platen with up to six degrees of freedom including at least one of reaction platen attitude and reaction platen yaw at least with the reaction platen levitated.

In accordance with one or more aspects of the disclosed embodiment the controller controls the up to six degrees of freedom, generated by the array of electromagnets, including at least the reaction platen attitude with the reaction platen levitated and propelled so as to move relative to the array of electromagnets along the at least one drive line from a first predetermined position with respect to the frame to a second different predetermined position with respect to the frame.

In accordance with one or more aspects of the disclosed embodiment the controller controls the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the frame.

In accordance with one or more aspects of the disclosed embodiment the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the frame, to a second different predetermined orientation relative to the frame.

In accordance with one or more aspects of the disclosed embodiment the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the frame.

In accordance with one or more aspects of the disclosed embodiment the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment method further comprises sensing, with position feedback sensors distributed on the frame, position of the reaction platen along the drive plane and communicably coupled to the controller so the controller registers the sensed position of the reaction platen, wherein the controller sequentially excites the electromagnets of the array of electromagnets corresponding to the sensed position.

In accordance with one or more aspects of the disclosed embodiment the controller determines acceleration of the reaction platen along the drive plane at least from changes in the sensed position, and in response to the acceleration determined, control a bias attitude of the reaction platen to provide the predetermined bias attitude countering the payload inertial force arising from the acceleration of the reaction platen.

In accordance with one or more aspects of the disclosed embodiment the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment a method for an electromagnetic conveyor substrate transport apparatus is provided. The method comprises:
providing the electromagnetic conveyor substrate transport apparatus with a chamber configured to hold a sealed atmosphere therein, and having a level reference plane and at least one substrate pass through opening for transferring a substrate in and out of the chamber through the opening;
forming a drive plane with an array of electromagnets connected to the chamber, the drive plane is located at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source;
providing at least one reaction platen of paramagnetic, diamagnetic, or non-magnetic conductive material disposed to cooperate with the electromagnets of the at least one multiphase actuator unit; and
exciting the electromagnets with alternating current to generate levitation and propulsion forces against the reaction platen that controllably levitate and propel the reaction platen along the at least one drive line, in a controlled attitude relative to the drive plane;
wherein the electromagnets are sequentially excited, with a controller operably coupled to the array of electromagnets and alternating current power source, with multiphase alternating current so that a reaction platen is levitated and propelled, wherein each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

In accordance with one or more aspects of the disclosed embodiment the reaction platen is levitated and propelled with up to six degrees of freedom including at least one of attitude and yaw control with the virtually moving at least one multiphase actuator unit.

In accordance with one or more aspects of the disclosed embodiment the controller controls the up to six degrees of freedom, generated by the array of electromagnets, including at least the reaction platen attitude with the reaction platen levitated and propelled so as to move relative to the array of electromagnets along the at least one drive line from a first predetermined position with respect to the chamber to a second different predetermined position with respect to the chamber.

In accordance with one or more aspects of the disclosed embodiment the controller controls the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the chamber.

In accordance with one or more aspects of the disclosed embodiment the dynamic phase allocation is controlled so that the virtually moving at least one multiphase actuator unit moves virtually along the drive line substantially coincident with reaction platen movement along the drive line from propulsion by the virtually moving at least one multiphase actuator unit.

In accordance with one or more aspects of the disclosed embodiment the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the chamber, to a second different predetermined orientation relative to the chamber.

In accordance with one or more aspects of the disclosed embodiment the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the chamber.

In accordance with one or more aspects of the disclosed embodiment the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment the method further comprises sensing, with the position feedback sensors distributed on the chamber, position of the reaction platen along the drive plane and communicably coupled to the controller so the controller registers the sensed position of the reaction platen, wherein the controller is configured to sequentially excite the electromagnets of the array of electromagnets corresponding to the sensed position.

In accordance with one or more aspects of the disclosed embodiment the controller determines acceleration of the reaction platen along the drive plane at least from changes in the sensed position, and in response to the acceleration determined, control a bias attitude of the reaction platen to provide the predetermined bias attitude countering the payload inertial force arising from the acceleration of the reaction platen.

In accordance with one or more aspects of the disclosed embodiment the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment the dynamic phase allocation is controlled so that the respective electromagnets energized by the multiphase alternating current present, with respect to the reaction platen, a substantially steady state multiphase distribution across respective electromagnets of the virtually moving at least one multiphase actuator unit.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A linear electrical machine comprising:
   a frame with a level reference plane;
   an array of electromagnets, connected to the frame to form a drive plane at a predetermined height relative to the level reference plane, the array of electromagnets being arranged so that a series of electromagnets of the array of electromagnets define at least one drive line within the drive plane, and each of the electromagnets being coupled to an alternating current power source energizing each electromagnet;
   at least one reaction platen of paramagnetic, diamagnetic, or non-magnetic conductive material disposed to cooperate with the electromagnets of the array of electromagnets so that excitation of the electromagnets with alternating current generates levitation and propulsion forces against the reaction platen that controllably levitate and propel the reaction platen along the at least one drive line, in a controlled attitude relative to the drive plane; and
   a controller operably coupled to the array of electromagnets and the alternating current power source and configured so as to sequentially excite the electromagnets with multiphase alternating current that describe up to six degrees of freedom control of each reaction platen that is at least one of levitated and propelled with at least one of attitude control and yaw control by a common set of the electromagnets, each of which generates, from excitation with common multiphase alternating current having a single common frequency per phase, both the levitation and the propulsion forces against the reaction platen effecting up to six degrees of freedom control of the reaction platen.

2. A method for an electromagnetic conveyor substrate transport apparatus, the method comprising:
   providing the electromagnetic conveyor substrate transport apparatus with a chamber configured to hold a sealed atmosphere therein, and having a level reference plane and at least one substrate pass through opening for transferring a substrate in and out of the chamber through the opening;
   forming a drive plane with an array of electromagnets connected to the chamber, the drive plane is located at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source;
   providing at least one reaction platen of paramagnetic, diamagnetic, or non-magnetic conductive material disposed to cooperate with the electromagnets of the at least one multiphase actuator unit; and
   exciting the electromagnets with alternating current to generate levitation and propulsion forces against the reaction platen that controllably levitate and propel the reaction platen along the at least one drive line, in a controlled attitude relative to the drive plane;
   wherein the electromagnets are sequentially excited, with a controller operably coupled to the array of electromagnets and alternating current power source, with multiphase alternating current so that a reaction platen is levitated and propelled, wherein each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

3. The method of claim 2, wherein the reaction platen is levitated and propelled with up to six degrees of freedom including at least one of attitude and yaw control with the virtually moving at least one multiphase actuator unit.

4. The method of claim 3, wherein the controller controls the up to six degrees of freedom, generated by the array of electromagnets, including at least the reaction platen attitude with the reaction platen levitated and propelled so as to move relative to the array of electromagnets along the at least one drive line from a first predetermined position with respect to the chamber to a second different predetermined position with respect to the chamber.

5. The method of claim 3, wherein the controller controls the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the chamber.

6. The method of claim 2, wherein the dynamic phase allocation is controlled so that the virtually moving at least one multiphase actuator unit moves virtually along the drive line substantially coincident with reaction platen movement along the drive line from propulsion by the virtually moving at least one multiphase actuator unit.

7. The method of claim 2, wherein the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the chamber, to a second different predetermined orientation relative to the chamber.

8. The method of claim 2, wherein the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the chamber.

9. The method of claim 2, wherein the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

10. The method of claim 2, wherein the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

11. The method of claim 10, further comprising sensing, with the position feedback sensors distributed on the chamber, position of the reaction platen along the drive plane and communicably coupled to the controller so the controller registers the sensed position of the reaction platen, wherein the controller is configured to sequentially excite the electromagnets of the array of electromagnets corresponding to the sensed position.

12. The method of claim 11, wherein the controller determines acceleration of the reaction platen along the drive plane at least from changes in the sensed position, and in response to the acceleration determined, control a bias attitude of the reaction platen to provide the predetermined bias attitude countering the payload inertial force arising from the acceleration of the reaction platen.

13. The method of claim 2, wherein the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

14. The method of claim 2, wherein the dynamic phase allocation is controlled so that the respective electromagnets energized by the multiphase alternating current present, with respect to the reaction platen, a substantially steady state multiphase distribution across respective electromagnets of the virtually moving at least one multiphase actuator unit.

15. The linear electrical machine of claim 1, wherein the controller controls the up to six degrees of freedom, generated by the array of electromagnets, including at least a reaction platen attitude with the reaction platen levitated and propelled so as to move relative to the array of electromagnets along the at least one drive line from a first predetermined position with respect to the frame to a second different predetermined position with respect to the frame.

16. The linear electrical machine of claim 1, wherein the controller controls the up to six degrees of freedom, generated by the array of electromagnets, including at least a reaction platen attitude and a reaction platen yaw with the reaction platen levitated and stationary relative to the array of electromagnets in a predetermined position along the at least one drive line with respect to the frame.

17. The linear electrical machine of claim 1, wherein the controller controls the propulsion forces, generated by the array of electromagnets, across the reaction platen so as to:

impart a controlled yaw moment on the reaction platen, yawing the reaction platen about a yaw axis, substantially normal to the drive plane, from a first predetermined orientation relative to the frame, to a second different predetermined orientation relative to the frame; or impart a moment couple on the reaction platen effecting controlled yaw of the reaction platen so as to effect at least one of positioning and centering of a wafer payload on the reaction platen relative to a predetermined wafer holding location of the frame.

18. The linear electrical machine of claim 1, wherein the controller controls the levitation forces, generated by the array of electromagnets, so as to:

impart differential levitation forces across the reaction platen that effect a controlled inclination of the reaction platen, relative to the drive plane, that controls a predetermined reaction platen attitude in at least one of reaction platen pitch and reaction platen roll; or effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

19. The linear electrical machine of claim 18, further comprising position feedback sensors distributed on the frame configured for sensing position of the reaction platen along the drive plane and communicably coupled to the controller so the controller registers the sensed position of the reaction platen, wherein the controller is configured to sequentially excite the electromagnets of the array of electromagnets corresponding to the sensed position.

20. The linear electrical machine of claim 19, wherein the controller is configured to determine acceleration of the reaction platen along the drive plane at least from changes in the sensed position, and in response to the acceleration determined, control a bias attitude of the reaction platen to provide the predetermined bias attitude countering the payload inertial force arising from the acceleration of the reaction platen.

21. The linear electrical machine of claim 1, wherein the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

22. An electromagnetic conveyor substrate transport apparatus comprising:

a chamber configured to hold a sealed atmosphere therein, and having a level reference plane and at least one substrate pass through opening for transferring a substrate in and out of the chamber through the opening;

an array of electromagnets, connected to the chamber to form a drive plane at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source;

at least one reaction platen of paramagnetic, diamagnetic, or non-magnetic conductive material disposed to cooperate with the electromagnets of the at least one multiphase actuator unit so that excitation of the electromagnets with alternating current generates levitation and propulsion forces against the reaction platen that controllably levitate and propel the reaction platen along the at least one drive line, in a controlled attitude relative to the drive plane; and a controller operably coupled to the array of electromagnets and alternating current power source and configured so as to sequentially excite the electromagnets with multiphase alternating current that describe up to six degrees of freedom control of a reaction platen that is at least one of levitated and propelled, wherein each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

\* \* \* \* \*